US010760973B2

(12) United States Patent
Saito et al.

(10) Patent No.: US 10,760,973 B2
(45) Date of Patent: Sep. 1, 2020

(54) OPTICAL SENSOR AND ELECTRONIC DEVICE

(71) Applicant: ROHM CO., LTD., Kyoto-shi, Kyoto (JP)

(72) Inventors: Koji Saito, Kyoto (JP); Takahiro Kitahara, Kyoto (JP); Yoshitsugu Uedaira, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/180,403

(22) Filed: Nov. 5, 2018

(65) Prior Publication Data
US 2019/0145826 A1 May 16, 2019

(30) Foreign Application Priority Data

Nov. 8, 2017 (JP) ................................. 2017-215887
Nov. 8, 2017 (JP) ................................. 2017-215888
Oct. 24, 2018 (JP) ................................. 2018-200367

(51) Int. Cl.
*G01N 21/25* (2006.01)
*G01J 3/51* (2006.01)
(Continued)

(52) U.S. Cl.
CPC .............. *G01J 3/51* (2013.01); *G01J 1/0492* (2013.01); *G01J 1/44* (2013.01); *G01J 3/0256* (2013.01); *G01J 3/0262* (2013.01); *G01J 3/0272* (2013.01); *G01J 3/0297* (2013.01); *G01J 3/2803* (2013.01); *G01J 3/465* (2013.01); *G01J 3/513* (2013.01); *H01L 27/14621* (2013.01); *G01J 2001/0276* (2013.01);
(Continued)

(58) Field of Classification Search
CPC ...... G01J 3/51; G01J 3/02; G01J 3/465; G01J 3/2803; G01J 1/44; G01J 1/0492; G01J 2003/2813; G01J 2003/2806; G01J 2003/1217; G01J 2003/516; G01J 2001/0276; G01J 2001/446; H01L 27/14621; H01L 31/02; H01L 31/14; H01L 21/00
See application file for complete search history.

(56) References Cited

U.S. PATENT DOCUMENTS

2014/0176460 A1\* 6/2014 Chen ................... G06F 3/03545
345/173

FOREIGN PATENT DOCUMENTS

JP 2015065357 A 4/2015
JP 2016115746 A 6/2016

\* cited by examiner

*Primary Examiner* — Abdullahi Nur
(74) *Attorney, Agent, or Firm* — Cantor Colburn LLP

(57) ABSTRACT

An optical sensor includes a light receiving unit and a calculating unit. The light receiving unit includes a plurality of light receiving elements and a plurality of color filters. The plurality of light receiving elements include a first light receiving element and a second light receiving element through which a photocurrent flows when receiving light. The plurality of color filters include a yellow filter that covers a light receiving surface of the first light receiving element and a red filter that covers a light receiving surface of the second light receiving element. The calculating unit calculates an intensity of a yellow wavelength band based on a difference between a first output signal obtained from the photocurrent of the first light receiving element and a second output signal obtained from the photocurrent of the second light receiving element.

22 Claims, 21 Drawing Sheets

(51) Int. Cl.
*G01J 1/44* (2006.01)
*H01L 27/146* (2006.01)
*G01J 1/04* (2006.01)
*G01J 3/02* (2006.01)
*G01J 3/46* (2006.01)
*G01J 3/28* (2006.01)
*G01J 1/02* (2006.01)
*G01J 3/12* (2006.01)

(52) U.S. Cl.
CPC . *G01J 2001/446* (2013.01); *G01J 2003/1217* (2013.01); *G01J 2003/2806* (2013.01); *G01J 2003/2813* (2013.01); *G01J 2003/516* (2013.01)

Without Infrared Cut Filter

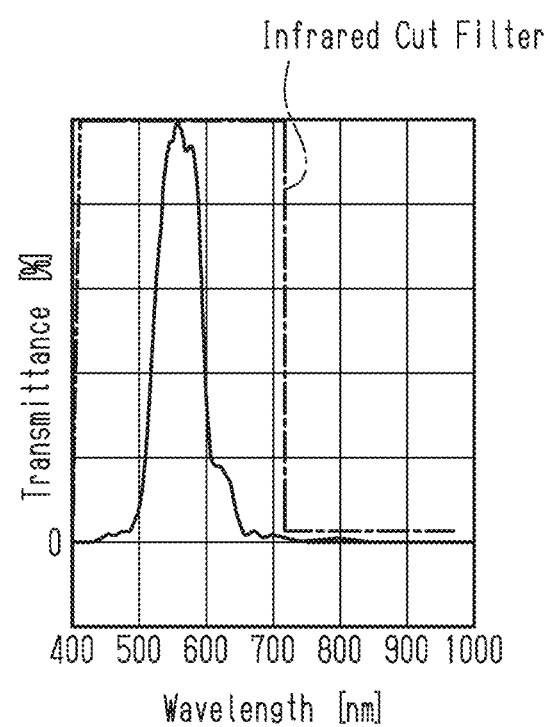

OPTICAL SENSOR AND ELECTRONIC DEVICE

CROSS REFERENCE TO RELATED APPLICATION

The present application claims priority under 35 U.S.C. § 119 to Japanese Application No. 2018-200367, filed Oct. 24, 2018, Japanese Application No. 2017-215888, filed on Nov. 8, 2017 and Japanese Application No. 2017-215887, filed on Nov. 8, 2017, the entire content of which are incorporated herein by reference.

BACKGROUND OF THE INVENTION

The present invention relates to an optical sensor and an electronic device.

Japanese Laid-Open Patent Publication No. 2016-115746 discloses an optical sensor that receives red light, blue light, and green light with a red filter, a blue filter, and a green filter. The optical sensor also receives infrared light by overlapping the red filter and one of the blue filter and the green filter. In the optical sensor, red, blue, and green are accurately detected by removing the influence of infrared light from the red, blue, and green.

It is desirable that the optical sensor be further improved.

SUMMARY OF INVENTION

It is an object of the present invention to provide an optical sensor and an electronic device having high detection accuracy.

[1] An optical sensor provided with a light receiving unit including a plurality of light receiving elements, including a first light receiving element and a second light receiving element through which a photocurrent flows when receiving light, and a plurality of color filters, including a yellow filter that covers a light receiving surface of the first light receiving element and a red filter that covers a light receiving surface of the second light receiving element. The optical sensor is further provided with a calculating unit that calculates an intensity of a yellow wavelength band based on a difference between a first output signal obtained from the photocurrent of the first light receiving element and a second output signal obtained from the photocurrent of the second light receiving element.

According to such a configuration, the yellow wavelength band, which is the wavelength band between the green color and the red color, can be detected by the first light receiving element and the yellow filter covering the light receiving surface of the first light receiving element. Therefore, the detection accuracy of the optical sensor can be enhanced.

Here, a light having a wavelength greater than or equal to the yellow wavelength band is sometimes transmitted depending on the type of yellow filter. In this case, the first light receiving element covered with the yellow filter detects light in the yellow wavelength band and light in the red wavelength band.

With regards to this, in the present optical sensor, the intensity of the visible light of the yellow wavelength band is calculated based on the difference between the first output signal of the first light receiving element covered with the yellow filter and the second output signal of the second light receiving element covered by the red filter. Therefore, even if the first light receiving element detects the light in the yellow wavelength band and the light in the red wavelength band, the light in the yellow wavelength band can be accurately detected by selectively eliminating or attenuating the light in the red wavelength band of the first light receiving element in the red wavelength band of the second light receiving element. Therefore, the detection accuracy of the optical sensor can be enhanced.

[2] Preferably, in the optical sensor according to claim 1, the plurality of light receiving elements are arranged in a lattice-like manner, and the first light receiving element and the second light receiving element are adjacent to each other.

According to such a configuration, the variations in the element characteristics between the first light receiving element and the second light receiving element can be reduced in the manufacturing stage of the light receiving unit of the optical sensor. The calculating unit thus can more accurately calculate the light of the yellow wavelength band. In addition, as the first light receiving element and the second light receiving element are adjacent to each other, light can be similarly received irrespective of the incident angle of the light entering the light receiving unit. Therefore, the variations in the light receiving modes of the first light receiving element and the second light receiving element can be reduced. The detection accuracy of the optical sensor thus can be further enhanced.

[3] Preferably, in the optical sensor, the first light receiving element is one of a plurality of first light receiving elements, and the second light receiving element is one of a plurality of second light receiving elements. The yellow filter is one of a plurality of yellow filters, and the red filter is one of a plurality of red filters. The plurality of first light receiving elements are arranged so as to be point symmetric with a central part of a light receiving region of the light receiving unit serving as a center of symmetry. The plurality of yellow filters are arranged so as to be point symmetric with the central part of the light receiving region serving as a center of symmetry. The plurality of second light receiving elements are arranged so as to be point symmetric with the central part of the light receiving region serving as a center of symmetry. The plurality of red filters are arranged so as to be point symmetric with the central part of the light receiving region serving as a center of symmetry.

According to such a configuration, even when light does not uniformly enter the entire light receiving unit, light can be detected by one of the plurality of first light receiving elements and one of the plurality of second light receiving elements. Thus, the reliability of the optical sensor can be enhanced.

[4] Preferably, in the optical sensor, the first light receiving element is one of a plurality of first light receiving elements, and the second light receiving element is one of a plurality of second light receiving elements. The optical sensor further includes a first conversion unit that converts the photocurrent of the first light receiving element into the first output signal, and a second conversion unit that converts the photocurrent of the second light receiving element into the second output signal. The plurality of the first light receiving elements are electrically connected to the first conversion unit. The plurality of the second light receiving elements are electrically connected to the second conversion unit. The first conversion unit outputs the total photocurrent of the plurality of first light receiving elements to the calculating unit as the first output signal. The second conversion unit outputs the total photocurrent of the plurality of second light receiving elements to the calculating unit as the second output signal.

According to such a configuration, the number of conversion units can be reduced compared to at least one of the configuration in which the conversion unit is provided in each of the plurality of first light receiving elements and the configuration in which the conversion unit is provided in each of the plurality of second light receiving elements. Therefore, the size of the optical sensor can be reduced.

[5] Preferably, in the optical sensor, the plurality of light receiving elements include a third light receiving element, a fourth light receiving element, and a fifth light receiving element. The plurality of color filters include a green filter that covers a light receiving surface of the third light receiving element, a blue filter that covers a light receiving surface of the fourth light receiving element, and an infrared transmitting filter that covers a light receiving surface of the fifth light receiving element. The infrared transmitting filter is obtained by overlapping two or more types of filters. The fifth light receiving element is arranged so as to be adjacent to both of the second light receiving element and the third light receiving element.

According to such a configuration, since the fifth light receiving element, the second light receiving element, and the third light receiving element are adjacent to each other, the second light receiving element, the third light receiving element, and the fifth light receiving element can similarly receive light irrespective of the incident angle of the light entering the light receiving unit. Thus, the variations in the light receiving modes of the second light receiving element, the third light receiving element, and the fifth light receiving element can be reduced. The detection accuracy of the optical sensor thus can be further enhanced.

[6] Preferably, the optical sensor further includes a nonvolatile memory that stores information for adjusting sensitivities of the plurality of light receiving elements. A blocking layer is arranged overlapping the nonvolatile memory as viewed in a direction orthogonal to the light receiving surface of the light receiving element and configured to block ultraviolet light.

According to such a configuration, the variations in the element characteristics of the plurality of light receiving elements can be reduced by adjusting the sensitivities of the plurality of light receiving elements based on the information stored in the nonvolatile memory. Therefore, the detection accuracy of the optical sensor can be enhanced.

When the nonvolatile memory is irradiated with ultraviolet light, the information stored in the nonvolatile memory may disappear. In the respect, the present optical sensor can prevent the information stored in the nonvolatile memory from disappearing by blocking the ultraviolet light included in the light irradiated toward the nonvolatile memory with the blocking layer.

[7] Preferably, the optical sensor further includes a memory color filter arranged overlapping the nonvolatile memory as viewed in a direction orthogonal to the light receiving surface of the light receiving element.

According to such a configuration, the light entering the nonvolatile memory is transmitted through the memory color filter before entering the nonvolatile memory. At this time, the ultraviolet light is blocked by the memory color filter. Therefore, the influence of the ultraviolet light on the nonvolatile memory can be further reduced.

[8] Preferably, in the optical sensor, the blocking layer is formed from an inorganic material, and the memory color filter is formed from an organic material and provided in the blocking layer.

According to such a configuration, the organic material forming the memory color filter does not leak out of the blocking layer formed from an inorganic material. Therefore, contamination by the organic material with respect to the semiconductor substrate forming the light receiving unit can be reduced at the manufacturing stage of the optical sensor.

[9] An optical sensor that achieves the above object is provided with a light receiving unit including a plurality of light receiving pixels arranged in a lattice-like manner. The plurality of light receiving pixels include a yellow light receiving pixel including a first light receiving element and a yellow filter that covers the first light receiving element, a red light receiving pixel including a second light receiving element and a red filter that covers the second light receiving element, a green light receiving pixel including a third light receiving element and a green filter that covers the third light receiving element, and a blue light receiving pixel including a fourth light receiving element and a blue filter that covers the fourth light receiving element.

According to such a configuration, by including the yellow light receiving pixel, the visible light in the yellow wavelength band, which is the wavelength band at the boundary between the green color and the red color, can be detected. Therefore, the detection accuracy of the optical sensor can be enhanced.

[10] Preferably, in the optical sensor, the yellow light receiving pixel and the red light receiving pixel are arranged adjacent to each other.

The first light receiving element of the yellow light receiving pixel and the second light receiving element of the red light receiving pixel are adjacent to each other so that the first light receiving element and the second light receiving element can similarly receive light irrespective of the incident angle of the light entering the light receiving unit. Therefore, the variations in the light receiving modes of the first light receiving element and the second light receiving element can be reduced. The detection accuracy of the optical sensor thus can be further enhanced.

[11] Preferably, in the optical sensor, the yellow light receiving pixel is one of a plurality of yellow light receiving pixels. The red light receiving pixel is one of a plurality of red light receiving pixels. The plurality of yellow light receiving pixels are arranged so as to be point symmetric with a central part of a light receiving region of the light receiving unit serving as a center of symmetry. The plurality of red light receiving pixels are arranged so as to be point symmetric with the central part of the light receiving region serving as a center of symmetry.

According to such a configuration, even when light does not uniformly enter the entire light receiving region of the light receiving unit, the light can be detected with one of the plurality of yellow light receiving pixels and one of the plurality of red light receiving pixels, and thus the reliability of the optical sensor can be enhanced.

[12] Preferably, the optical sensor further includes an infrared light receiving pixel having a fifth light receiving element and an infrared transmitting filter that covers the fifth light receiving element. The yellow light receiving pixel is one of a plurality of yellow light receiving pixels. The red light receiving pixel is one of a plurality of red light receiving pixels. The green light receiving pixel is one of a plurality of green light receiving pixels. The blue light receiving pixel is one of a plurality of red light receiving pixels. The infrared light receiving pixel is one of a plurality of infrared light receiving pixels. The plurality of yellow light receiving pixels are arranged so as to be point symmetric with a central part of a light receiving region of the light receiving unit serving as a center of symmetry. The plurality of red light receiving pixels are arranged so as to be point symmetric with the central part of the light receiving region serving as a center of symmetry. The plurality of green light receiving pixels are arranged so as to be point symmetric with the central part of the light receiving region serving as a center of symmetry. The plurality of blue light receiving pixels are arranged so as to be point symmetric with the central part of the light receiving region serving as a center of symmetry. The plurality of infrared light receiving pixels are arranged so as to be point symmetric with the central part of the light receiving region serving as a center of symmetry.

According to such a configuration, even when light does not uniformly enter the entire light receiving unit, the light can be detected with one of the plurality of first light receiving elements of the yellow light receiving pixel, one of the plurality of second light receiving elements of the red light receiving pixel, one of the plurality of third light receiving elements of the green light receiving pixel, one of the plurality of fourth light receiving elements of the blue light receiving pixel, and one of the plurality of fifth light receiving elements of the infrared light receiving pixel. Thus, the yellow, red, green, and blue visible light as well as the infrared light can be detected, whereby the reliability of the optical sensor can be enhanced.

[13] Preferably, in the optical sensor, the infrared transmitting filter is obtained by overlapping two or more types of filters, and the infrared light receiving pixel is arranged so as to be adjacent to both of the red light receiving pixel and the green light receiving pixel.

According to such a configuration, since the fifth light receiving element of the infrared light receiving pixel, the second light receiving element of the red light receiving pixel and the third light receiving element of the green light receiving pixel are adjacent to each other, the second light receiving element, the third light receiving element, and the fifth light receiving element can similarly receive light irrespective of the incident angle of light entering the light receiving unit. Thus, the variations in the light receiving modes of the second light receiving element, the third light receiving element, and the fifth light receiving element can be reduced. The detection accuracy of the optical sensor thus can be further enhanced.

[14] Preferably, the optical sensor further includes a nonvolatile memory that stores information for adjusting sensitivity of at least one of the first light receiving element, the second light receiving element, the third light receiving element, and the fourth light receiving element. A blocking layer is arranged overlapping the nonvolatile memory as viewed in a direction orthogonal to light receiving surfaces of the first light receiving element, the second light receiving element, the third light receiving element, and the fourth light receiving element and configured to block ultraviolet light.

According to such a configuration, the variations in the element characteristics of the plurality of light receiving elements can be reduced by adjusting the sensitivities of the plurality of light receiving elements based on the information stored in the nonvolatile memory. Therefore, the detection accuracy of the optical sensor can be enhanced.

When the nonvolatile memory is irradiated with ultraviolet light, the information stored in the nonvolatile memory may disappear. In the respect, the present optical sensor prevents the information stored in the nonvolatile memory from disappearing by blocking the ultraviolet light included in the light irradiated toward the nonvolatile memory with the blocking layer.

[15] Preferably, the optical sensor further includes a memory color filter arranged overlapping the nonvolatile memory as viewed in a direction orthogonal to the light receiving surfaces of the first light receiving element, the second light receiving element, the third light receiving element, and the fourth light receiving element.

According to such a configuration, the light entering the nonvolatile memory is transmitted through the memory color filter before entering the nonvolatile memory. At this time, the ultraviolet light is blocked by the memory color filter. Therefore, the influence of the ultraviolet light on the nonvolatile memory can be further limited.

[16] Preferably, in the optical sensor, the blocking layer is formed from an inorganic material, and the memory color filter is formed from an organic material and provided in the blocking layer.

According to such a configuration, the organic material forming the memory color filter does not leak out of the blocking layer formed from an inorganic material. Therefore, contamination by the organic material with respect to the semiconductor substrate forming the light receiving unit can be reduced at the manufacturing stage of the optical sensor.

[17] An optical sensor that achieves the above object includes a light receiving element through which a photocurrent flows when receiving light and is configured to detect visible light based on the photocurrent of the light receiving element. The optical sensor includes a nonvolatile memory that stores information for adjusting a sensitivity of the light receiving element. A blocking layer is arranged overlapping the nonvolatile memory as viewed in a direction orthogonal to a light receiving surface of the light receiving element and configured to block ultraviolet light.

According to such a configuration, the variations in the element characteristics of the plurality of light receiving elements can be reduced by adjusting the sensitivities of the plurality of light receiving elements based on the information stored in the nonvolatile memory. Therefore, the detection accuracy of the optical sensor can be enhanced.

When the nonvolatile memory is irradiated with ultraviolet light, the information stored in the nonvolatile memory may disappear. In the respect, the present optical sensor can prevent the information stored in the nonvolatile memory from disappearing by blocking the ultraviolet light included in the light irradiated toward the nonvolatile memory with the blocking layer.

[18] Preferably, the optical sensor further includes a memory color filter arranged overlapping the nonvolatile memory as viewed in a direction orthogonal to the light receiving surface of the light receiving element.

According to such a configuration, the light entering the nonvolatile memory is transmitted through the memory color filter before entering the nonvolatile memory. At this time, the ultraviolet light is blocked by the memory color filter. Therefore, the influence of the ultraviolet light on the nonvolatile memory can be further reduced.

[19] Preferably, in the optical sensor, the blocking layer is formed from an inorganic material, and the memory color filter is formed from an organic material and provided in the blocking layer.

According to such a configuration, the organic material forming the memory color filter does not leak out of the blocking layer formed from an inorganic material. Therefore, contamination by the organic material with respect to the semiconductor substrate forming the light receiving unit can be reduced at the manufacturing stage of the optical sensor.

[20] An electronic device that achieves the above object includes the optical sensor according to any one of the first to nineteenth aspects and a housing that houses the optical sensor.

Such a configuration obtains the advantages of the optical sensor in accordance with any one of aspects [1] to [19].

BRIEF DESCRIPTION OF DRAWINGS

FIG. 20B is a diagram showing the final spectral sensitivity characteristic of the yellow light receiving pixel;

DETAILED DESCRIPTION OF PREFERRED EMBODIMENTS

Hereinafter, embodiments of the optical sensor and the electronic device will be described with reference to the drawings. Each of the embodiments described below exemplify the configuration and method for embodying the technical idea, and is not intended to limit the material, shape, structure, arrangement, dimension, and the like of each configuring component. Various modifications can be made to the following embodiments.

In the present specification, "a state where a member A is connected to a member B" includes a case where the member A and the member B are physically and directly connected, and a case where the member A and the member B are indirectly connected through another member that does not affect the electrical connection state.

Similarly, "a state where a member C is provided between the member A and the member B" includes a case where the member A and the member C, or the member B and the member C are directly connected, and a case where the member A and the member C, or the member B and the member C are indirectly connected through another member that does not affect the electrical connection state.

First Embodiment

Figure 1:
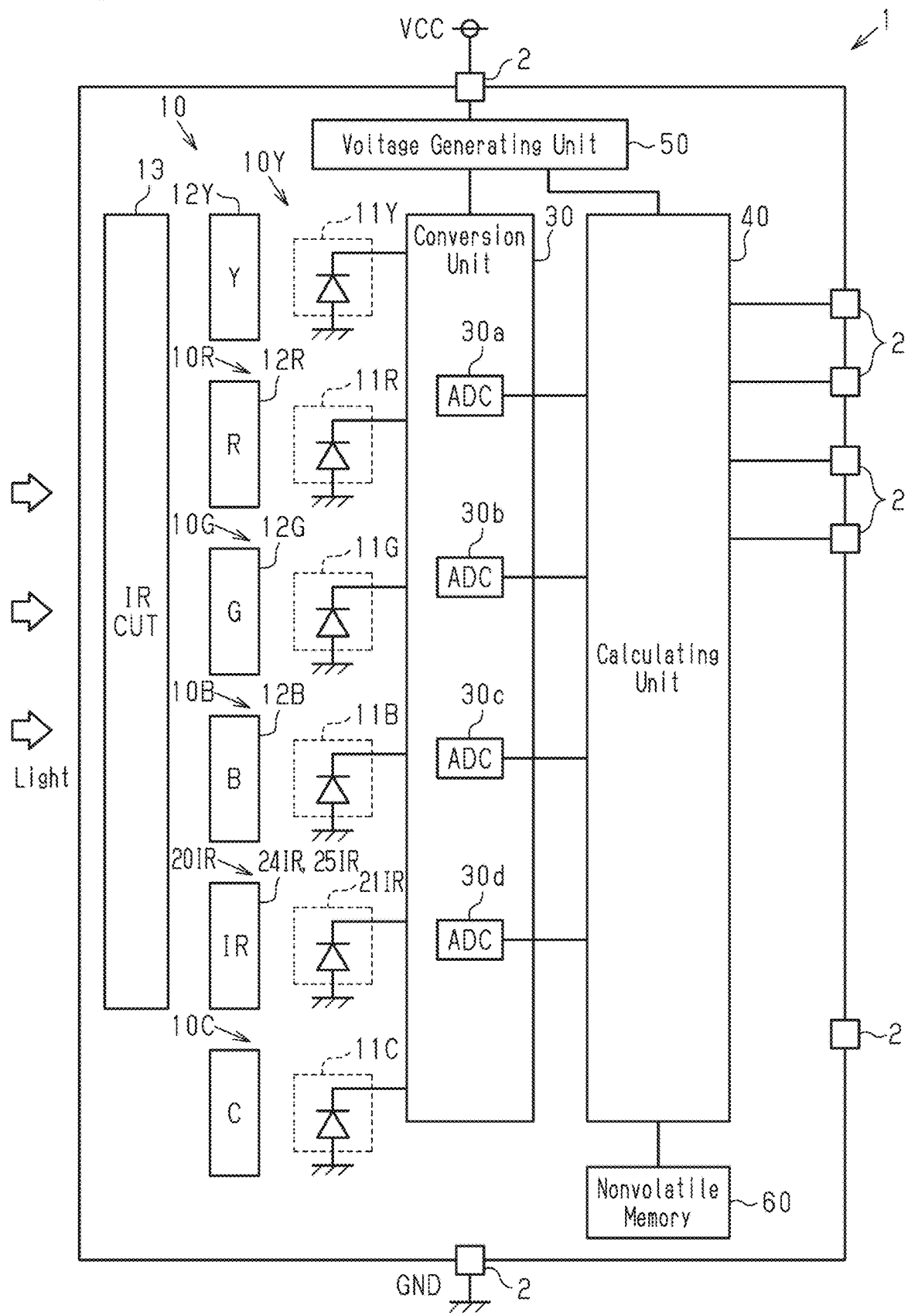
FIG. 1 is a schematic block diagram showing an electrical configuration of an optical sensor of a first embodiment.

As shown in FIG. 1, an optical sensor 1 includes a light receiving unit 10, an infrared cut filter 13, a conversion unit 30 which is an example of an output circuit, a calculating unit 40, a voltage generating unit (bias voltage applying unit) 50, a nonvolatile memory 60 which is an example of a storage unit, and a plurality of external terminals 2. The optical sensor 1 is a semiconductor integrated circuit in which the light receiving unit 10, the conversion unit 30, the calculating unit 40, the voltage generating unit 50, and the nonvolatile memory 60 are formed on one semiconductor substrate. An example of the optical sensor 1 is an illuminance sensor that detects the illuminance of ambient light. The light receiving unit 10 includes a plurality of light receiving pixels for detecting visible light and infrared light. The infrared cut filter 13 covers the light receiving unit 10. The conversion unit 30 converts an analog signal (photocurrent) from the light receiving unit 10 into a digital signal and outputs the same to the calculating unit 40. The calculating unit 40 calculates the intensity of the visible light based on the digital signal from the conversion unit 30. The voltage generating unit 50 is connected to a power supply terminal (VCC) of the external terminals 2. The voltage generating unit 50 steps up or steps down the voltage applied to the power supply terminal to generate a predetermined voltage, and inputs power supply to the light receiving unit 10, the conversion unit 30, and the calculating unit 40. The nonvolatile memory 60 stores various kinds of information relating to the control of the optical sensor 1, the calculation of signals and the like.

The light receiving unit 10 includes a yellow light receiving pixel 10Y for detecting visible light in a yellow wavelength band, a red light receiving pixel 10R for detecting visible light in a red wavelength band, a green light receiving pixel 10G for detecting visible light in a green wavelength band, a blue light receiving pixel 10B for detecting visible light in a blue wavelength band, an infrared light receiving pixel 20IR for detecting light in a wavelength band of infrared light, and a clear light receiving pixel 10C.

The yellow light receiving pixel 10Y includes a first light receiving element 11Y and a yellow filter 12Y that covers the first light receiving element 11Y. The red light receiving pixel 10R includes a second light receiving element 11R and a red filter 12R that covers the second light receiving element 11R. The green light receiving pixel 10G includes a third light receiving element 11G and a green filter 12G that covers the third light receiving element 11G. The blue light receiving pixel 10B includes a fourth light receiving element 11B and a blue filter 12B that covers the fourth light receiving element 11B. The infrared light receiving pixel 20IR includes a first infrared light receiving pixel 22IR and a second infrared light receiving pixel 23IR (see FIG. 2). In FIG. 1, for the sake of convenience, the first infrared light receiving pixel 22IR and the second infrared light receiving pixel 23IR are shown as the infrared light receiving pixel 20IR. The first infrared light receiving pixel 22IR includes a fifth light receiving element 21IR and a first infrared transmitting filter 24IR that covers the fifth light receiving element 21IR. The second infrared light receiving pixel 23IR includes a fifth light receiving element 21IR differing from the fifth light receiving element 21IR of the first infrared light receiving pixel 22IR and a second infrared transmitting filter 25IR that covers the fifth light receiving element 21IR. The clear light receiving pixel 10C includes a clear light receiving element 11C. Each of the light receiving elements 11Y, 11R, 11G, 11B, 21IR, 11C includes one photodiode. Each of the light receiving elements 11Y, 11R, 11G, 11B, 21IR, 11C may include a plurality of photodiodes.

The conversion unit 30 is, for example, an integral type analog/digital conversion circuit, and has a plurality of input channels. In the present embodiment, the conversion unit 30 is a four-channel analog/digital conversion circuit. The conversion unit 30 converts the analog signal of each channel into a digital signal. For the sake of convenience, each channel will be described as one analog/digital conversion circuit. The conversion unit 30 of the present embodiment includes four analog/digital conversion circuits (denoted as "ADC" in the drawing) 30a to 30d. The analog/digital conversion circuit 30a, which is an example of the first conversion unit, converts the photocurrent of the first light receiving element 11Y into a digital signal. The analog/digital conversion circuit 30b converts the photocurrent of the third light receiving element 11G into a digital signal. The conversion unit 30 includes a switching unit that switches between the fourth light receiving element 11B and the fifth light receiving element 21IR to connect to the analog/digital conversion circuit 30d. The state in which the fourth light receiving element 11B and the analog/digital conversion circuit 30d are connected and the state in which the fifth light receiving element 21IR and the analog/digital conversion circuit 30d are connected are switched by the switching unit.

Furthermore, the conversion unit 30 includes a switching unit that switches between the second light receiving element 11R and the clear light receiving element 11C to connect to the analog/digital conversion circuit 30c, which is an example of a second conversion unit. The state in which the second light receiving element 11R and the analog/digital conversion circuit 30c are connected and the state in which the clear light receiving element 11C and the analog/digital conversion circuit 30c are connected are switched by the switching unit.

The calculating unit 40 is formed of an integrated circuit such as a Large Scale Integration (LSI), for example, and includes various circuit elements such as a transistor, a capacitor, a register, and the like. The calculating unit 40 is electrically connected to the plurality of external terminals 2 formed on an outermost surface of the optical sensor 1. The signal output from the calculating unit 40, the power supply input to the light receiving unit 10, the conversion unit 30, the calculating unit 40, and the like are performed through the plurality of external terminals 2.

Figure 2:
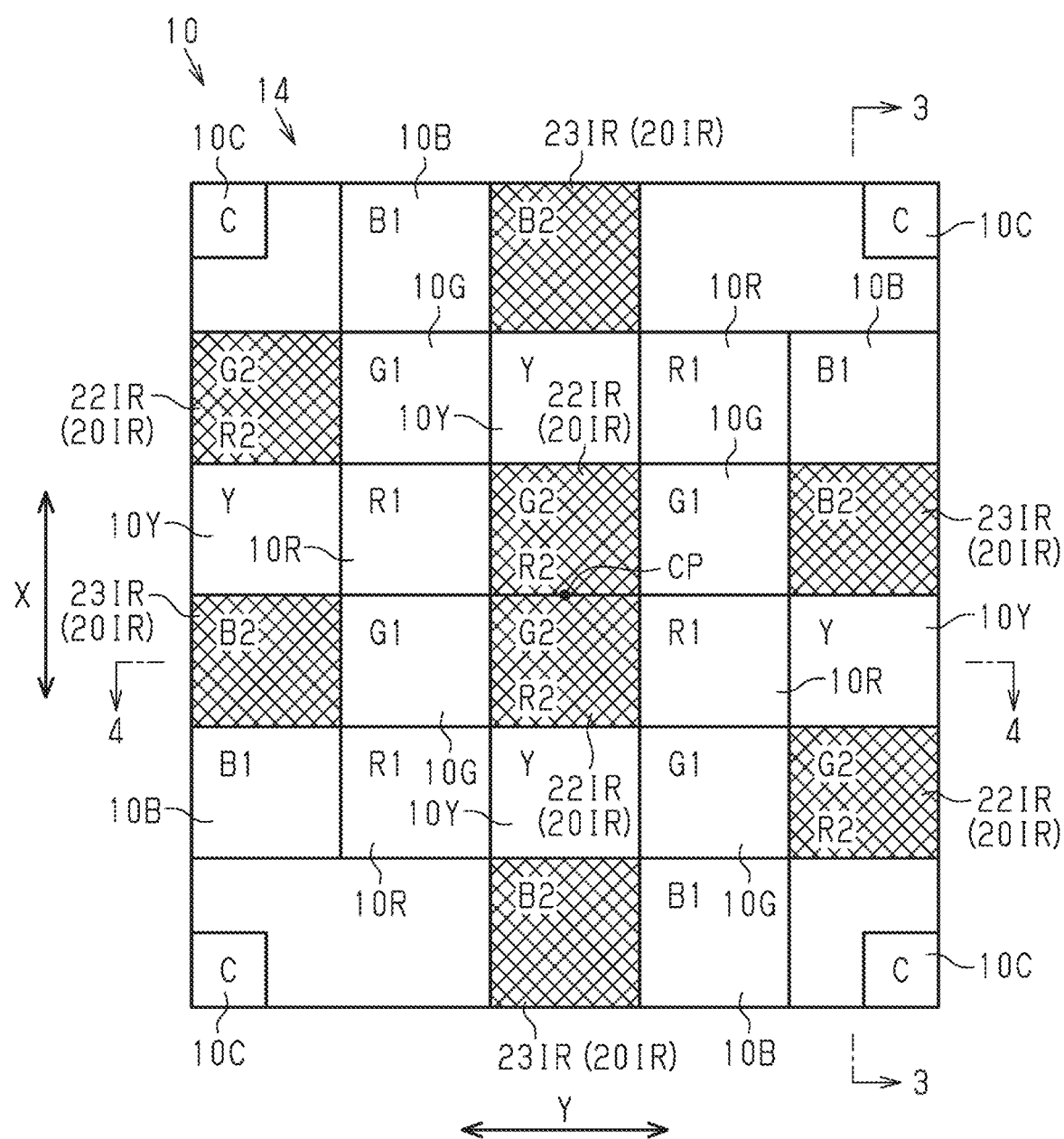
FIG. 2 is a layout diagram of a light receiving region of a light receiving unit in the optical sensor.

FIG. 2 is a layout diagram of a light receiving region 14 of the light receiving unit 10. In FIG. 2, the infrared light receiving pixel 20IR is indicated by a hatched square. Furthermore, in FIG. 2, "Y" indicates the output signal (first output signal) of the yellow light receiving pixel 10Y, "R1" indicates the output signal (second output signal) of the red light receiving pixel 10R, "G1" indicates the output signal of the green light receiving pixel 10G, and "B1" indicates the output signal of the blue light receiving pixel 10B. "R2" and "G2" indicate the output signals of the first infrared light receiving pixel 22IR and "B2" indicates the output signal of the second infrared light receiving pixel 231IR.

The light receiving region 14 is formed to be substantially rectangular in a plan view. An intersection of the diagonal lines in the light receiving region 14 is set as a center CP (center of gravity) which is the central part of the light receiving unit 10. In the following description, the longitudinal direction of the light receiving region 14 is referred to as "first direction X," and the direction orthogonal to the first direction X in a plan view of the light receiving region 14 is defined as "second direction Y"

As shown in FIG. 2, the yellow light receiving pixel 10Y, the red light receiving pixel 10R, the green light receiving pixel 10G, the blue light receiving pixel 10B, the infrared light receiving pixel 20IR, and the clear light receiving pixel 10C are provided in plurals respectively. The infrared light receiving pixel 20IR includes the first infrared light receiving pixel 22IR and the second infrared light receiving pixel 23IR. The first infrared light receiving pixel 22IR and the second infrared light receiving pixel 23IR have different detectable light wavelength bands. In the present embodiment, four of each of the yellow light receiving pixel 10Y, the red light receiving pixel 10R, the green light receiving pixel 10G, the blue light receiving pixel 10B, the first infrared light receiving pixel 22IR, and the second infrared light receiving pixel 23IR are provided.

The yellow light receiving pixel 10Y, the red light receiving pixel 10R, the green light receiving pixel 10G, the blue light receiving pixel 10B, the first infrared light receiving pixel 22IR, the second infrared light receiving pixel 23IR, and the clear light receiving pixel 10C are arranged in a lattice-like manner in the light receiving region 14.

More specifically, the light receiving unit 10 is capable of arranging six light receiving pixels in the first direction X, and five light receiving pixels in the second direction Y. The light receiving pixels aligned in the first direction X are regarded as one column, and first column, second column, third column, fourth column, and fifth column are sequentially arranged from one end to the other end in the second direction Y.

In the first column, six light receiving pixels of the clear light receiving pixel 10C, the first infrared light receiving pixel 22IR, the yellow light receiving pixel 10Y, the second infrared light receiving pixel 23IR, the blue light receiving pixel 10B, and the clear light receiving pixel 10C are arrayed. In the second column, five light receiving pixels of the blue light receiving pixel 10B, the green light receiving pixel 10G, the red light receiving pixel 10R, the green light receiving pixel 10G, and the red light receiving pixel 10R are arrayed. In the third column, six light receiving pixels of the second infrared light receiving pixel 23IR, the yellow light receiving pixel 10Y, the first infrared light receiving pixel 22IR, the first infrared light receiving pixel 22IR, the yellow light receiving pixel 10Y, and the second infrared light receiving pixel 23IR are arrayed. In the fourth column, five light receiving pixels of the red light receiving pixel 10R, the green light receiving pixel 10G, the red light receiving pixel 10R, the green light receiving pixel 10G, and the blue light receiving pixel 10B are arrayed. In the fifth column, six light receiving pixels of the clear light receiving pixel 10C, the blue light receiving pixel 10B, the second infrared light receiving pixel 23IR, the yellow light receiving pixel 10Y, the first infrared light receiving pixel 22IR, and the clear light receiving pixel 10C are arrayed.

The light receiving unit 10 in which the pixels 10Y, 10R, 10G, 10B, 20IR, 10C are arranged In the manner has the following pixel arrangement characteristics.

As can be seen from FIG. 2, in the plan view of the light receiving unit 10, the yellow light receiving pixel 10Y and the red light receiving pixel 10R are arranged to be adjacent to each other. That is, the first light receiving element 11Y and the second light receiving element 11R are arranged to be adjacent to each other, and the yellow filter 12Y and the red filter 12R of the red light receiving pixel 10R are arranged to be adjacent to each other. The yellow light receiving pixel 10Y and the red light receiving pixel 10R are arranged in the second direction Y. The green light receiving pixel 10G and the red light receiving pixel 10R are arranged to be adjacent to each other. That is, the third light receiving element 11G and the second light receiving element 11R are arranged to be adjacent to each other, and the green filter 12G of the green light receiving pixel 10G and the red filter 12R of the red light receiving pixel 10R are arranged to be adjacent to each other. Furthermore, the first infrared light receiving pixel 22IR is arranged so as to be adjacent to both of the red light receiving pixel 10R and the green light receiving pixel 10G. More specifically, the first infrared light receiving pixel 22IR is arranged so as to be adjacent to the red light receiving pixel 10R in the second direction Y, and is arranged to be adjacent to the green light receiving pixel 10G in the first direction X and the second direction Y, that is, in the oblique direction.

In the plan view of the light receiving unit 10, the clear light receiving pixels 10C are arranged at the four corners of the light receiving unit 10 (light receiving region 14). The blue light receiving pixel 10B is arranged so as to be adjacent to the clear light receiving pixel 10C in the outer peripheral portion of the light receiving unit 10. The second infrared light receiving pixel 23IR is arranged to be adjacent to the blue light receiving pixel 10B on the side opposite to the clear light receiving pixel 10C with respect to the blue light receiving pixel 10B in the outer peripheral portion of the light receiving unit 10.

The plurality of yellow light receiving pixels 10Y are arranged so as to be point symmetric with the center CP of the light receiving region 14 serving as the center of symmetry, and the plurality of red light receiving pixels 10R are arranged so as to be point symmetric with the center CP of the light receiving region 14 serving as the center of symmetry. That is, the plurality of first light receiving elements 11Y are arranged so as to be point symmetric with the center CP of the light receiving region 14 serving as the center of symmetry, and the plurality of second light receiving elements 11R are arranged so as to be point symmetric with the center CP of the light receiving region 14 serving as the center of symmetry. The yellow filter 12Y is arranged so as to be point symmetric with the center CP of the light receiving region 14 serving as the center of symmetry, and the red filter 12R of the red light receiving pixel 10R is arranged so as to be point symmetric with the center CP of the light receiving region 14 serving as the center of symmetry.

The plurality of green light receiving pixels 10G are arranged so as to be point symmetric with the center CP of the light receiving region 14 serving as the center of symmetry, and the plurality of blue light receiving pixels 10B are arranged so as to be point symmetric with the center CP of the light receiving region 14 serving as the center of symmetry. That is, the plurality of third light receiving elements 11G are arranged so as to be point symmetric with the center CP of the light receiving region 14 serving as the center of symmetry, and the plurality of fourth light receiving elements 11B are arranged so as to be point symmetric with the center CP of the light receiving region 14 serving as the center of symmetry. The green filter 12G of the green light receiving pixel 10G is arranged so as to be point symmetric with the center CP of the light receiving region 14 serving as the center of symmetry, and the blue filter 12B of the blue light receiving pixel 10B is arranged so as to be point symmetric with the center CP of the light receiving region 14 serving as the center of symmetry.

The plurality of first infrared light receiving pixels 22IR are arranged so as to be point symmetric with the center CP of the light receiving region 14 serving as the center of symmetry and the plurality of second infrared light receiving pixels 23IR are arranged so as to be point symmetric with the center CP of the light receiving region 14 serving as the center of symmetry. That is, the fifth light receiving element 21IR of the first infrared light receiving pixel 22IR is arranged so as to be point symmetric with the center CP of the light receiving region 14 serving as the center of symmetry, and the fifth light receiving element 21IR of the second infrared light receiving pixel 23IR is arranged so as to be point symmetric with the center CP of the light receiving region 14 serving as the center of symmetry. The first infrared transmitting filter 24IR is arranged so as to be point symmetric with the center CP of the light receiving region 14 serving as the center of symmetry and the second infrared transmitting filter 25IR is arranged so as to be point symmetric with the center CP of the light receiving region 14 serving as the center of symmetry.

Figure 3:
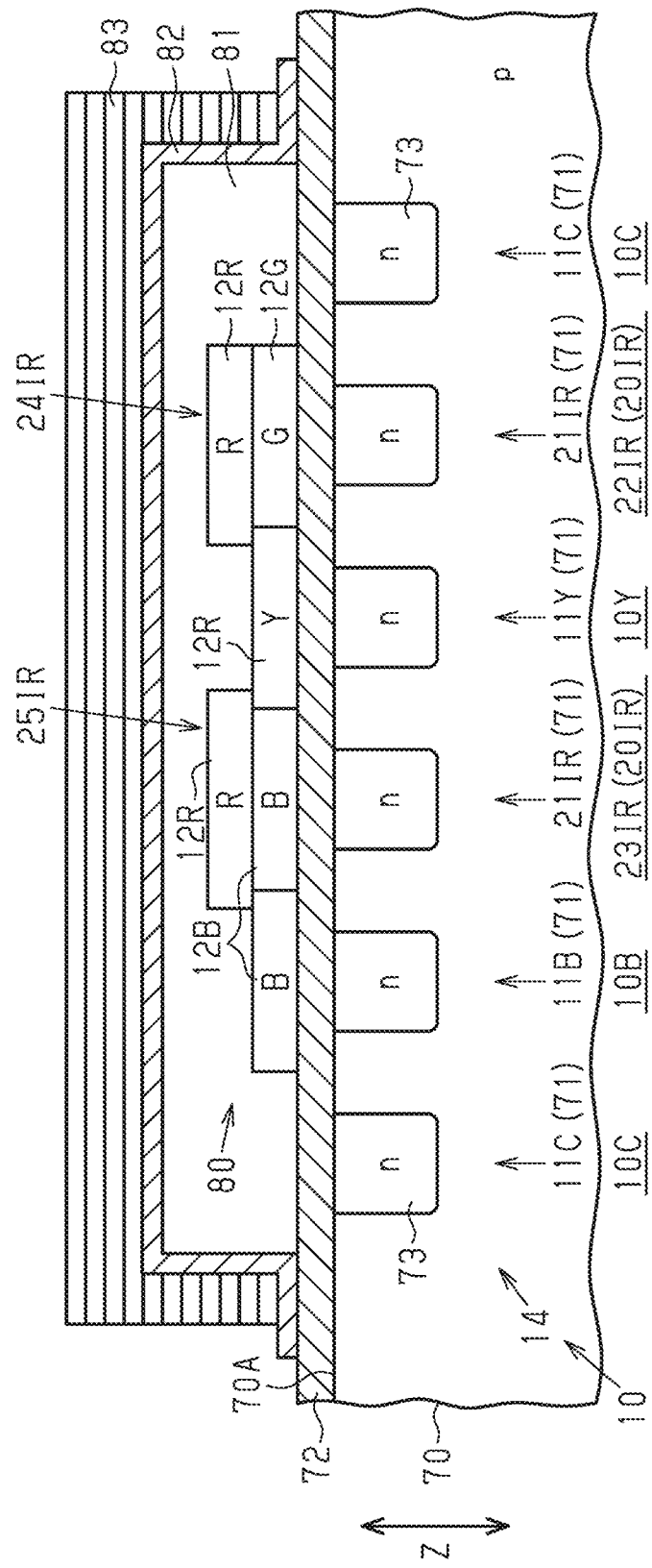
FIG. 3 is a cross-sectional view of the light receiving unit taken along line 3-3 in FIG. 2.

Cross-sectional structures of the yellow light receiving pixel 10Y, the red light receiving pixel 10R, the green light receiving pixel 10G, the blue light receiving pixel 10B, the first infrared light receiving pixel 22IR, and the second infrared light receiving pixel 23IR will now be described with reference to FIGS. 3 and 4. FIG. 3 is a cross-sectional structure of a light receiving pixel in the fifth column, and FIG. 4 is a cross-sectional structure in which the light receiving unit 10 is cut in a direction along the second direction Y.

Figure 4:
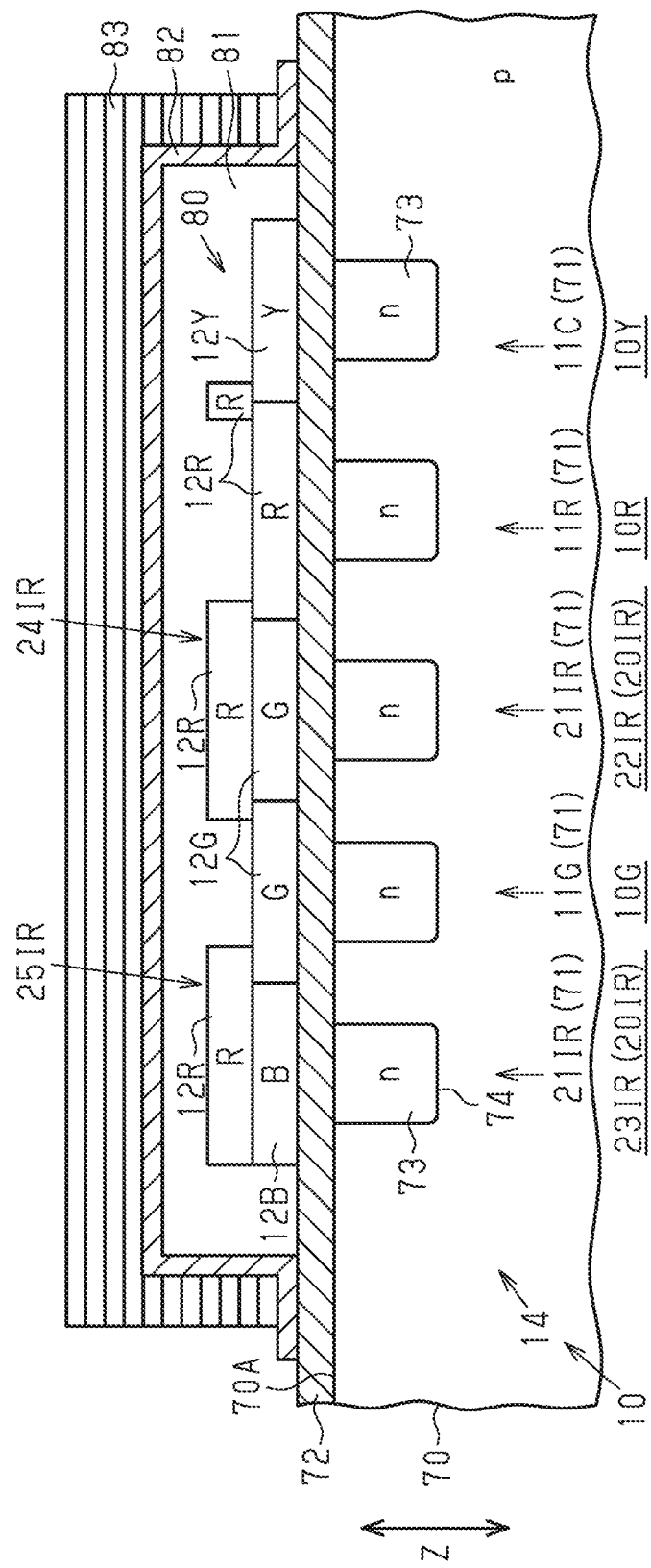
FIG. 4 is a cross-sectional view of the light receiving unit taken along line 4-4 in FIG. 2.

As shown in FIGS. 3 and 4, the yellow light receiving pixel 10Y, the red light receiving pixel 10R, the green light receiving pixel 10G, the blue light receiving pixel 10B, the first infrared light receiving pixel 22IR, and the second infrared light receiving pixel 23IR include, as common elements, a semiconductor substrate 70, a light receiving element 71 formed on the semiconductor substrate 70, and an interlayer insulating film 72 covering the entire surface 70A of the semiconductor substrate 70. The light receiving element 71 corresponds to the first light receiving element 11Y, the second light receiving element 11R, the third light receiving element 11G, the fourth light receiving element 11B, the fifth light receiving element 21IR, and the clear light receiving element 11C.

In the present embodiment, the semiconductor substrate 70 includes a p-type silicon substrate. The semiconductor substrate 70 has a larger area than the light receiving region 14 in order to form the conversion unit 30, the calculating unit 40, the voltage generating unit 50, and the nonvolatile memory 60 (see FIG. 1).

The light receiving element 71 has an n-type region 73 formed on a surface 70A of the p-type semiconductor substrate 70. The p-type semiconductor substrate 70 is connected to the ground. An n-type region 73 is formed by doping an n-type impurity from the surface 70A of the semiconductor substrate 70. As a result, the light receiving element 71 includes a photodiode PD1 that generates a photocurrent.

The photodiode PD1 includes a pn junction surface 74 of the p-type semiconductor substrate 70 and the n-type region 73. The depth of the n-type region 73 from the surface 70A (light receiving surface) of the semiconductor substrate 70 is about 2 μm.

Since the calculating unit 40 and the like are also formed in the semiconductor substrate 70, for example, an impurity region of a transistor forming the calculating unit 40 may be formed. In this case, the n-type region 73 may be formed in the same process as the impurity region such as a source region, a drain region, a buried layer (L/I, B/L) for element isolation, and the like that configure the transistor.

The interlayer insulating film 72 is made of an insulating material such as silicon oxide ($SiO_2$). The interlayer insulating film 72 may be a single layer as shown in FIGS. 3 and 4, or may be a plurality of layers.

As shown in FIGS. 3 and 4, a color filter 80 that covers the light receiving surface (surface 70A of the semiconductor substrate 70) of the light receiving element 71 is formed on the interlayer insulating film 72. The color filter 80 includes a yellow filter 12Y, a red filter 12R, a green filter 12G, and a blue filter 12B. The color filter 80 is formed from an organic material and can be composed of, for example, a color resist based on a pigment, a transmissive resist formed using a nanoimprint technique, a gelatin film, or the like.

A resist film 81, a protective film 82, and the infrared cut filter 13 are formed on the color filter 80. The resist film 81 covers the entire color filter 80. The resist film 81 is made of a transparent resin such as titanium oxide ($TiO_2$). The protective film 82 covers the entire resist film 81. The infrared cut filter 13 covers the entire protective film 82. The infrared cut filter 13 includes a multilayer dielectric film in which a plurality of (e.g., about 50 layers) $SiO_2/TiO_2$ structures, for example, are layered. The infrared cut filter 13 becomes a common coating film for the yellow light receiving pixel 10Y, the red light receiving pixel 10R, the green light receiving pixel 10G, the blue light receiving pixel 10B, and the infrared light receiving pixel 20IR. In the infrared cut filter 13, the corner portion of the infrared cut filter 13 is cut out so that the clear light receiving pixel 10C is exposed. Thus, the infrared cut filter 13 covers the light receiving region 14 other than the four corners where the clear light receiving pixel 10C is arranged in the light receiving region 14.

FIG. 3 shows a cross-sectional structure of the yellow light receiving pixel 10Y, the blue light receiving pixel 10B, the first infrared light receiving pixel 22IR, the second infrared light receiving pixel 23IR, and the clear light receiving pixel 10C.

As shown in FIG. 3, the yellow filter 12Y covers the first light receiving element 11Y in a direction (hereinafter referred to as orthogonal direction Z) orthogonal to the light receiving surface of the light receiving element 71. The yellow filter 12Y covers the entire light receiving region of the first light receiving element 11Y in the light receiving surface (surface 70A of the semiconductor substrate 70) of the first light receiving element 11Y. The yellow filter 12Y transmits light having a wavelength greater than or equal to the wavelength corresponding to the yellow visible light and blocks light having a wavelength shorter than such wavelength.

The blue filter 12B covers the fourth light receiving element 11B in the orthogonal direction Z. The blue filter 12B covers the entire light receiving surface of the fourth light receiving element 11B (surface 70A of the semiconductor substrate 70). The blue filter 12B transmits light having a wavelength greater than or equal to the wavelength corresponding to the blue visible light and blocks light having a wavelength shorter than such wavelength.

The infrared transmitting filter 24IR is configured by overlapping two or more types of filters. More specifically, the infrared transmitting filter 24IR is configured by overlapping two or more types of filters among the yellow filter 12Y, the red filter 12R, the green filter 12G, and the blue filter 12B. The infrared transmitting filter 24IR of the present embodiment is configured by overlapping the red filter 12R and the green filter 12G. More specifically, the green filter 12G covers the fifth light receiving element 21IR in the orthogonal direction Z. The green filter 12G covers the entire light receiving region of the fifth light receiving element 21IR in the light receiving surface of the fifth light receiving element 21IR (surface 70A of the semiconductor substrate 70). The red filter 12R covers the green filter 12G in the orthogonal direction Z. The red filter 12R covers the entire green filter 12G. When viewed from the orthogonal direction Z, the area of the red filter 12R is larger than the area of the green filter 12G. Furthermore, the green filter 12G is arranged adjacent to the yellow filter 12Y in the first direction X. Therefore, a part of the outer edge of the red filter 12R covers a part of the outer edge of the yellow filter 12Y. In other words, the red filter 12R of the infrared transmitting filter 24IR covers the boundary portion between the green filter 12G and the yellow filter 12Y. Furthermore, as shown in FIG. 2, since the first infrared light receiving pixel 22IR is arranged adjacent to the green light receiving pixel 10G in the second direction Y, a part of the outer edge of the red filter 12R of the infrared transmitting filter 24IR covers a part of the outer edge of the green filter 12G of the green light receiving pixel 10G. In other words, the red filter 12R of the infrared transmitting filter 24IR covers the boundary portion between the green filter 12G of the infrared transmitting filter 24IR and the green filter 12G of the green light receiving pixel 10G. In the manner, the red filter 12R covering the boundary portion can limit light interference at the boundary portion.

As shown in FIG. 3, the infrared transmitting filter 25IR is configured by overlapping two or more types of filters. More specifically, the infrared transmitting filter 25IR is configured by overlapping two or more types of filters among the yellow filter 12Y, the red filter 12R, the green filter 12G, and the blue filter 12B. The infrared transmitting filter 25IR of the present embodiment is configured by overlapping the red filter 12R and the blue filter 12B. More specifically, the blue filter 12B covers the fifth light receiving element 21IR in the orthogonal direction Z. The blue filter 12B covers the entire light receiving region of the fifth light receiving element 21IR on the light receiving surface of the fifth light receiving element 21IR (surface 70A of the semiconductor substrate 70). The red filter 12R covers the blue filter 12B in the orthogonal direction Z. The red filter 12R covers the entire blue filter 12B. When viewed from the orthogonal direction Z, the area of the red filter 12R is larger than the area of the blue filter 12B. The blue filter 12B of the second infrared light receiving pixel 23IR is arranged so as to be adjacent to both of the yellow filter 12Y and the blue filter 12B of the blue light receiving pixel 10B in the first direction X. Therefore, a part of the outer edge of the red filter 12R covers a part of the outer edge of the yellow filter 12Y and a part of the outer edge of the blue filter 12B of the blue light receiving pixel 10B. In other words, the red filter 12R of the infrared transmitting filter 25IR covers the boundary portion between the blue filter 12B and the yellow filter 12Y of the second infrared light receiving pixel 23IR and the boundary portion between the blue filter 12B of the second infrared light receiving pixel 23IR and the blue filter 12B of the blue light receiving pixel 10B. Furthermore, as shown in FIG. 2, since the second infrared light receiving pixel 23IR is arranged so as to be adjacent to the green light receiving pixel 10G in the second direction Y, a part of the outer edge of the red filter 12R of the infrared transmitting filter 25IR, and covers a part of the outer edge of the green filter 12G of the green light receiving pixel 10G. In other words, the red filter 12R of the infrared transmitting filter 25IR covers the boundary portion between the blue filter 12B of the second infrared light receiving pixel 23IR and the green filter 12G of the green light receiving pixel 10G. In the manner, the red filter 12R covering the boundary portion can limit light interference at the boundary portion.

The clear light receiving pixels 10C formed at both ends of the light receiving unit 10 in the first direction X is not covered by the color filter 80. That is, the light receiving surface of the clear light receiving pixel 10C (surface 70A of the semiconductor substrate 70) is covered with the resist film 81.

FIG. 4 shows a cross-sectional structure of the yellow light receiving pixel 10Y, the red light receiving pixel 10R, the green light receiving pixel 10G, the first infrared light receiving pixel 22IR, and the second infrared light receiving pixel 23IR. The structures of the yellow light receiving pixel 10Y, the first infrared light receiving pixel 22IR, and the second infrared light receiving pixel 23IR are the same as the structures of the yellow light receiving pixel 10Y, the first infrared light receiving pixel 22IR, and the second infrared light receiving pixel 23IR of FIG. 3.

As shown in FIG. 4, the red filter 12R of the red light receiving pixel 10R covers the second light receiving element 11R in the orthogonal direction Z. The red filter 12R covers the entire light receiving region of the second light receiving element 11R on the light receiving surface of the second light receiving element 11R (surface 70A of the semiconductor substrate 70). The red filter 12R transmits light having a wavelength greater than or equal to the wavelength corresponding to the red visible light and blocks light having a wavelength shorter than such wavelength. In the second direction Y, since the red light receiving pixel 10R is arranged so as to be adjacent to the yellow light receiving pixel 10Y, the red filter 12R is arranged adjacent to the yellow filter 12Y. The boundary portion between the red filter 12R and the yellow filter 12Y is covered with the red filter 12R in the orthogonal direction Z. The red filter 12R covering the boundary portion is formed separately from the red filter 12R of the red light receiving pixel 10R. The red filter 12R covering the boundary portion can limit light interference at the boundary portion.

The green filter 12G of the green light receiving pixel 10G covers the third light receiving element 11G in the orthogonal direction Z. The green filter 12G covers the entire light receiving region of the third light receiving element 11G on the light receiving surface of the third light receiving element 11G (surface 70A of the semiconductor substrate 70). The green filter 12G transmits light having a wavelength greater than or equal to the wavelength corresponding to the green visible light and blocks light having a wavelength shorter than such wavelength.

The first infrared light receiving pixel 22IR shown in FIG. 4 is arranged so as to be adjacent to the red light receiving pixel 10R and the green light receiving pixel 10G in the second direction Y. That is, the first infrared light receiving pixel 22IR is arranged between the red light receiving pixel 10R and the green light receiving pixel 10G in the second direction Y. Therefore, the green filter 12G of the infrared transmitting filter 24IR is arranged adjacent to the green filter 12G of the green light receiving pixel 10G and the red filter 12R of the red light receiving pixel 10R in the second direction Y. A part of the outer edge of the red filter 12R of the infrared transmitting filter 24IR covers a part of the outer edge of the green filter 12G of the green light receiving pixel 10G and a part of the outer edge of the red filter 12R of the red light receiving pixel 10R. In other words, the red filter 12R of the infrared transmitting filter 24IR covers both of the boundary portion between the green filter 12G of the first infrared light receiving pixel 22IR and the green filter 12G of the green light receiving pixel 10G, and the boundary portion between the green filter 12G of the first infrared light receiving pixel 22IR and the red filter 12R of the red light receiving pixel 10R. Furthermore, as shown in FIG. 2, the first infrared light receiving pixel 22IR shown in FIG. 4 is arranged so as to be adjacent to the yellow light receiving pixel 10Y in the first direction X. Therefore, a part of the outer edge of the red filter 12R of the infrared transmitting filter 24IR covers a part of the outer edge of the yellow filter 12Y. In other words, the red filter 12R of the infrared transmitting filter 24IR covers the boundary portion between the green filter 12G and the yellow filter 12Y of the first infrared light receiving pixel 22IR. The red filter 12R covering the boundary portion can limit light interference at the boundary portion.

The second infrared light receiving pixel 23IR shown in FIG. 4 is arranged so as to be adjacent to the green light receiving pixel 10G in the second direction Y. Therefore, the blue filter 12B of the infrared transmitting filter 25IR is arranged adjacent to the green filter 12G of the green light receiving pixel 10G in the second direction Y. A part of the outer edge of the red filter 12R of the infrared transmitting filter 25IR covers a part of the outer edge of the green filter 12G of the green light receiving pixel 10G. In other words, the red filter 12R of the infrared transmitting filter 25IR covers the boundary portion between the blue filter 12B of the second infrared light receiving pixel 23IR and the green filter 12G of the green light receiving pixel 10G. Furthermore, the second infrared light receiving pixel 23IR shown in FIG. 4 is arranged so as to be adjacent to the yellow light receiving pixel 10Y and the blue light receiving pixel 10B in the first direction X. That is, the second infrared light receiving pixel 23IR is arranged between the yellow light receiving pixel 10Y and the blue light receiving pixel 10B in the first direction X. Therefore, a part of the outer edge of the red filter 12R of the infrared transmitting filter 25IR covers a part of the outer edge of the yellow filter 12Y and a part of the outer edge of the blue filter 12B. In other words, the red filter 12R of the infrared transmitting filter 25IR covers the boundary portion between the blue filter 12B of the second infrared light receiving pixel 23IR and the blue filter 12B of the blue light receiving pixel 10B, and the boundary portion between the blue filter 12B and the yellow filter 12Y of the second infrared light receiving pixel 23IR. The red filter 12R covering the boundary portion can limit light interference at the boundary portion.

Next, the spectral sensitivity characteristics obtained by the calculation of the infrared separation in the yellow light receiving pixel 10Y will be individually described with reference to FIG. 5.

The calculating unit 40 calculates the intensity of the visible light in the yellow wavelength band, from which the infrared light is separated, based on the output signal Y of the yellow light receiving pixel 10Y and the output signal R1 of the red light receiving pixel 10R. In other words, it can be assumed that the calculating unit 40 of the present embodiment includes a yellow calculating unit that calculates the intensity of the visible light in the yellow wavelength band, from which the infrared light is separated, using the output signal Y of the yellow light receiving pixel 10Y and the output signal R1 of the red light receiving pixel 10R.

When light enters the yellow light receiving pixel 10Y, yellow light, red light, and infrared light are detected in the photodiode PD1 of the first light receiving element 11Y of the yellow light receiving pixel 10Y. This is because the red light is also transmitted due to the characteristics of the yellow filter 12Y of the present embodiment. The spectral sensitivity characteristic of the yellow light receiving pixel 10Y is as shown in the graph at the left end of FIG. 5. Here, the spectral sensitivity characteristic of FIG. 5 shows a state in which a part of the infrared light is filtered (separated) by the infrared cut filter 13.

Figure 5:
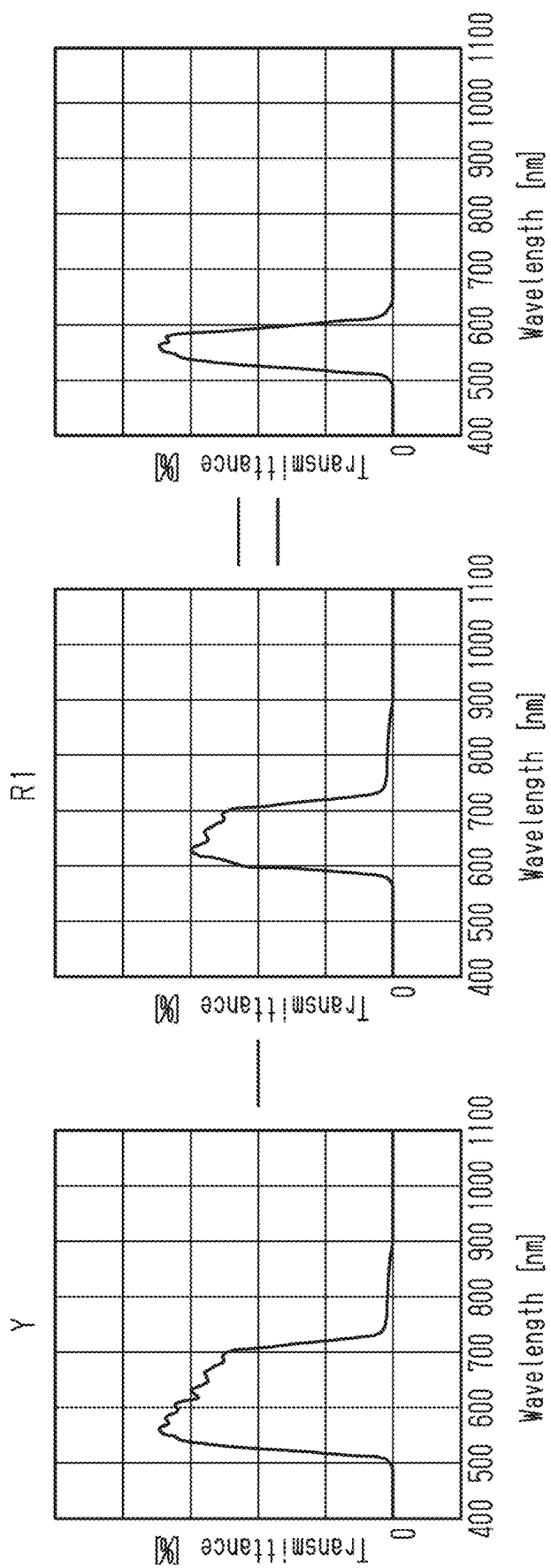
FIG. 5 is a diagram illustrating calculation of a yellow wavelength band of a yellow light receiving pixel and showing a spectral sensitivity characteristic of the yellow light receiving pixel and the spectral sensitivity characteristic of the red light receiving pixel.

As shown in FIG. 5, the spectral sensitivity curve (graph at the left end in FIG. 5) that transmits the single layer film of the yellow filter 12Y in the yellow light receiving pixel 10Y has a peak from the yellow wavelength band to the red wavelength band. The spectral sensitivity curve (graph at the center in FIG. 5) of the red light receiving pixel 10R has a peak in the red wavelength band. Therefore, if a mountain-shaped curve having a peak in the red wavelength band is separated from the spectral sensitivity curve having the peak from the yellow wavelength band to the red wavelength band, the mountain-shaped curve, which can be regarded as originating from yellow, clearly remains.

The output signal Y having a magnitude corresponding to the detection of yellow light and red light is input from the yellow light receiving pixel 10Y, and the output signal R1 having a magnitude corresponding to the detection of red light is input from the red light receiving pixel 10R to the calculating unit 40. Then, the output signal (information) close to the actual yellow light component of the incident light is obtained by selectively eliminating or attenuating the red wavelength band portion from the output signal Y of the yellow light receiving pixel 10Y based on the magnitude of the output signal R1 of the red light receiving pixel 10R. That is, when calculating the intensity of the yellow wavelength band as the yellow spectral sensitivity characteristic, the calculating unit 40 calculates an intensity Yx of the visible light in the yellow wavelength band based on a difference (Y−R1) of the output signal Y of the first light receiving element 11Y of the yellow light receiving pixel 10Y and the output signal R1 of the second light receiving element 11R of the red light receiving pixel 10R. As a result, the spectral sensitivity characteristic obtained by the separation of the red light in the yellow light receiving pixel 10Y is as shown in the graph at the right end of FIG. 5.

Next, the circuit configuration of the conversion unit 30, and a circuit configuration of the first light receiving element 11Y of the yellow light receiving pixel 10Y, the second light receiving element 11R of the red light receiving pixel 10R, the third light receiving element 11G of the green light receiving pixel 10G, the fourth light receiving element 11B of the blue light receiving pixel 10B, the fifth light receiving element 21IR of the first infrared light receiving pixel 22IR, and the fifth light receiving element 21IR of the second infrared light receiving pixel 23IR will be described.

Figure 6:
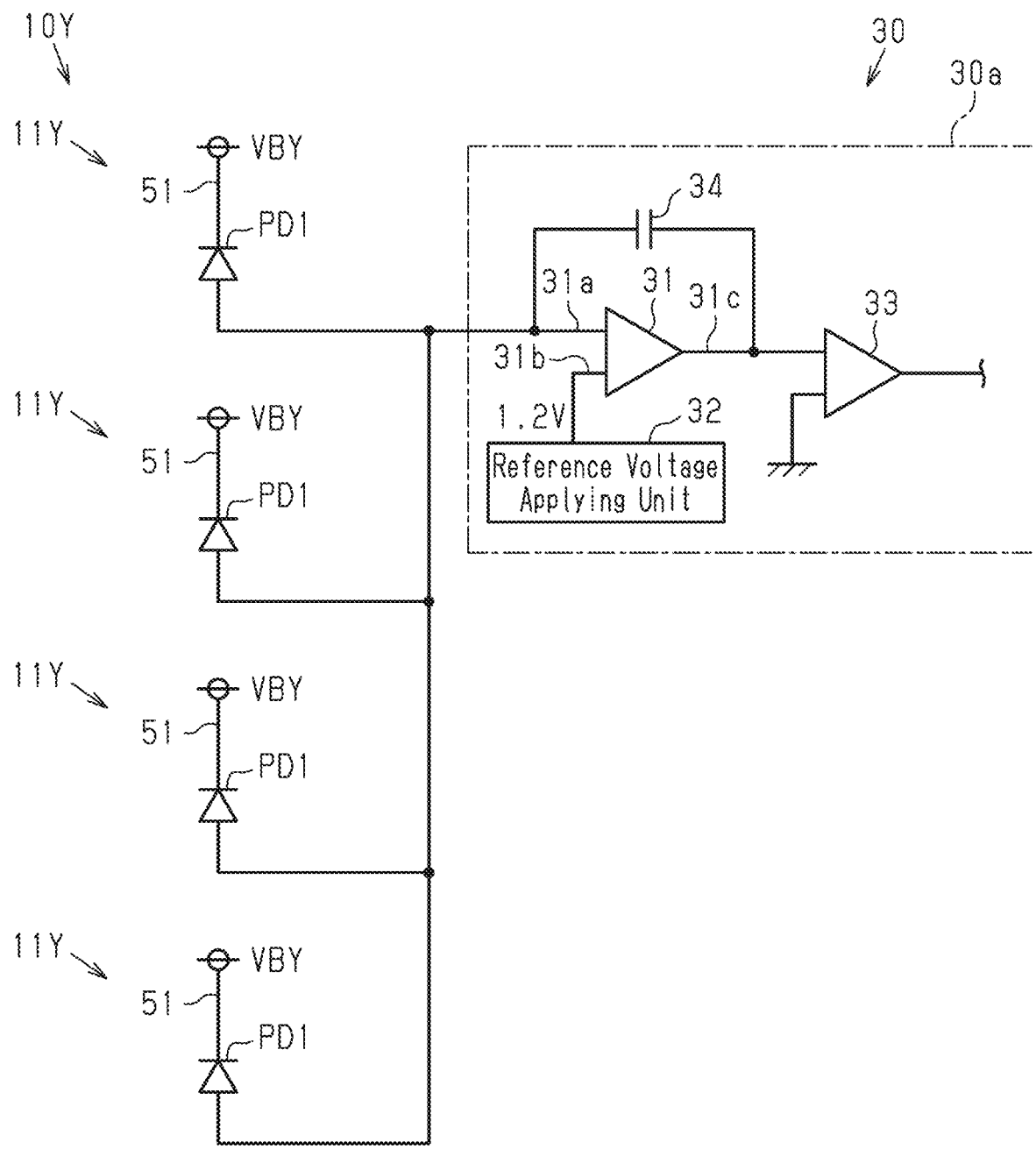
FIG. 6 is a circuit diagram showing a circuit configuration of a yellow light receiving pixel.

As shown in FIG. 6, the conversion unit 30 is an output circuit that outputs the combined value of the photocurrents generated by a plurality of light receiving elements that are light receiving elements of the same color and are connected in parallel with each other. The analog/digital conversion circuits 30a to 30d of the conversion unit 30 each includes an amplifier 31, a reference voltage applying unit 32, a voltage comparator 33, and a capacitor 34. An example of the amplifier 31 is an operational amplifier. The amplifier 31 includes a first input terminal 31a (inverted input terminal), a second input terminal 31b (non-inverted input terminal), and an output terminal 31c. The reference voltage applying unit 32 is connected to the second input terminal 31b. The reference voltage applying unit 32 applies a reference voltage to the second input terminal 31b. An example of the reference voltage is 1.2 V. The voltage comparator 33 is connected to the output terminal 31c. The first terminal of the capacitor 34 is connected to the first input terminal 31a, and the second terminal of the capacitor 34 is connected to the output terminal 31c. A reset switch (not shown) is connected in parallel to the capacitor 34.

As described above, the conversion unit 30 includes four analog/digital conversion circuits 30a to 30d. The connection correspondence between the four analog/digital conversion circuits 30a to 30d and each light receiving pixel 10Y, 10R, 10G, 10B, 20IR and 10C is as follows. That is, dedicated analog/digital conversion circuits 30a and 30b are connected to the yellow light receiving pixel 10Y and the green light receiving pixel 10G, respectively. The common analog/digital conversion circuit 30c is connected to the red light receiving pixel 10R and the clear light receiving pixel 10C through the switching unit, and the common analog/digital conversion circuit 30d is connected to the blue light receiving pixel 10B and the infrared light receiving pixel 20IR through the switching unit. Thus, the light receiving element of the light receiving pixel corresponding to the respective analog/digital conversion circuit 30a to 30d is reversely connected to the first input terminals 31a of the analog/digital conversion circuits 30a to 30d, respectively.

The operation of the analog/digital conversion circuits 30a to 30d will be described. For the sake of convenience of explanation, the analog/digital conversion circuit 30a corresponding to the first light receiving element 11Y will be described, and the charge of the capacitor 34 at the time point of the start of light reception by the first light receiving element 11Y is assumed as zero.

Since the charges are accumulated in the capacitor 34 based on the photocurrent generated in the first light receiving element 11Y when receiving light, the integral signal which is the output of the integrator including the amplifier 31 and the capacitor 34 increases. The analog/digital conversion circuit 30a integrates the integral signal of the integrator over a predetermined time from the start of the application of the voltage to the first input terminal 31a. Hereafter, the time for integrating the integral signal is referred to as the detection time. After the elapse of the detection time, the analog/digital conversion circuit 30a changes the voltage applied to the first input terminal 31a to a predetermined voltage lower than the voltage applied to the first input terminal 31a by the first light receiving element 11Y. The predetermined voltage is set in advance by tests and the like. The integral signal decreases toward 0 by changing to a predetermined voltage. The analog/digital conversion circuit 30a counts the number of pulses of a clock generation circuit in the time until the integral signal becomes 0 by the clock generation circuit (not shown), and outputs the same as a digital value (output signal).

FIG. 6 shows the circuit configuration of the first light receiving element 11Y of the yellow light receiving pixel 10Y. Since the circuit configuration of the other light receiving element is also substantially the same as the circuit configuration of the first light receiving element 11Y, in the following description, the circuit configuration of the first light receiving element 11Y will be described, and the description on the circuit configuration of the other light receiving element will be omitted.

As shown in FIG. 6, the four first light receiving elements 11Y are reverse connected to the first input terminal 31a of the amplifier 31 of the analog/digital conversion circuit 30a. The four first light receiving elements 11Y are connected in parallel to each other. The total photocurrent of the four first light receiving elements 11Y is input to the conversion unit 30.

The anode of the photodiode PD1 is connected to the first input terminal 31a of the analog/digital conversion circuit 30a. The cathode of the photodiode PD1 is connected to the power supply wiring 51 from the voltage generating unit 50 (see FIG. 1).

The voltage generating unit 50 and the cathodes of the photodiodes PD1 of the four first light receiving elements 11Y are connected for every first light receiving element 11Y by way of four power supply wirings 51. That is, the voltage generating unit 50 can apply the individual bias voltage VBY for every first light receiving element 11Y with respect to the cathodes of the photodiodes PD1 of the four first light receiving elements 11Y. Thus, in the yellow light receiving pixel 10Y, the photodiode PD1 is a specific photodiode which anode is connected to the first input terminal 31a of the amplifier 31 and to which cathode the bias voltage VBY is applied.

Next, the detailed configuration of the optical sensor 1 will be described with reference to FIGS. 7 to 9.

Figure 7:
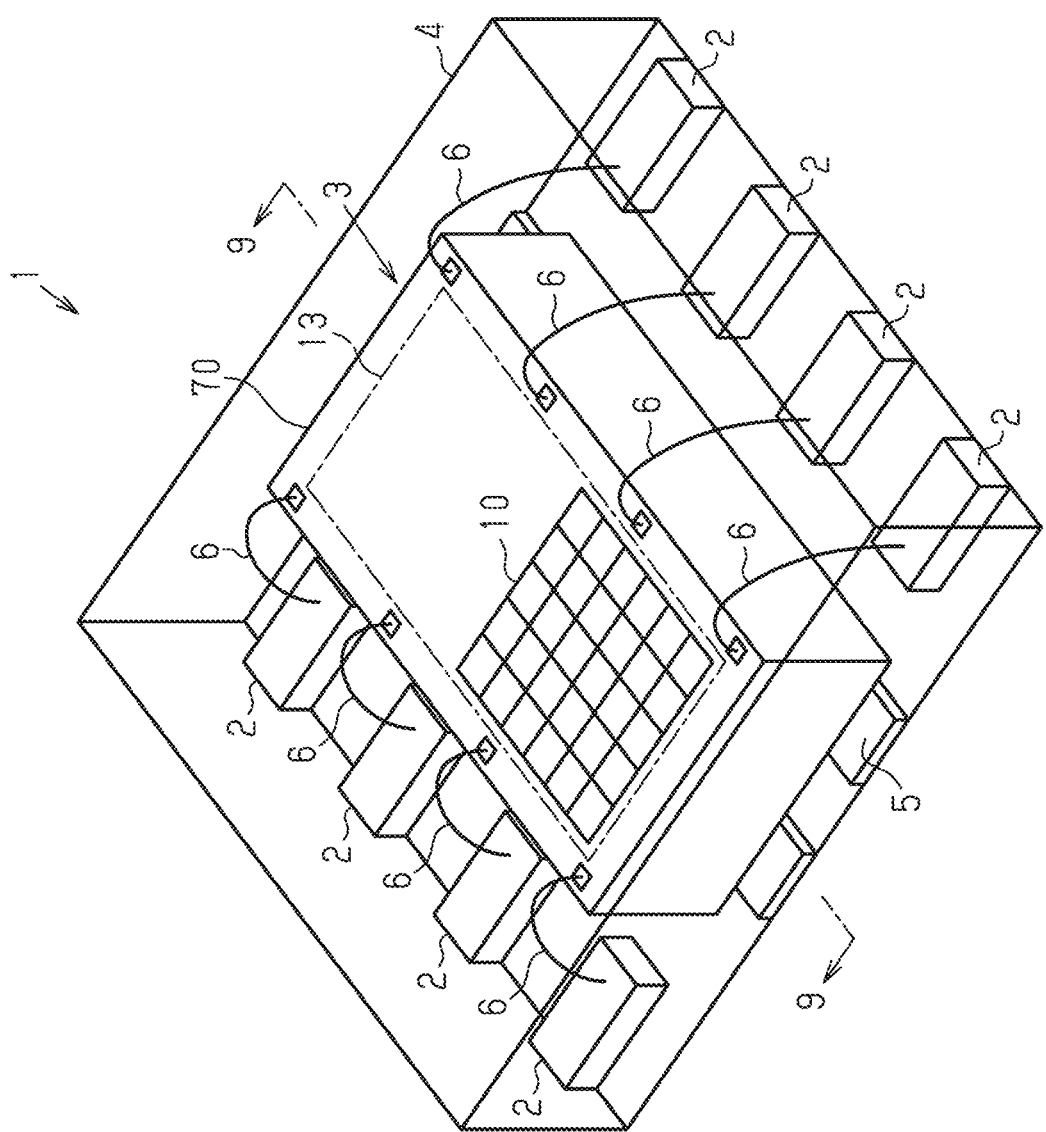
FIG. 7 is a perspective view of the optical sensor.

As shown in FIG. 7, the optical sensor 1 includes a rectangular semiconductor section 3 including the semiconductor substrate 70, eight external terminals 2 arranged on both sides of the semiconductor section 3 in a direction orthogonal to the longitudinal direction of the semiconductor section 3, and a sealing resin 4 for sealing the semiconductor section 3 and the external terminal 2. The sealing resin 4 is made of, for example, a transparent epoxy resin or a silicone resin.

The semiconductor section 3 includes the light receiving unit 10, the conversion unit 30, the calculating unit 40, the voltage generating unit 50, and the nonvolatile memory 60 (see FIG. 1). The light receiving unit 10 is formed closer to one side in the longitudinal direction in the semiconductor section 3. Although not shown, at least one of the conversion unit 30, the calculating unit 40, the voltage generating unit 50, and the nonvolatile memory 60 is formed closer to the other side in the longitudinal direction of the semiconductor section 3. The semiconductor section 3 is mounted on a heat radiation plate 5 made of metal such as aluminum by soldering or the like. The heat radiation plate 5 is sealed with the sealing resin 4.

Four external terminals 2 are arranged on each side of the semiconductor section 3. The four external terminals 2 are arranged at intervals in the longitudinal direction of the semiconductor section 3. The external terminal 2 includes a power supply terminal VCC and a ground terminal GND. The external terminal 2 includes a terminal for an interface of a communication bus (for example, an I$^2$C bus) and an interrupt output terminal. Each external terminal 2 and the semiconductor section 3 are connected by, for example, a bonding wire 6. The bonding wire 6 is connected to an outer peripheral edge of the semiconductor substrate 70 that is not covered with the infrared cut filter 13.

Figure 8:
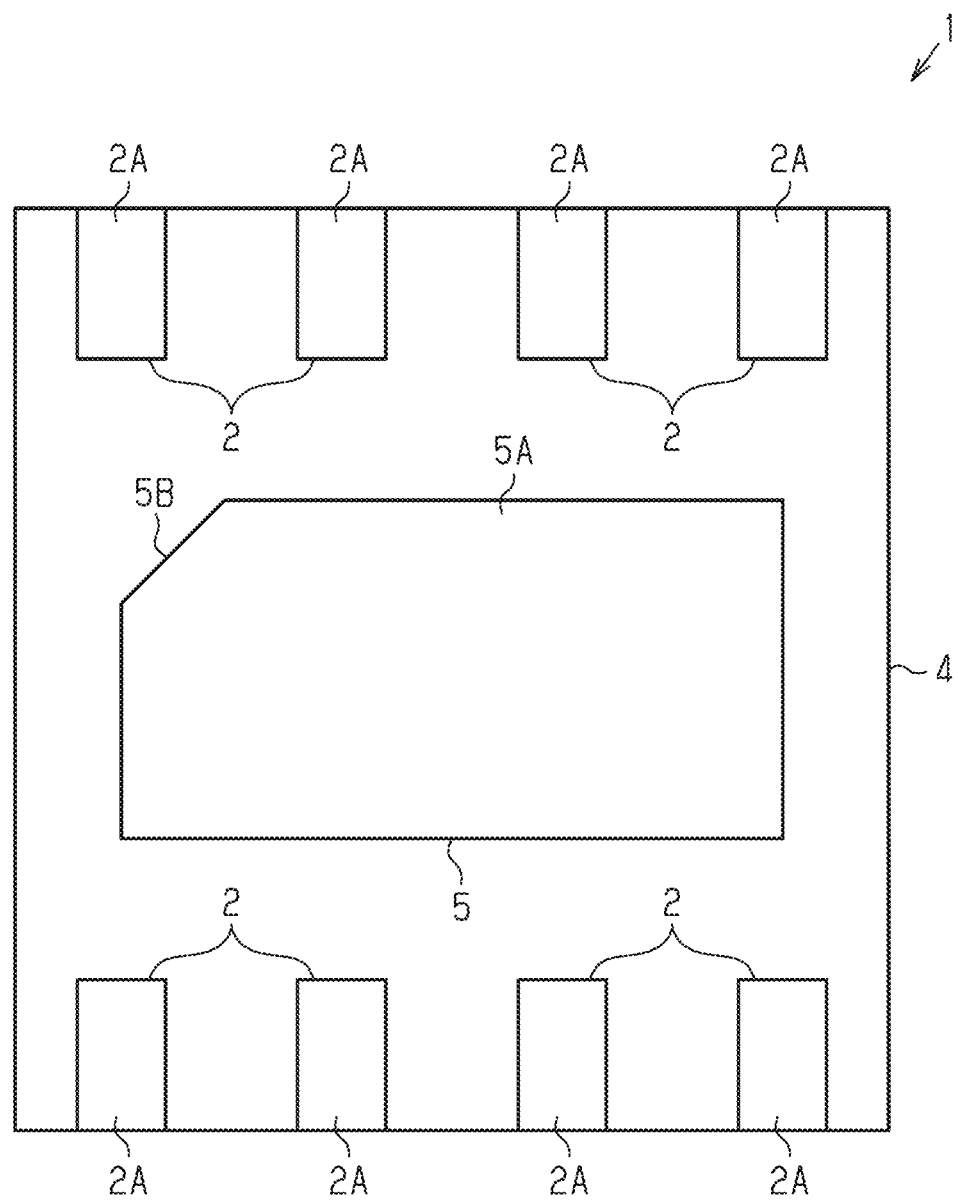
FIG. 8 is a bottom view of FIG. 7.

As shown in FIG. 8, the eight external terminals 2 and the heat radiation plate 5 have exposed surfaces 2A, 5A exposed from the sealing resin 4. On the exposed surface 5A of the heat radiation plate 5, a notch 5B for allowing the user to recognize the direction of the optical sensor 1 is formed. As described above, the optical sensor 1 of this embodiment is a surface mount type.

Figure 9:
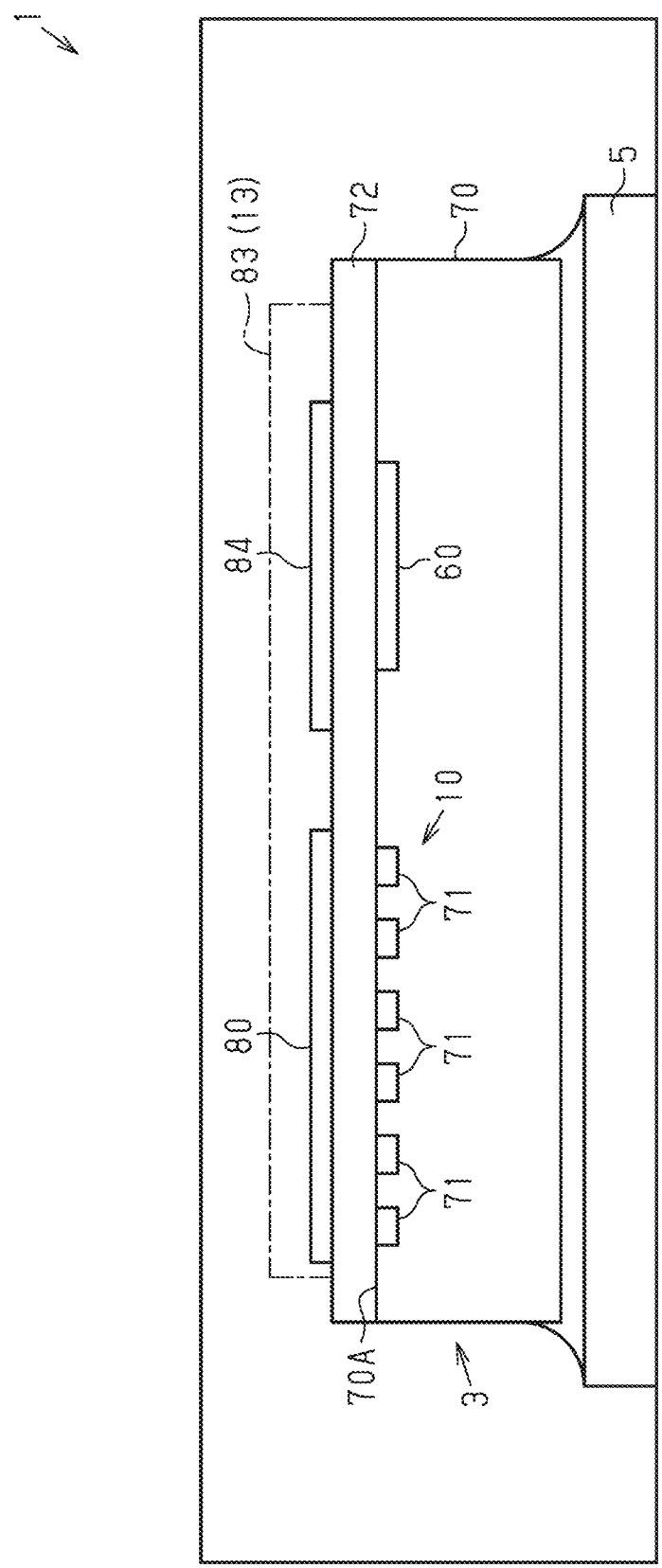
FIG. 9 is a cross-sectional view of the optical sensor taken along line 9-9 in FIG. 7.

As shown in FIG. 9, the optical sensor 1 includes a blocking layer 83 formed from an inorganic material provided at a position overlapping with the nonvolatile memory 60 when viewed from the direction orthogonal to the light receiving surface of the light receiving element 71, that is, the surface 70A of the semiconductor substrate 70, and configured to block the ultraviolet light. In the present embodiment, the infrared cut filter 13 also serves as the blocking layer 83. The infrared cut filter 13 cuts light in a wavelength band of less than 400 nm. That is, the infrared cut filter 13 can shut off ultraviolet rays. The infrared cut filter 13 covers substantially the entire inner peripheral side of the outer peripheral edge on the front surface 70A of the semiconductor substrate 70. Therefore, the infrared cut filter 13 is provided so as to cover the entire formation region of the nonvolatile memory 60.

A memory color filter 84 is provided at a position overlapping the nonvolatile memory 60 as viewed in a direction orthogonal to the surface 70A of the semiconductor substrate 70. The memory color filter 84 transmits light having a wavelength greater than or equal to a predetermined wavelength in the visible light band, and blocks light having a wavelength shorter than such wavelength. The memory color filter 84 is formed from an organic material, and can be composed of, for example, a color resist based on a pigment, a transmissive resist formed using a nanoimprint technique, a gelatin film, or the like. The memory color filter 84 is provided so as to cover the entire formation region of the nonvolatile memory 60. As the memory color filter 84, at least one of the yellow filter 12Y, the red filter 12R, the green filter 12G, and the blue filter 12B can be used. The yellow filter 12Y, the red filter 12R, the green filter 12G, and the blue filter 12B each cut light in a wavelength band of less than 400 nm. Therefore, the ultraviolet light can be blocked by using at least one of the yellow filter 12Y, the red filter 12R, the green filter 12G, and the blue filter 12B for the memory color filter 84.

As shown in FIG. 9, the memory color filter 84 is provided in the infrared cut filter 13 similar to the color filter 80. In other words, the infrared cut filter 13 is provided so as to cover the entire memory color filter 84 and the color filter 80.

Information for adjusting the sensitivities of the light receiving elements 11Y, 11R, 11G, 11B, 21IR, 11C of the light receiving pixels 10Y, 10R, 10G, 10B, 2018, 10C is stored in the nonvolatile memory 60. Hereinafter, a method for adjusting the sensitivity will be described.

The method for adjusting the sensitivity of each light receiving element 11Y, 11R, 11G, 11B, 21IR, 11C includes an output signal acquiring step and a detection time adjusting step.

In the output signal acquiring step, the light receiving unit 10 is irradiated with visible light of a light intensity set in advance. At this time, the conversion unit 30 outputs the output signal of each light receiving element 11Y, 11R, 11G, 11B, 21IR, 11C to the calculating unit 40 based on the photocurrent generated in each light receiving element 11Y, 11R, 11G, 11B, 21IR, 11C. The magnitude of the output signal corresponding to the photocurrent of each light receiving element 11Y, 11R, 11G, 11B, 21IR, 11C is detected as the magnitude of the output signal in a predetermined detection time of each light receiving element 11Y, 11R, 11G, 11B, 21IR, 11C irradiated with the visible light.

In the detection time adjusting step, whether or not each of the output signals of the light receiving elements 11Y, 11R, 11G, 11B, 21IR, 11C is within a preset predetermined range is determined. The predetermined range is a range for determining that the sensitivity of each light receiving element 11Y, 11R, 11G, 11B, 21IR, 11C is appropriate, and is set by test or the like.

The detection time of the light receiving element is made long for the light receiving element smaller than a lower limit value of the predetermined range of the output signals of the light receiving elements 11Y, 11R, 11G, 11B, 21IR, 11C, and the detection time of the light receiving element is made short for the light receiving element greater than an upper limit value of the predetermined range of the output signals of the light receiving elements 11Y, 11R, 11G, 11B, 21IR, 11C. Therefore, whether or not the output signal is within the predetermined range is individually determined for each of the light receiving elements 11Y, 11R, 11G, 11B, 21IR, 11C, and the detection time is adjusted so that the output signal of the light receiving element outside the predetermined range falls within the predetermined range.

The detection times of the light receiving elements 11Y, 11R, 11G, 11B, 21IR, 11C are stored in the nonvolatile memory 60 as information for adjusting the sensitivities of the light receiving elements 11Y, 11R, 11G, 11B, 21IR, 11C.

Method for Adjusting Bias Voltage Applied to Light Receiving Element

A method for adjusting the bias voltage applied to each light receiving element 11Y, 11R, 11G, 11B, 21IR and 11C of the light receiving unit 10 will be described with reference to FIGS. 10 to 13.

In the configuration in which each light receiving element 11Y, 11R, 11G, 11B, 21IR, 11C is reversely connected to the conversion unit 30, the frequency characteristic can be improved by increasing the cutoff frequency, and the upper limit of the linearity of the photocurrent with respect to the incident light amount can be raised, but leakage current easily generates in each light receiving element 11Y, 11R, 11G, 11B, 21IR, 11C. Such a leakage current adversely affects the output signal of the conversion unit 30, which causes lowering of the detection accuracy of the optical sensor 1.

Furthermore, each light receiving element 11Y, 11R, 11G, 11B, 21IR, 11C which is a photodiode has a characteristic that the leakage current tends to increase as the temperature of each light receiving element 11Y, 11R, 11G, 11B, 21IR, 11C becomes higher. Moreover, the magnitude of the leakage current changes according to the bias voltage applied to each of the light receiving elements 11Y, 11R, 11G, 11B, 21IR, 11C.

Figure 10:
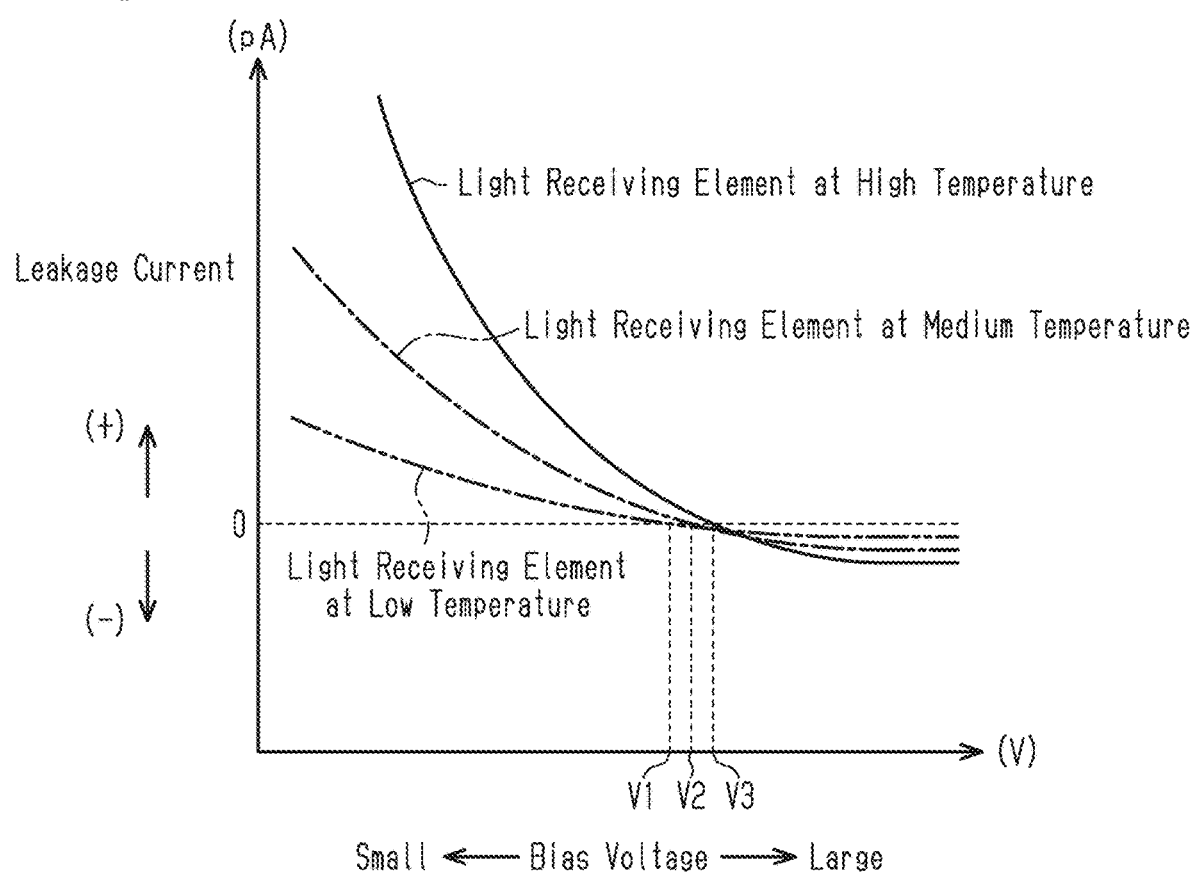
FIG. 10 is a graph showing the relationship between a bias voltage and a leakage current in the light receiving element.

FIG. 10 shows a relationship between the bias voltage applied to the light receiving element and the leakage current when the light receiving element is at high temperature, medium temperature, and low temperature. The medium temperature indicates an intermediate temperature between the high temperature and the low temperature. When the light receiving element is at high temperature, medium temperature, and low temperature, respectively, the absolute value of the leakage current increases as the bias voltage decreases in the range of the bias voltage at which the leakage current has a positive value, and the absolute value of the leakage current increases as the bias voltage increases in the range of the bias voltage at which the leakage current has a negative value. As shown in FIG. 10, the changing tendency of the leakage current with respect to the bias voltage differs for when the light receiving element is at high temperature, medium temperature, and low temperature. When the light receiving element is at low temperature, the leakage current is unlikely to change with respect to the bias voltage, and when the light receiving element is at high temperature, the leakage current is most likely to change with respect to the bias voltage. That is, the rate of change of the leakage current with respect to the change in the bias voltage is the smallest when the light receiving element is at low temperature, and the rate of change of the leakage current with respect to the change in the bias voltage is the largest when the light receiving element is at high temperature.

Furthermore, the bias voltages of when the leakage current becomes 0 at the high temperature, medium temperature, and low temperature of the light receiving element are different from each other. More specifically, as the temperature of the light receiving element increases, the bias voltage when the leakage current becomes 0 increases. Moreover, the direction in which the leakage current flows changes depending on the magnitude of the bias voltage. Thus, when the light receiving element is at low temperature, the leakage current becomes 0 when the bias voltage is V1, the leakage current becomes a positive value when the bias voltage is less than V1, and the leakage current becomes a negative value when the bias voltage is greater than V1. When the light receiving element is at medium temperature, the leakage current becomes 0 when the bias voltage is V2 (V2>V1), the leakage current becomes a positive value when the bias voltage is less than V2, and the leakage current becomes a negative value when the bias voltage is greater than V2. When the light receiving element is at high temperature, the leakage current becomes 0 when the bias voltage is V3 (V3>V2), the leakage current becomes a positive value when the bias voltage is less than V3, and the leakage current becomes a negative value when the bias voltage is greater than V3. In addition, when the light receiving element is at high temperature, medium temperature, and low temperature, respectively, the rate of change of the leakage current with respect to the change in the bias voltage in the range of the bias voltage where the leakage current becomes a positive value is greater than the rate of change of the leakage current with respect to the change in the bias voltage in the range of the bias voltage where the leakage current becomes a negative value. In other words, the variation in the magnitude of the leakage current caused by the variation in the bias voltage when the leakage current is a positive value becomes greater than the variation in the magnitude of the leakage current caused by the variation in the bias voltage when the leakage current is a negative value.

Figure 11:
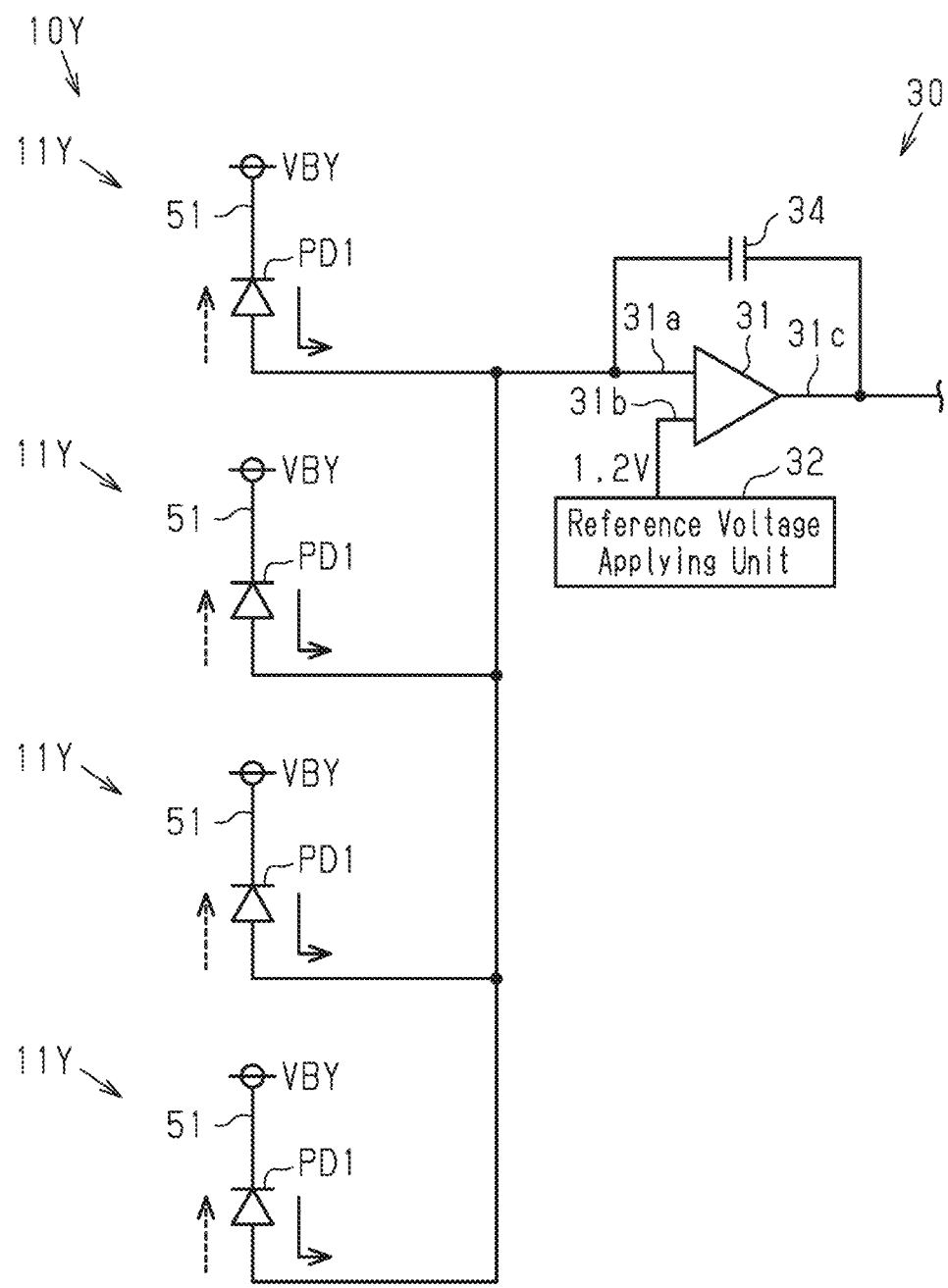
FIG. 11 is a circuit diagram schematically showing a circuit configuration of a yellow light receiving pixel.

FIG. 11 schematically shows the circuit configuration of the yellow light receiving pixel 10Y as an example.

The adjustment of the bias voltage VBY of the yellow light receiving pixel 10Y is performed by an adjustment device (not shown). The adjustment device measures the electrical characteristics of the yellow light receiving pixel 10Y. The adjustment device adjusts the bias voltage VBY to apply to the first light receiving element 11Y (photodiode) of the yellow light receiving pixel 10Y based on the measurement result.

Figure 12:
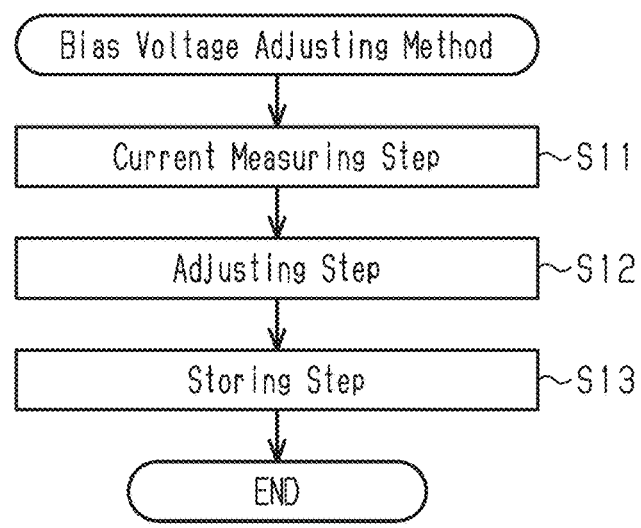
FIG. 12 is a flowchart showing the procedure of a method for adjusting the bias voltage of the light receiving element.

As shown in FIG. 12, a method for adjusting the bias voltage VBY of the yellow light receiving pixel 10Y includes a current measuring step (step S11), an adjusting step (step S12), and a storing step (step S13).

In the current measuring step, the adjustment device measures the leakage current of the first light receiving element 11Y when the bias voltage VBY is the reference voltage (1.2 V). More specifically, as shown in FIG. 11, the adjustment device applies the bias voltage VBY having the same voltage as the reference voltage (1.2 V) to apply to the second input terminal 31b of the amplifier 31 to each of the four first light receiving elements 11Y. The reference voltage (1.2 V) is applied to the second input terminal 31b of the amplifier 31 by the reference voltage applying unit 32. Then, the adjustment device measures the leakage current flowing through each of the four first light receiving elements 11Y. The adjustment device measures the leakage current in the direction (first direction) flowing from the first light receiving element 11Y toward the first input terminal 31a as a negative value, and measures the leakage current flowing in a second direction, which is the direction opposite to the first direction, as a positive value.

In the adjusting step, the adjustment device adjusts the bias voltage VBY of each of the four first light receiving elements 11Y such that the leakage current after the leakage currents of the four first light receiving elements 11Y are merged together flows to the first input terminal 31a.

Figure 13:
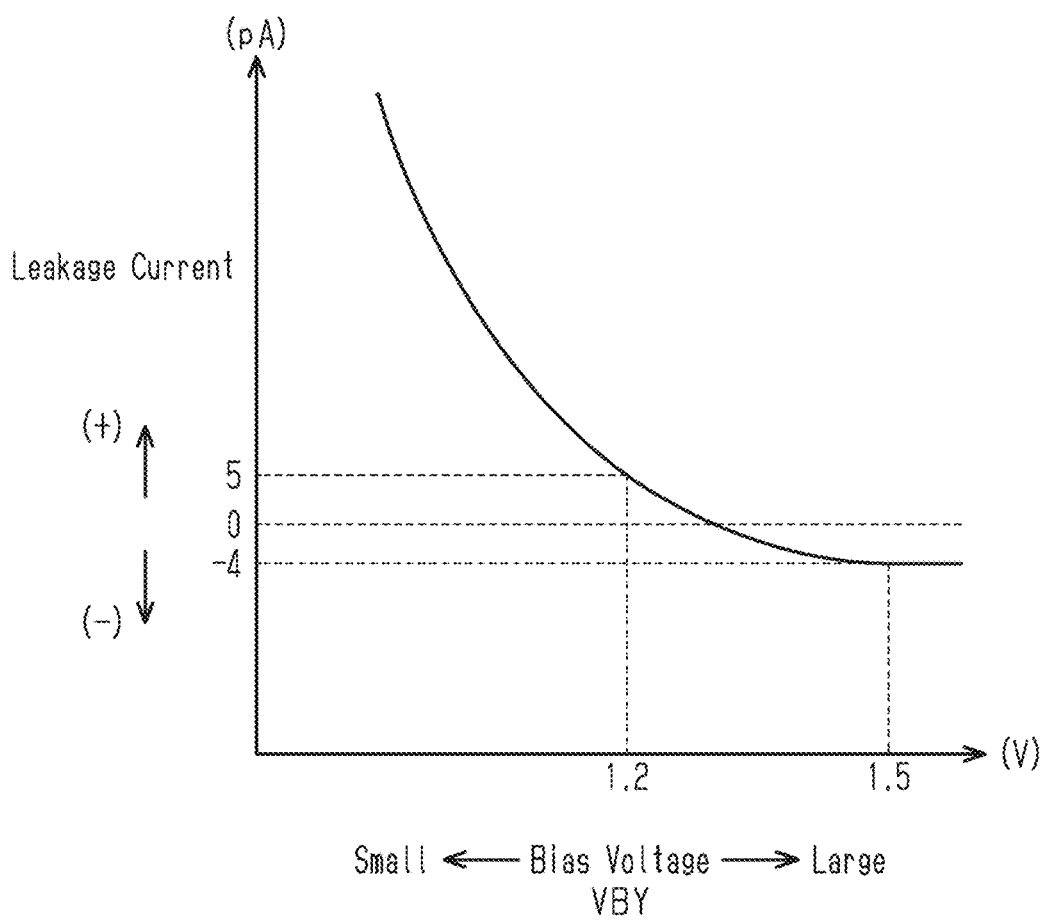
FIG. 13 is a map showing the relationship between the bias voltage and the leakage current in the first light receiving element of the yellow light receiving pixel.

More specifically, the adjustment device stores information (map) indicating the relationship between the leakage current and the bias voltage at the time the first light receiving element 11Y is at high temperature as shown in FIG. 13. The adjustment device uses the map to adjust the bias voltage VBY of the four first light receiving elements 11Y so that the sum of the leakage currents of the four first light receiving elements 11Y measured in the current measuring step is a negative value, that is, after the leakage currents of the four first light receiving elements 11Y are merged, the leakage current flows to the first input terminal 31a of the amplifier 31.

As shown in FIG. 11, in the current measuring step, when measuring a leakage current of, for example, "5 pA" in each of the four first light receiving elements 11Y (broken line arrows in FIG. 11), one of the following two adjustment methods is used to adjust the bias voltage VBY of the first light receiving element 11Y.

The first adjustment method is a method for adjusting the bias voltage VBY so that the leakage current of each of the four first light receiving elements 11Y becomes a negative value. Specifically, the adjustment device adjusts the bias voltage VBY of the first light receiving element 11Y so that the leakage current becomes a predetermined value that is a negative value using the map of FIG. 13. An example of this predetermined value is "−4 pA." An example of the bias voltage VBY when the predetermined value is "−4 pA" is 1.5 V. In this case, the leakage current of "−4 pA" flows to each of the first light receiving elements 11Y (solid arrows in FIG. 11) by applying the bias voltage VBY of 1.5 V to each of the four first light receiving elements 11Y. Therefore, after the leakage currents of the four first light receiving elements 11Y are merged, the leakage current of "−16 pA" flows to the first input terminal 31a of the amplifier 31.

The second adjustment method is a method for adjusting the bias voltage VBY so that the sum of the leakage currents of the four first light receiving elements 11Y becomes a negative value. That is, in the second adjustment method, unlike the first adjustment method, one to three leakage currents among the four first light receiving elements 11Y may be negative values.

Here, similar to the first adjustment method, the adjustment device adjusts the bias voltage VBY of the first light receiving element 11Y so that the leakage current becomes a predetermined value that is a negative value. That is, the adjustment device adjusts the bias voltage VBY to 1.5 V so that the leakage current of the first light receiving element 11Y becomes "−4 pA." In this case, the leakage current after the leakage currents of the four first light receiving elements 11Y are merged becomes a negative value if the adjustment device adjusts the bias voltage VBY of the three first light receiving elements 11Y. Specifically, the sum "−12 pA (−4 pA×3)" of the leakage currents of the three first light receiving elements 11Y, which bias voltage VBY has been adjusted to 1.5 V, and the sum of the leakage current (5 pA) of one first light receiving element 11Y, which bias voltage VBY is remained at 1.2 V, is "−7 pA." That is, after the leakage currents of the four first light receiving elements 11Y are merged, the leakage current of 7 pA flows to the first input terminal 31a of the amplifier 31.

In the second adjustment method, the number of the first light receiving elements 11Y to adjust the bias voltage VBY may be changed by the measurement result of the leakage current in the current measuring step and the setting of the bias voltage VBY to apply to the first light receiving element 11Y. For example, when the leakage current of each of the four first light receiving elements 11Y is 2 pA in the current measuring step, the number of first light receiving elements 11Y to adjust the bias voltage VBY, that is, the number of the first light receiving elements 11Y in which the leakage current flowing to the first light receiving element 11Y is "−4 pA" merely needs to be at least two. As the bias voltage VBY is adjusted so that the leakage currents of the two first light receiving elements 11Y become "−4 pA," the leakage current of 4 pA flows to the first input terminal 31a of the amplifier 31 after the leakage currents of each of the four first light receiving elements 11Y are merged. For example, when the adjustment device adjusts the bias voltage VBY so that the leakage current of the first light receiving element 11Y becomes "−6 pA," the number of first light receiving elements 11Y to adjust the bias voltage VBY merely needs to be at least two. That is, as the bias voltage VBY is adjusted so that the leakage currents of the two first light receiving elements 11Y become "−6 pA," the leakage current of 4 pA flows to the first input terminal 31a of the amplifier 31 after the leakage currents of each of the four first light receiving elements 11Y are merged.

Furthermore, in the current measuring step, when all the leakage currents of the four first light receiving elements 11Y are negative values, the leakage current flows to the first input terminal 31a of the amplifier 31 after the leakage currents of each of the four first light receiving elements 11Y are merged even without adjusting the bias voltage VBY of the first light receiving element 11Y, and thus the adjusting step may be omitted.

In the storing step, the adjustment device stores each value of the bias voltage VBY to apply to the four first light receiving elements 11Y in the nonvolatile memory 60 (see FIG. 1). The voltage generating unit 50 thereby applies the bias voltage VBY to the four first light receiving elements 11Y based on the bias voltage stored in the nonvolatile memory 60.

As for the second light receiving element 11R as well, the bias voltage VBR to apply to the second light receiving element 11R can be adjusted similar to the first light receiving element 11Y. Furthermore, for the third light receiving element 11G, the bias voltage VBG to apply to the third light receiving element 11G can be adjusted similar to the first light receiving element 11Y. Moreover, for the fourth light receiving element 11B as well, the bias voltage VBB to apply to the fourth light receiving element 11B can be adjusted similar to the first light receiving element 11Y. In addition, for the fifth light receiving element 21IR of the first infrared light receiving pixel 22IR and the fifth light receiving element 21IR of the second infrared light receiving pixel 23IR, the bias voltages VBIR1, VBIR2 to apply to the fifth light receiving element 21IR can be adjusted similar to the first light receiving element 11Y.

Calculation of Intensity of Visible Light

Next, the calculation of the intensity of visible light in the yellow wavelength band will be described.

As described above, the calculating unit 40 calculates the intensity Yx of the visible light in the yellow wavelength band by Yx=Y−R1. The calculating unit 40 similarly calculates the intensity of the visible light in the red wavelength band, the intensity of the visible light in the green wavelength band, and the intensity of the visible light in the blue wavelength band. That is, the calculating unit 40 calculates the intensity of the visible light in the red wavelength band based on the output signal R1 of the red light receiving pixel 10R and the output signal R2 of the first infrared light receiving pixel 22IR. The calculating unit 40 calculates the intensity of the visible light having the green wavelength based on the output signal G1 of the green light receiving pixel 10G and the output signal G2 of the first infrared light receiving pixel 22IR. The calculating unit 40 calculates the intensity of the visible light having the blue wavelength based on the output signal B1 of the blue light receiving pixel 10B and the output signal B2 of the second infrared light receiving pixel 23IR.

Therefore, in a case where the first light receiving element 11Y corresponds to a first band light receiving element for detecting the light in the first wavelength band, the second light receiving element 11R corresponds to a second band light receiving element for detecting the light in the second wavelength band. Furthermore, in a case where the second light receiving element 11R corresponds to the first band light receiving element, the fifth light receiving element 21IR of the first infrared light receiving pixel 22IR corresponds to the second band light receiving element. In a case where the third light receiving element 11G corresponds to the first band light receiving element, the fifth light receiving element 21IR of the first infrared light receiving pixel 22IR corresponds to the second band light receiving element. In a case where the fourth light receiving element 11B corresponds to the first band light receiving element, the fifth light receiving element 21IR of the second infrared light receiving pixel 23IR corresponds to the second band light receiving element. The calculating unit 40 carries out the calculation based on the output signal of the amplifier 31 (first amplifier), in which the anode of the first band light receiving element is connected to the first input terminal 31a, and the output signal of the amplifier 31 (second amplifier), in which the anode of the second band light receiving element is connected to the first input terminal 31a. More specifically, the calculating unit 40 calculates the intensity of the visible light on the basis of a difference between the output signal of the conversion unit 30 based on the output signal of the first amplifier and the output signal of the conversion unit 30 based on the output signal of the second amplifier.

In a case where a leakage current occurs in the first light receiving element 11Y and the second light receiving element 11R, the output signals Y, R1 include noise caused by the influence of leakage current. Thus, the intensity Yx of the visible light in the yellow wavelength band may not be accurately calculated.

The calculating unit 40 calculates the intensity Yx of the visible light in the yellow wavelength band in consideration of the influence of the leakage current on the output signal. That is, when the influence of the leakage current is α, the calculating unit 40 calculates by Yx=(Y+α)−(R1+α). Here, as described above, since the bias voltages VBY and VBR are adjusted so that the positive and negative signs of the leakage currents of the light receiving elements 11Y and 11R are equalized, the influence α of the leakage current with respect to the output signal is canceled in the calculation of the intensity Yx of the visible light in the yellow wavelength band, as can be seen from the above equation.

The operations of the present embodiment will now be described.

In the present embodiment, in order to enhance the detection accuracy of the optical sensor 1, two countermeasures, a first countermeasure of detecting the intensity Yx of the visible light in the yellow wavelength band and a second countermeasure of reducing the influence α of the leakage current of the light receiving unit 10 are performed.

First, the operation in the first countermeasure will be described.

Figure 14:
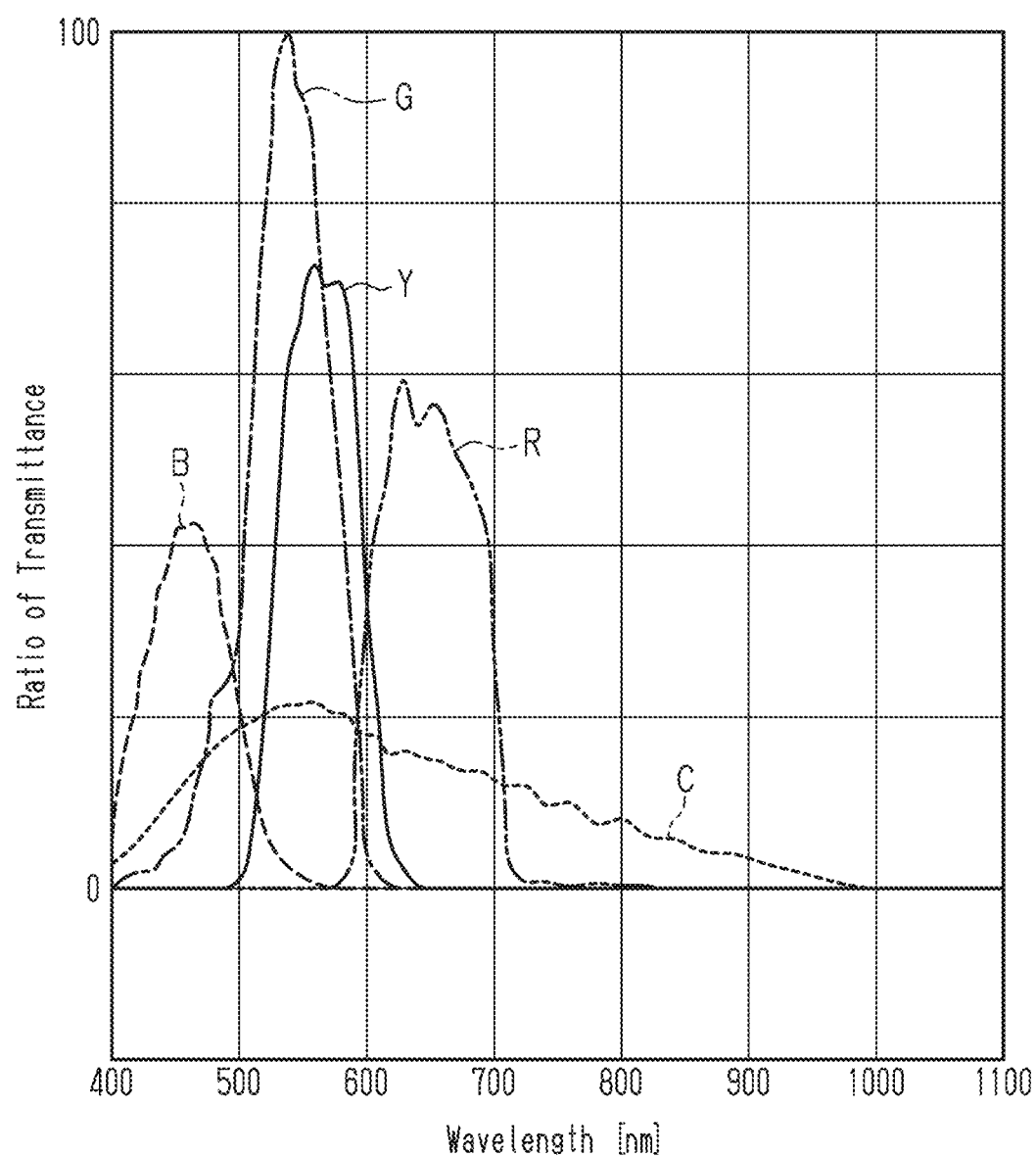
FIG. 14 is a diagram illustrating the operation of the first embodiment with a graph showing the relationship between the wavelength and the ratio of transmittance.
Figure 15:
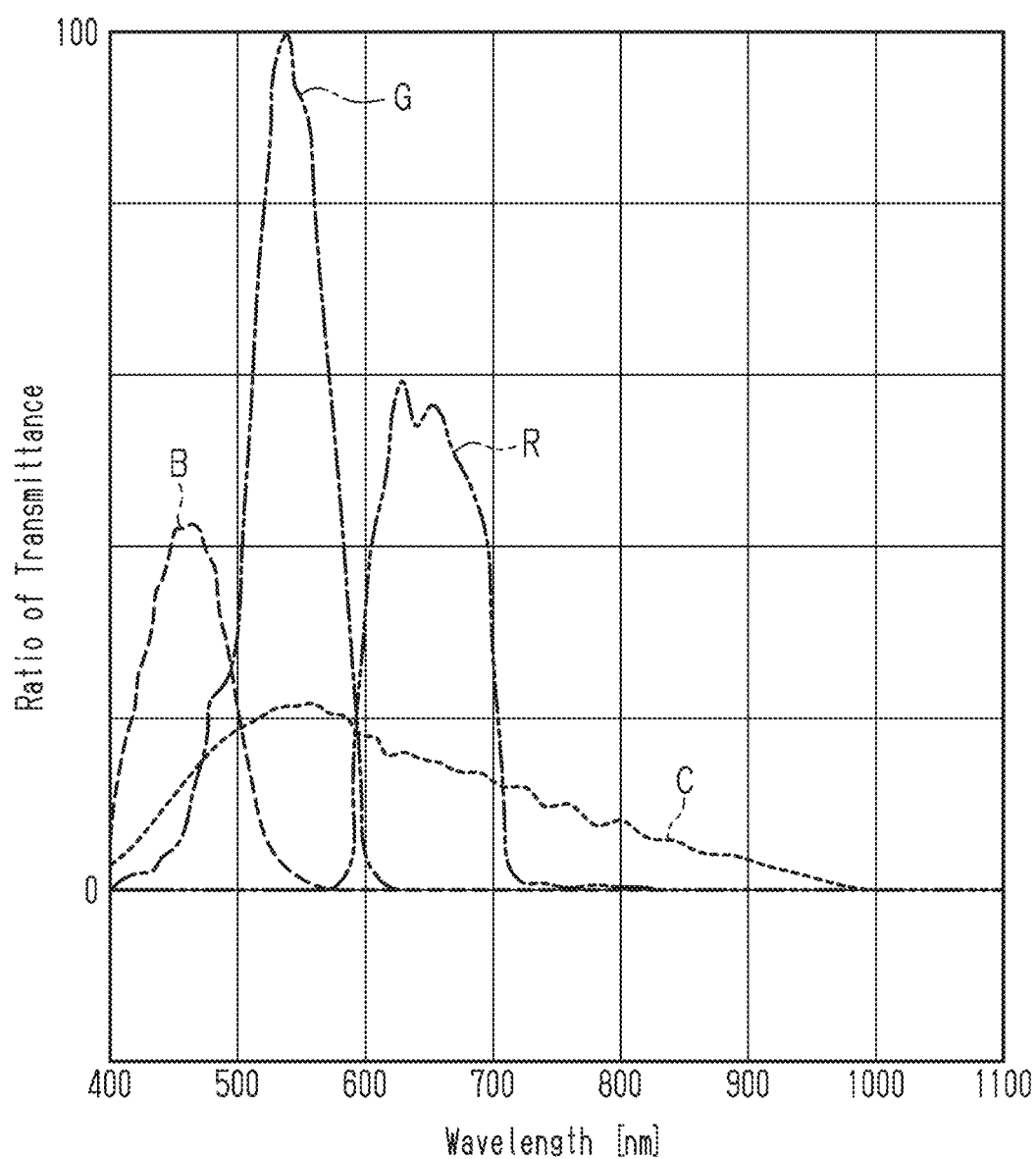
FIG. 15 is a graph showing the relationship between the wavelength and the ratio of transmittance of a comparative example.

FIG. 14 shows a spectral sensitivity curve of the optical sensor 1 of the present embodiment, and FIG. 15 shows a spectral sensitivity curve of an optical sensor of a comparative example. The optical sensor of the comparative example does not have the yellow light receiving pixel 10Y and does not detect the intensity of the visible light in the yellow wavelength band.

As can be seen from the spectral sensitivity curve in FIG. 15, the ratio of the transmittance in the wavelength band (around 600 nm) between the spectral sensitivity curve of green visible light and the spectral sensitivity curve of red visible light, that is, the yellow wavelength band is small. In other words, in the optical sensor of the comparative example, the detection accuracy of the yellow wavelength band is low.

As can be seen from the spectral sensitivity curve in FIG. 14, as a spectral sensitivity curve of the yellow visible light is added, the ratio of the transmittance in the yellow wavelength band becomes larger than the spectral sensitivity curve in FIG. 15. In other words, in the optical sensor 1 of the present embodiment, the color detection accuracy of the yellow wavelength band becomes higher than that of the optical sensor of the comparative example.

Next, the operation in the second countermeasure will be described.

With respect to the first light receiving element 11Y and the second light receiving element 11R, the bias voltages applied to the first light receiving element 11Y and the second light receiving element 11R are adjusted so that the leakage current flows through the first input terminal 31a of the amplifier 31. In one example, the bias voltages VBY and VBR applied to the first light receiving element 11Y and the second light receiving element 11R are set to be higher than the reference voltage applied to the second input terminal 31b of the amplifier 31.

The intensity Yx of yellow visible light is calculated based on the difference between the output signal of the first light receiving element 11Y and the output signal of the second light receiving element 11R, as calculated by Y−R1. Therefore, if the directions of the leakage currents of the first light receiving element 11Y and the second light receiving element 11R are aligned in advance, the influence α of the leakage current is canceled at the time of calculating the intensity of the visible light.

The present embodiment has the following advantages.

The light receiving unit 10 of the optical sensor 1 includes the yellow light receiving pixel 10Y apart from the red light receiving pixel 10R, the green light receiving pixel 10G, and the blue light receiving pixel 10B of the three primary colors. The visible light in the yellow wavelength band, which is the wavelength band at the boundary of the green color and the red color, thus can be detected. Therefore, the detection accuracy of the optical sensor 1 can be enhanced.

Specifically, the inventors of the present invention found that the sensitivity of the visible light in the yellow wavelength band is low and the detection error of the yellow visible light is large with only the red light receiving pixel 10R, the green light receiving pixel 10G, and the blue light receiving pixel 10B of the three primary colors.

In this regard, according to the present embodiment, the detection accuracy of the visible light in the yellow wavelength band can be enhanced, and furthermore the color detection accuracy of the optical sensor 1 can be enhanced as the light receiving unit 10 includes the yellow light receiving pixel 10Y.

(1-2) The yellow filter 12Y of the yellow light receiving pixel 10Y transmits light having a wavelength greater than or equal to the yellow wavelength, and blocks (attenuates) light having a wavelength shorter than such wavelength. In this case, since the red wavelength is longer than the yellow wavelength and the yellow visible light also includes light having the red wavelength, the first light receiving element 11Y receives both of the yellow visible light and the red visible light. Thus, there is a concern that the detection accuracy of yellow may decrease.

In the respect, the calculating unit 40 of the optical sensor 1 of the present embodiment calculates the intensity of the visible light in the yellow wavelength band based on a difference (Y−R1) between the output signal Y obtained from the photocurrent of the first light receiving element 11Y of the yellow light receiving pixel 10Y and the output signal R1 obtained from the photocurrent of the second light receiving element 11R of the red light receiving pixel 10R. According to such a configuration, even if the first light receiving element 11Y detects the light in the yellow wavelength band and the light in the red wavelength band, the optical sensor 1 can accurately detect the light in the yellow wavelength band by selectively excluding or attenuating the light in the red wavelength band of the first light receiving element 11Y in the red wavelength band of the second light receiving element 11R. Therefore, the detection accuracy of yellow in the optical sensor 1 can be enhanced, and furthermore the color detection accuracy of the optical sensor 1 can be enhanced.

(1-3) Since the first light receiving element 11Y and the second light receiving element 11R are arranged adjacent to each other, the variations in the element characteristics of the first light receiving element 11Y and the second light receiving element 11R can be reduced in the manufacturing stage of the light receiving unit 10 of the optical sensor 1. Thus, the variations in the element characteristics of the two light receiving elements 11Y and 11R corresponding to the two output signals Y and R1 to be calculated can be reduced, and the calculating unit 40 can more accurately calculate the light in the yellow wavelength band. In addition, as the first light receiving element 11Y and the second light receiving element 11R are adjacent to each other, the light can be similarly received regardless of the incident angle of the light entering the light receiving unit 10. Therefore, the variations in the light receiving modes of the first light receiving element 11Y and the second light receiving element 11R due to the arrangement position of the light receiving elements can be reduced. Therefore, the color detection accuracy of the optical sensor 1 can be further enhanced.

(1-4) The plurality of first light receiving elements 11Y are arranged to be point symmetric with the center CP of the light receiving region 14 of the light receiving unit 10 as the center of symmetry, and the plurality of second light receiving elements 11R are arranged to be point symmetric with the center CP of the light receiving region 14 serving as the center of symmetry. According to such a configuration, even when light does not uniformly enter the entire light receiving unit 10, the light can be detected with one of the plurality of first light receiving elements 11Y and one of the plurality of second light receiving elements 11R, and thus the reliability of the optical sensor 1 can be enhanced.

(1-5) The plurality of first light receiving elements 11Y are electrically connected to the analog/digital conversion circuit 30a, and the plurality of third light receiving elements 11G are electrically connected to the analog/digital conversion circuit 30b. Furthermore, the plurality of fourth light receiving elements 11B and the plurality of fifth light receiving elements 21IR are connected to the analog/digital conversion circuit 30d through the switching unit, and the plurality of second light receiving elements 11R and the plurality of clear light receiving elements 11C are switched to the analog/digital conversion circuit 30c through the switching unit. Thus, one analog/digital conversion circuit is connected to a plurality of light receiving elements, whereby the configuration of the conversion unit 30 is simplified compared to a configuration in which the analog/digital conversion circuit is connected to each of the plurality of light receiving elements. Therefore, the size of the optical sensor 1 can be reduced. Furthermore, since one analog/digital conversion circuit is connected to two kinds of light receiving elements having different colors, the configuration of the conversion unit 30 is further simplified. Therefore, the size of the optical sensor 1 can be further reduced.

(1-6) The fifth light receiving element 21IR of the first infrared light receiving pixel 22IR is arranged so as to be adjacent to both of the second light receiving element 11R of the red light receiving pixel 10R and the third light receiving element 11G of the green light receiving pixel 10G. According to such a configuration, the second light receiving element 11R, the third light receiving element 11G, and the fifth light receiving element 21IR can similarly receive light regardless of the incident angle of the light entering the light receiving unit. Thus, the variations in the light receiving modes of the second light receiving element 11R, the third light receiving element 11G, and the fifth light receiving element 21IR can be reduced. Therefore, the detection accuracy of the optical sensor 1 can be further enhanced.

In addition, the variations in element characteristics between the fifth light receiving element 21IR and the second light receiving element 11R, and variations in element characteristics between the fifth light receiving element 21IR and the third light receiving element 11G can be reduced. Therefore, the calculating unit 40 can accurately calculate the intensity of the visible light in the red wavelength band and the intensity of the visible light in the green wavelength band, respectively.

(1-7) The optical sensor 1 includes the nonvolatile memory 60 for storing information for adjusting the sensitivity of each of the light receiving elements 11Y, 11R, 11G, 11B, 11C, 21IR, and the blocking layer 83 provided so as to overlap with the nonvolatile memory 60 in the orthogonal direction Z to block the ultraviolet light. According to such a configuration, the variations in the element characteristics of each of the light receiving elements 11Y, 11R, 11G, 11B, 11C, 21IR can be reduced by adjusting the sensitivity of each of the light receiving elements 11Y, 11R, 11G, 11B, 11C, 21IR based on the information stored in the nonvolatile memory 60. Therefore, the detection accuracy of the optical sensor 1 can be enhanced.

When the nonvolatile memory 60 is irradiated with ultraviolet light, the information stored in the nonvolatile memory 60 may disappear. In regard to this, the optical sensor 1 of the present embodiment can prevent the information stored in the nonvolatile memory 60 from disappearing by blocking the ultraviolet light included in the light irradiated toward the nonvolatile memory 60 with the blocking layer 83.

(1-8) The optical sensor 1 includes the memory color filter 84 provided so as to overlap the nonvolatile memory 60 in the orthogonal direction Z. According to such a configuration, the light entering the nonvolatile memory 60 transmits through the memory color filter 84 before entering the nonvolatile memory 60. At this time, the ultraviolet light is blocked by the memory color filter 84. Therefore, the influence of the ultraviolet light on the nonvolatile memory 60 can be further reduced.

(1-9) The memory color filter 84 is provided in the blocking layer 83. According to such a configuration, leakage of the organic material forming the memory color filter 84 to the outside of the blocking layer 83 formed from an inorganic material is limited. Therefore, contamination by the organic material with respect to the semiconductor substrate 70 forming the light receiving unit 10 can be reduced in the manufacturing stage of the optical sensor 1.

(1-10) The bias voltages VBY, VBR to apply to the first light receiving element 11Y and the second light receiving element 11R are higher than the reference voltage applied to the second input terminal 31b of the amplifier 31, respectively. According to such a configuration, since the influence of the leakage current on the photo current generated in the first light receiving element 11Y and the second light receiving element 11R is reduced, the offset of the amplifier 31 becomes small. Therefore, since the lowering of the accuracy of the output signal of the amplifier 31 can be limited, the detection accuracy of the optical sensor 1 can be enhanced.

(1-11) The bias voltages VBY, VBR to apply to the first light receiving element 11Y and the second light receiving element 11R are adjusted so that the leakage current has a negative value. According to such a configuration, when calculating the intensity of the visible light by the calculating unit 40, the intensity is calculated based on the difference between the output signals of the two light receiving elements. Therefore, if the positive and negative signs of the influence α of the leakage current included in the output signal of the light receiving element are equalized, the influence α of the leakage current is canceled when calculating the difference between the output signals of the two light receiving elements. Therefore, since the influence of the leakage current in the output signal of the amplifier 31 is reduced, the detection accuracy of the optical sensor 1 can be enhanced.

(1-12) The yellow light receiving pixel 10Y has a configuration in which the four first light receiving elements 11Y are connected in parallel. The bias voltage VBY of each of the four first light receiving elements 11Y is adjusted so that the leakage current after the leakage currents of the four first light receiving elements 11Y are merged flows to the first input terminal 31a of the amplifier 31. The red light receiving pixel 10R has a configuration in which the four second light receiving elements 11R are connected in parallel. The bias voltage VBR of each of the four second light receiving elements 11R is adjusted so that the leakage current after the leakage currents of the four second light receiving elements 11R flows to the first input terminal 31a of the amplifier 31. According to the configuration, when calculating the intensity Yx of the yellow visible light by the calculating unit 40, the intensity is calculated based on the difference between the output signal of the first light receiving element 11Y and the output signal of the second light receiving element 11R. Therefore, if the positive and negative signs of the influence α of the leakage current included in the output signal of the first light receiving element 11Y and the influence α of the leakage current included in the output signal of the second light receiving element 11R are equalized, the influence α of the leakage current is canceled out when calculating the intensity Yx of the yellow visible light. Therefore, the influence of the leakage current in the output signal of the amplifier 31 is reduced, so that the detection accuracy of the yellow visible light of the optical sensor 1 can be enhanced.

(1-13) In the adjusting step of adjusting the bias voltages VBY, VBR to apply to the first light receiving element 11Y and the second light receiving element 11R, a map showing the relationship between the leakage current and the bias voltage is used. According to such a configuration, the bias voltages VBY, VBR in which the leakage current becomes negative can be easily acquired. Therefore, the work in the adjusting step is facilitated.

Second Embodiment

The optical sensor 1 of a second embodiment will be described with reference to FIGS. 16 and 17. The optical sensor 1 of the present embodiment differs from the optical sensor 1 of the first embodiment in the method for adjusting the bias voltages of the light receiving elements 11Y, 11R, 11G, 11B, 21IR. Same reference numerals are given to those components that are the same as the corresponding components of the first embodiment. Such components will not be described in detail.

Figure 16:
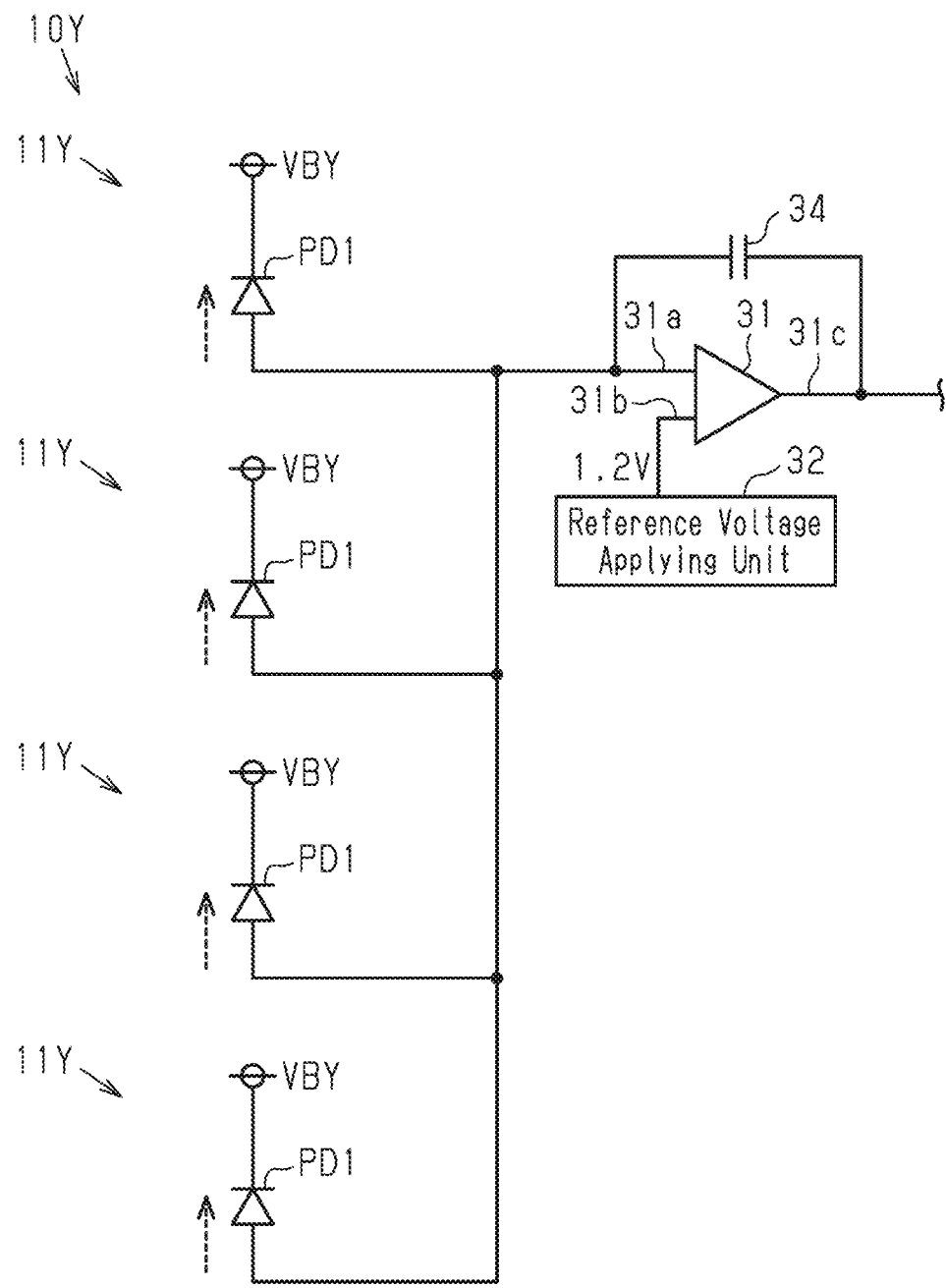
FIG. 16 is a circuit diagram schematically showing a circuit configuration of a yellow light receiving pixel in an optical sensor according to a second embodiment.

FIG. 16 schematically shows the circuit configuration of the yellow light receiving pixel 10Y as an example. FIG. 17 shows the case where the leakage current of the yellow light receiving pixel 10Y of when the bias voltage applied to each light receiving pixel 10Y is 1.2 V is a positive value (broken line arrow in FIG. 16) in the current measuring step. In the current measuring step, the leakage current of the yellow light receiving pixel 10Y of when the bias voltage is 1.2 V is set to "Iy."

In the present embodiment, at least one bias voltage VBY of the four first light receiving elements 11Y is adjusted so that the leakage current after the leakage currents of the four first light receiving elements 11Y are merged becomes 0 or approaches 0 in the adjusting step.

Figure 17:
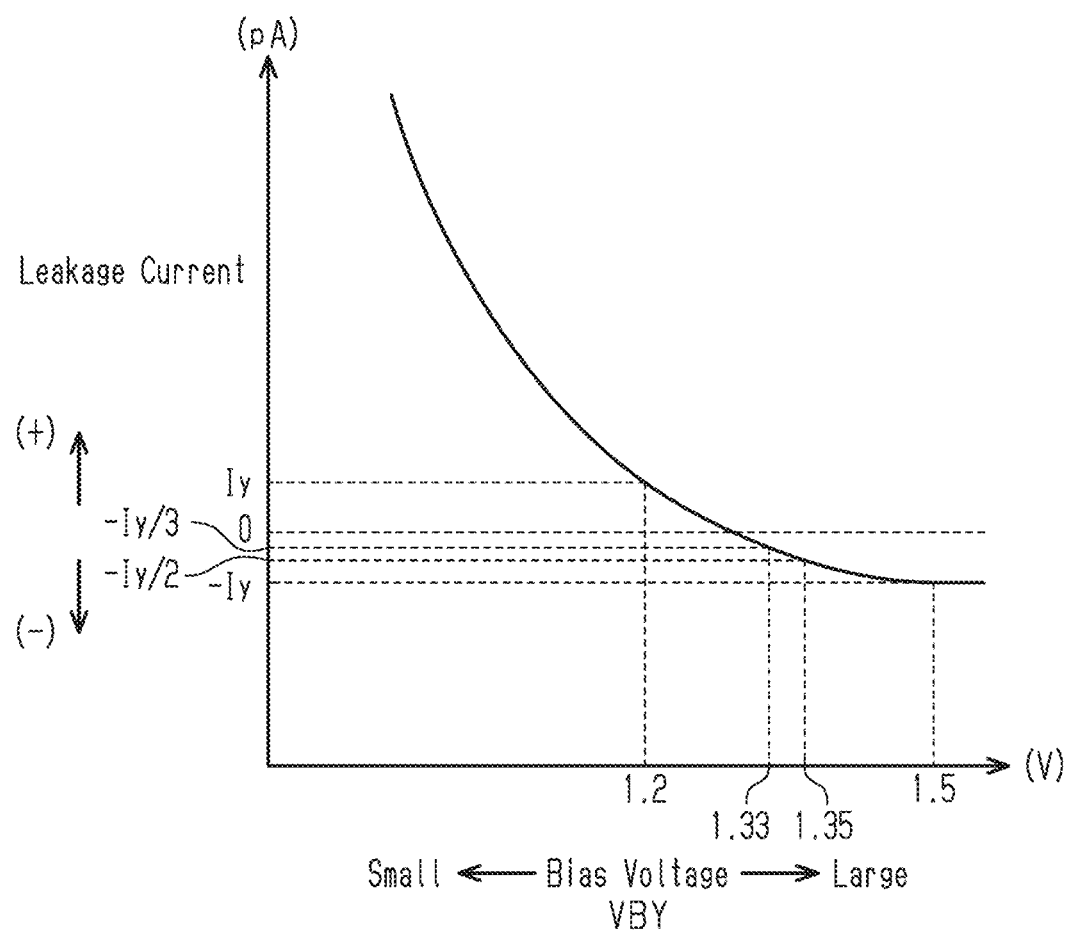
FIG. 17 is a map showing the relationship between the bias voltage and the leakage current in the first light receiving element of the yellow light receiving pixel.

In the adjustment device, a map showing the relationship between the bias voltage VBY and the leakage current in the yellow light receiving pixel 10Y at the time the first light receiving element 11Y is at high temperature as shown in FIG. 17 is stored. The adjustment device calculates the bias voltage at which the leakage current of the first light receiving element 11Y of the two yellow light receiving pixels 10Y among the four yellow light receiving pixels 10Y becomes "−Iy" using the map of FIG. 17. In the present embodiment, the bias voltage at which the leakage current of the first light receiving element 11Y becomes "−Iy" is 1.5 V. Then, the adjustment device stores the calculated bias voltage in the nonvolatile memory 60. Since the leakage currents of the two yellow light receiving pixels 10Y of the four yellow light receiving pixels 10Y become Iy and the leakage currents of the remaining two yellow light receiving pixels 10Y become "−Iy," the current value of when the leakage currents of the four yellow light receiving pixels 10Y are merged becomes zero.

Similarly to the yellow light receiving pixel 10y, the adjustment device calculates the bias voltages VBR, VBG, VBB, VBIR1, VBIR2 of the light receiving elements 11R, 11G, 11B, 21IR for the other light receiving pixels 10R, 10G, 10B, 20IR. Then, the adjustment device stores the calculated bias voltages VBR, VBG, VBB, VBIR1, VBIR2 in the nonvolatile memory 60.

Thus, the bias voltages VBY, VBR, VBG, VBB, VBIR1 and VBIR2 are adjusted so that the leakage current after the leakage currents of the four light receiving elements of the light receiving elements 11Y, 11R, 11G, 11B, 21IR are merged becomes zero or approaches zero. As a result, the leakage current is prevented from flowing to the first input terminal 31a of the amplifier 31, or the voltage applied to the first input terminal 31a does not become smaller than the voltage (reference voltage) applied to the second input terminal 31b. Therefore, the occurrence of an offset voltage between the first input terminal 31a and the second input terminal 31b of the amplifier 31 is limited.

Therefore, the influence α itself of the leakage current in the output signals Y, R1, G1, B1, R2, G2, B2 of each color is small or the influence α of the leakage current is eliminated. Therefore, the influence α itself of the leakage current is small with respect to the calculation of the intensity of the visible light of each color, or the influence α of the leakage current is eliminated and the detection accuracy of the optical sensor 1 is enhanced.

As the adjustment device merely needs to be able to adjust the bias voltage VBY so that the sum of the leakage currents of the four first light receiving elements 11Y becomes 0 or approaches 0, the number of first light receiving elements 11Y to adjust the bias voltage VBY is not limited to two. The adjustment device may set in advance the number of first light receiving elements 11Y to adjust the bias voltage VBY, and adjust the bias voltage VBY of the first light receiving element 11Y so that the sum of the leakage currents of the four first light receiving elements 11Y becomes substantially 0 by the set number of first light receiving elements 11Y In the first example, in a case where the adjustment device sets the number of first light receiving elements 11Y to adjust the bias voltage VBY to three, the bias voltage VBY of the three first light receiving elements 11Y is adjusted so that the sum of the leakage currents of the three first light receiving elements 11Y becomes "−Iy" assuming the leakage current of the remaining one first light receiving element 11Y is Iy. For example, the adjustment device sets the bias voltage VBY so that each of the leakage currents of the three first light receiving elements 11Y becomes "−Iy/3." Here, the bias voltage VBY at which each of the leakage currents of the three first light receiving elements 11Y becomes "−Iy/3" is approximately 1.33 V.

Here, the bias voltages VBY of the three first light receiving elements 11Y may not be equal to each other. That is, the adjustment device can individually set the bias voltages VBY of the three first light receiving elements 11Y. For example, the adjustment device sets the bias voltages VBY of the three first light receiving elements 11Y as follows. The adjustment device sets the bias voltage VBY of the first light receiving element 11Y such that the leakage current of the first light receiving element 11Y becomes "−Iy/3." The adjustment device sets the bias voltage VBY of the second first light receiving element 11Y so that the leakage current of the second first light receiving element 11Y becomes zero. The adjustment device sets the bias voltage VBY of the third first light receiving element so that the leakage current of the third first light receiving element 11Y becomes "−2/3Iy." Further, for example, the adjustment device sets the bias voltage VBY so that two leakage currents of the three first light receiving elements 11Y become "−Iy/2," and so that the leakage current of the remaining one first light receiving element 11Y becomes 0. That is, the two bias voltages VBY of the three first light receiving elements 11Y may be equal to each other.

In the second example, in a case where the adjustment device sets the number of first light receiving elements 11Y to adjust the bias voltage VBY to two, the bias voltage VBY of the two first light receiving elements 11Y is adjusted so that the sum of the leakage currents of the two first light receiving elements 11Y becomes "−2Iy" assuming the sum of the leakage currents of the remaining two first light receiving elements 11Y in which the bias voltage VBY is not adjusted is 2Iy. For example, the adjustment device sets the bias voltage VBY so that each of the leakage currents of the two first light receiving elements 11Y becomes "−Iy."

Here, the bias voltages VBY of the two first light receiving elements 11Y may not be equal to each other. That is, the adjustment device can individually set the bias voltage VBY of the two first light receiving elements 11Y. For example, the adjustment device sets the bias voltage VBY for one of the two first light receiving elements 11Y so that the leakage current becomes "−2Iy" and sets the bias voltage VBY for the other first light receiving element so that the leakage current becomes 0. Furthermore, the adjustment device sets the bias voltage VBY for one of the two first light receiving elements 11Y so that the leakage current becomes "−Iy/2," and sets the bias voltage VBY for the other first light receiving element so that the leakage current becomes "−3/2Iy."

In the third example, in a case where the adjustment device sets the number of first light receiving elements 11Y to adjust the bias voltage VBY to one, the bias voltage VBY is set so that the leakage current of the first light receiving element 11Y becomes "−3Iy" if the sum of the leakage currents of the remaining two first light receiving elements 11Y in which the bias voltage VBY is not adjusted is 3Iy. The first to third examples can also be applied to the light receiving elements 11R, 11G, 11B, and 21IR.

The present embodiment has the following advantages.

(2-1) The adjustment device adjusts the bias voltage VBY of the four first light receiving elements 11Y so that the leakage current generated in each of the four first light receiving elements 11Y includes the leakage current flowing in the first direction and the leakage current flowing in the second direction. According to such a configuration, the leakage current in the first direction and the leakage current in the second direction canceled out when the leakage currents of the four first light receiving elements 11Y are merged. Thus, the leakage current after the leakage currents of the four first light receiving elements 11Y are merged becomes small. Therefore, since the offset of the amplifier 31 becomes small, the detection accuracy of the optical sensor 1 can be enhanced. The other light receiving elements 11R, 11G, 11B, and 21IR have a configuration similar to the first light receiving element 11Y, and the other bias voltages VBR, VBG, VBB, VBIR1, VBIR2 can be adjusted by the adjustment device similarly to the adjustment of the bias voltage VBY of the first light receiving element 11Y. Therefore, the detection accuracy of the optical sensor 1 can be further enhanced.

(2-2) The adjustment device adjusts the bias voltage VBY of each of the four first light receiving elements 11Y so that the leakage current after the leakage currents generated in the respective four first light receiving elements 11Y are merged becomes zero or approaches 0. According to such a configuration, the offset of the amplifier 31 becomes small. Therefore, the detection accuracy of the optical sensor 1 can be further enhanced. Similar to the adjustment of the bias voltage VBY of the first light receiving element 11Y, the other bias voltages VBR, VBG, VBB, VBIR1, and VBIR2 in the other light receiving elements 11R, 11G, 11B, and 21IR can be adjusted by the adjustment device. Therefore, the detection accuracy of the optical sensor 1 can be further enhanced.

Third Embodiment

The optical sensor 1 of a third embodiment will be described with reference to FIGS. 16 and 18. The optical sensor 1 of the present embodiment differs from the optical sensor 1 of the first embodiment in the method for adjusting the bias voltages VBY, VBR, VBG, VBB, VBIR1, VBIR2 of each of the light receiving elements 11Y, 11R, 11G, 11B, 21IR. Same reference numerals are given to those components that are the same as the corresponding components of the first embodiment. Such components will not be described in detail.

In the present embodiment, a method for adjusting the bias voltage VBY of the yellow light receiving pixel 10Y will be described as an example. The circuit configuration of the yellow light receiving pixel 10Y is the same as the circuit configuration (see FIG. 16) of the yellow light receiving pixel 10Y of the second embodiment.

The method for adjusting the bias voltage VBY according to the present embodiment includes a method for adjusting the bias voltage VBY so that the leakage current of each light receiving element 11Y becomes zero or approaches zero.

Figure 18:
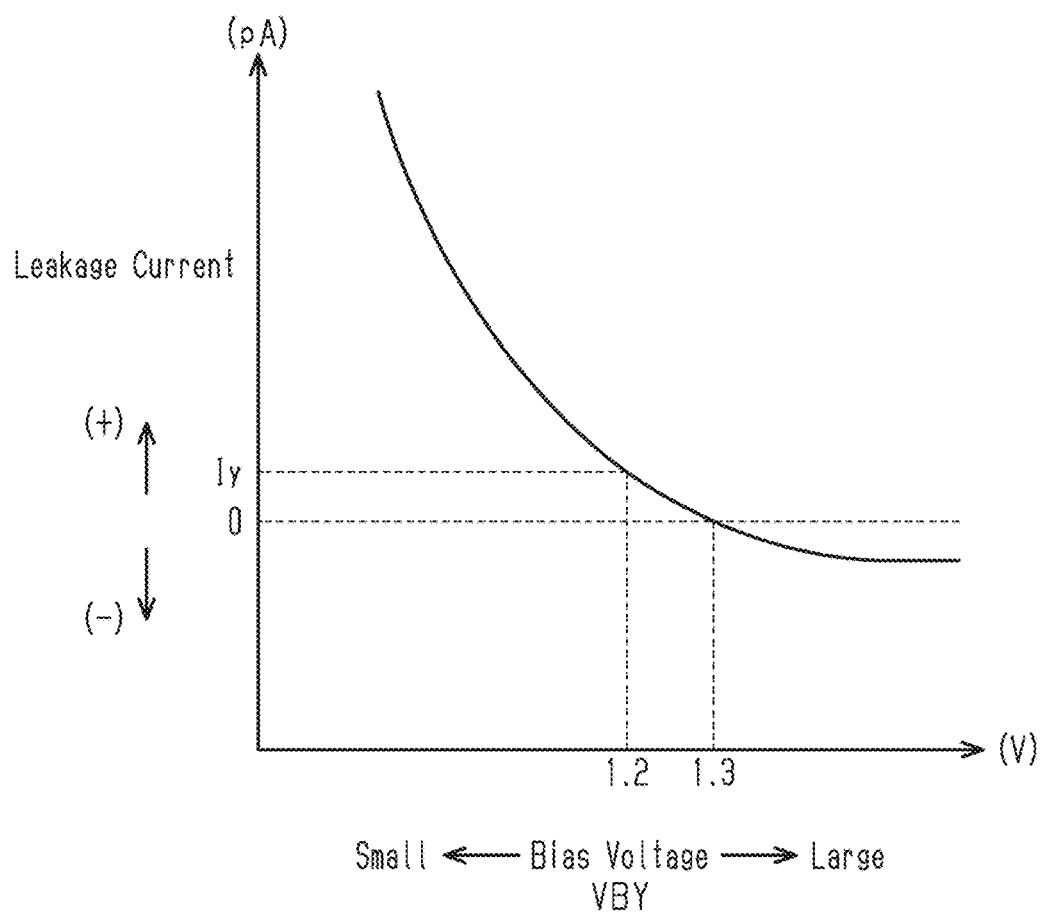
FIG. 18 is a map showing the relationship between a bias voltage and a leakage current in a first light receiving element of a yellow light receiving pixel in an optical sensor according to a third embodiment.

More specifically, in the adjustment device, a map showing the relationship between the bias voltage VBY and the leakage current in the yellow light receiving pixel 10Y at the time the first light receiving element 11Y is at high temperature as shown in FIG. 18 is stored. The adjustment device calculates the bias voltage VBY at which the leakage current of the first light receiving element 11Y of the yellow light receiving pixels 10Y becomes zero using the map of FIG. 18. In the present embodiment, the bias voltage VBY at which the leakage current of the first light receiving element 11Y becomes 0 is 1.3 V. Then, the adjustment device stores the calculated bias voltage in the nonvolatile memory 60. The adjustment device also acquires the bias voltages VBR, VBG, VBB, VBIR1, VBIR2 so that the leakage current becomes zero for the other light receiving pixels 10R, 10G, 10B, 20IR through a similar method. That is, the adjustment device calculates the bias voltage VBR, VBG, VBB, VBIR1, VBIR2 at which the leakage current becomes zero using the map showing the relationship between the bias voltage and the leakage current at the time the light receiving element in in the light receiving elements 11R, 11G, 11B, and 21IR is at high temperature. Then, the adjustment device stores the calculated bias voltages VBR, VBG, VBB, VBIR1, VBIR2 in the nonvolatile memory 60.

Since the bias voltages VBY, VBR, VBG, VBB, VBIR1, and VBIR2 are adjusted so that the leakage currents of the light receiving elements 11Y, 11R, 11G, 11B and 21IR become 0, the leakage current is prevented from flowing to the first input terminal 31a of the amplifier 31, or the voltage applied to the first input terminal 31a is does not from becoming smaller than the voltage (reference voltage) applied to the second input terminal 31b. Therefore, the occurrence of an offset voltage between the first input terminal 31a and the second input terminal 31b of the amplifier 31 is limited.

Therefore, the influence α itself of the leakage current in the output signals Y, R1, G1, B1, R2, G2, B2 of each color is small or the influence α of the leakage current is eliminated. Therefore, the influence α itself of the leakage current is small with respect to the calculation of the intensity of the visible light of each color, or the influence α of the leakage current is eliminated and the detection accuracy of the optical sensor 1 is enhanced.

The present embodiment further has the following advantages.

(3-1) The map showing the relationship between the leakage current and the bias voltage VBY used in the adjusting step is a map at the time the first light receiving element 11Y is at a high temperature. According to such a configuration, even if the bias voltage VBY adjusted in the adjusting step varies, the leakage current can be prevented from becoming excessively large by using the map at the time the first light receiving element 11Y is at a high temperature in which the bias voltage at which the leakage current becomes zero is the largest.

Electronic Device Including Optical Sensor 1

Figure 19:
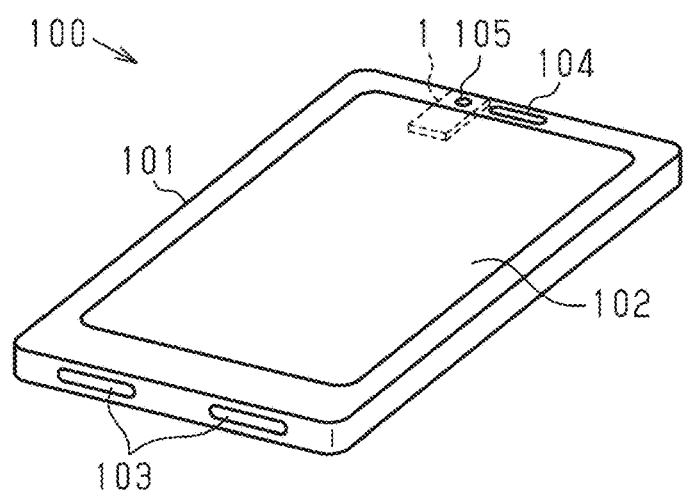
FIG. 19 is a perspective view of a smartphone which is an example of an electronic device on which the optical sensor is mounted.

The optical sensor 1 of each embodiment described above can be mounted on electronic devices such as a smartphone, a mobile phone, a tablet PC, a laptop personal computer, a digital camera, a car navigation device, a television, and the like. FIG. 19 is a perspective view showing an outer appearance of the smartphone 100 which is an example of the electronic device.

The smartphone 100 is configured by accommodating electronic components inside a housing 101 having a flat rectangular parallelepiped shape. The housing 101 has a pair of main surfaces having a rectangular shape on the front side and the back side, and the pair of main surfaces are joined by four side surfaces. A display surface of a display panel 102 configured by a liquid crystal panel, an organic EL panel, or the like is exposed on one main surface of the housing 101. The display surface of the display panel 102 forms a touch panel and provides an input interface to the user.

A microphone 103 is provided on one side surface of the housing 101. The microphone 103 can provide a mouthpiece for a telephone function and can also be used as a microphone for recording. A speaker 104 is arranged in the vicinity of the short side opposite to the side where the microphone 103 is located on the pair of short sides of the display panel 102. The speaker 104 provides an earpiece for a telephone function and is also used as an acoustic unit for reproducing music data and the like. A lens window 105 is arranged next to the speaker 104. The optical sensor 1 is arranged at the position facing the lens window 105 in the housing 101.

As described above, the smartphone 100 includes the optical sensor 1 capable of satisfactorily reducing the sensitivity of the infrared wavelength band, and thus even if the visible light transmittance of the light receiving lens window 105 formed in the smartphone 100 is low, it can be practically used. Therefore, the degree of freedom (change in color, shape, etc.) of the design of the lens window 105 can be widened.

Modified Examples

The description related to each of the above embodiments is merely an example of a form that the optical sensor, the electronic device, the output circuit of the optical sensor, and the method for adjusting the bias voltage of the light receiving element according to the present invention can take, and is not intended to limit the form. The optical sensor, the electronic device, the output circuit of the optical sensor, and the method for adjusting the bias voltage of the light receiving element according to the present invention can be realized not only by the above embodiments, but also by, for example, the following modified examples and a combination of at least two non-contradicting modified examples.

Any one of methods of adjusting the bias voltage applied to the light receiving element of the first to third embodiments may be selectively used for each of the light receiving elements 11Y, 11R, 11G, 11B, and 21IR. For example, a method for adjusting the bias voltage applied to the light receiving element of the first embodiment is used for the first light receiving element 11Y and the fourth light receiving element 11B, a method for adjusting the bias voltage applied to the light receiving element of the second embodiment is used for the second light receiving element 11R and the third light receiving element 11G, and a method for adjusting the bias voltage applied to the light receiving element of the third embodiment is used for the fifth light receiving element 21IR. For example, two adjustment methods out of the bias voltage adjustment methods applied to the light receiving elements of the first to third embodiments may be used. That is, the method for adjusting the bias voltage applied to the light receiving element of the first embodiment or the second embodiment is used for one to four light receiving elements among the light receiving elements 11Y, 11R, 11G, 11B, and 21IR, and the method for adjusting the bias voltage applied to the light receiving element of the third embodiment is used for the remaining light receiving elements of the light receiving elements 11Y, 11R, 11G, 11B, 21IR. In addition, the method for adjusting the bias voltage applied to the light receiving element of the first embodiment is used for one to four light receiving elements among the light receiving elements 11Y, 11R, 11G, 11B, and 21IR, and the method for adjusting the bias voltage applied to the light receiving element of the second embodiment is used for the remaining light receiving elements of the light receiving elements 11Y, 11R, 11G, 11B, 21IR.

In the method for adjusting the bias voltage applied to the light receiving element of each embodiment, a map of the relationship between the bias voltage and the leakage current in any one light receiving element of the light receiving elements 11Y, 1IR, 11G, 11B, 21IR may be applied to other light receiving elements of the light receiving elements 11Y, 11R, 11G, 11B, 21IR. In addition, with the light receiving elements arranged adjacent to each other among the light receiving elements 11Y, 11R, 11G, 11B, and 21IR forming a pair, a map of the relationship between the bias voltage and the leakage current may be commonly applied to the light receiving element forming the pair.

In each embodiment, the number of each of the light receiving elements 11Y, 11R, 11G, 11B, 21IR can be freely changed. For example, in the first and second embodiments, the number of each of the light receiving elements 11Y, 11R, 11G, 11B, 21IR merely needs to in plurals. In the third embodiment, the number of each of the light receiving elements 11Y, 11R, 11G, 11B, 21IR merely needs to be one or more.

Figure 20A:
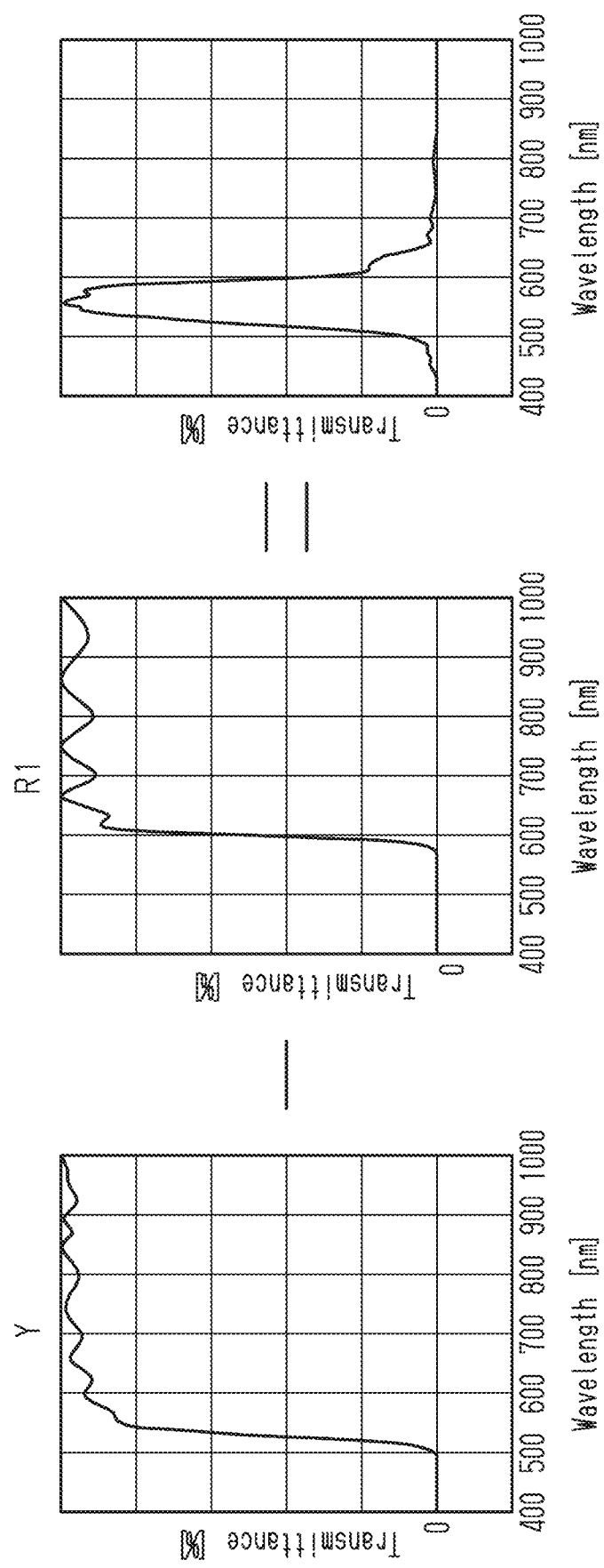
FIG. 20A is a diagram illustrating the calculation of the yellow wavelength band of the yellow light receiving pixel and shows the spectral sensitivity characteristic of the yellow light receiving pixel and the spectral sensitivity characteristic of the red light receiving pixel.

In each embodiment, when the calculating unit 40 calculates the intensity Yx of the visible light in the yellow wavelength band, for example, the output signal Y in the yellow wavelength band and the output signal R1 in the red wavelength band before passing through the infrared cut filter 13 may be used. Specifically, the spectral sensitivity curve of the yellow light receiving pixel 10Y (graph at the left end in FIG. 20A) and the spectral sensitivity curve of the red light receiving pixel 10R (graph at the middle in FIG. 20A) are used. As shown in FIG. 20A, if a mountain-shaped curve having a peak from the red wavelength band to the infrared wavelength band is separated from the spectral sensitivity curve of the yellow light receiving pixel 10Y, the mountain-shaped curve, which can be regarded as originating from yellow, clearly remains.

The output signal Y having a magnitude corresponding to the detection of the yellow light, the red light and the infrared light is input from the yellow light receiving pixel 10Y, and the output signal R1 having a magnitude corresponding to the detection of the red light and the infrared light is input from the red light receiving pixel 10R to the calculating unit 40. Then, the output signal (information) close to the actual yellow light component of the incident light is obtained by selectively eliminating or attenuating the red visible light and the infrared wavelength band portion from the output signal Y of the yellow light receiving pixel 10Y based on the magnitude of the output signal R1 of the red light receiving pixel 10R. That is, when calculating the intensity of the yellow wavelength band as the yellow spectral sensitivity characteristic, the calculating unit 40 calculates the intensity of the visible light in the yellow wavelength band based on the difference between the output signal Y of the first light receiving element 11Y of the yellow light receiving pixel 10Y and the output signal R1 of the second light receiving element 11R of the red light receiving pixel 10R. As a result, the spectral sensitivity characteristic obtained by the separation of the red visible light and the infrared light in the yellow light receiving pixel 10Y is as shown in the graph at the right end of FIG. 20A. In the present embodiment, a part of the infrared light is further filtered (separated) by the infrared cut filter 13, and thus a spectral sensitivity curve having a peak only in the yellow wavelength band as shown in FIG. 20B is ultimately obtained.

In each embodiment, the blocking layer 83 and the infrared cut filter 13 may be separately formed.

Figure 21:
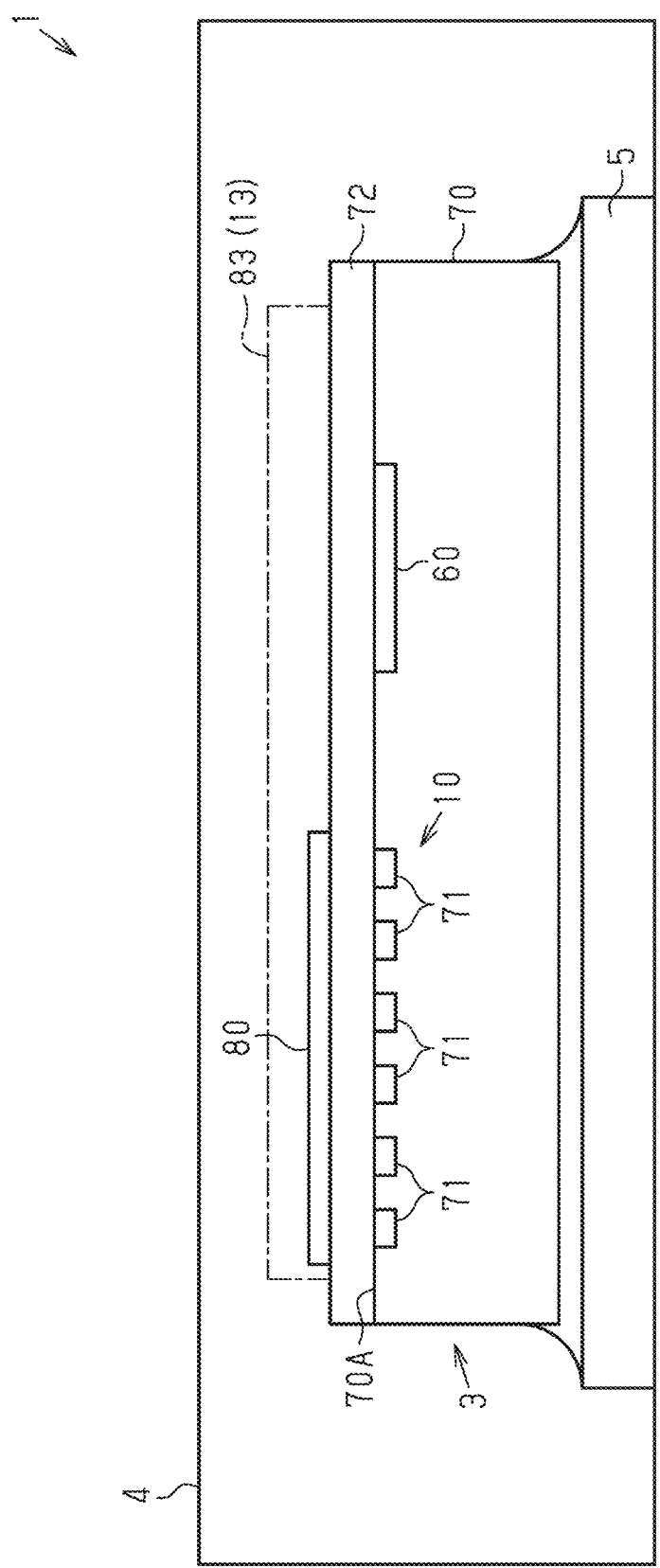
FIG. 21 is a cross-sectional view of an optical sensor of a modified example.

In each embodiment, as shown in FIG. 21, the memory color filter 84 that covers the nonvolatile memory 60 may be omitted from the optical sensor 1. In this case, the nonvolatile memory 60 is also covered by the blocking layer 83.

In each embodiment, at least one of the conversion unit 30, the calculating unit 40, the voltage generating unit 50, and the nonvolatile memory 60 may be formed by a semiconductor substrate differing from the semiconductor substrate 70 on which the light receiving unit 10 is formed.

In each embodiment, a configuration in which the optical sensor 1 and the calculating unit 40 are individually provided, and the conversion unit 30 and the nonvolatile memory 60 of the optical sensor 1 and the calculating unit 40 are electrically connected may be adopted.

In each embodiment, the number of analog/digital conversion circuits of the conversion unit 30 can be freely changed. In one example, the conversion unit 30 may include a dedicated analog/digital conversion circuit with respect to each light receiving pixel 10Y, 10R, 10G, 10B, 22IR, 23IR, 10C.

In each embodiment, the bias voltages VBY, VBR, VBG, VBB, VBIR1, and VBIR2 to apply to each light receiving element 11Y, 11R, 11G, 11B, 21IR may be a preset voltage value. An example of the preset voltage value is a reference voltage (1.2 V). In other words, in the optical sensor 1, the step of adjusting the bias voltages VBY, VBR, VBG, VBB, VBIR1, VBIR2 may be omitted.

In each embodiment, the number of photodiodes configured by the light receiving elements 11Y, 11R, 11G, 11B, 21IR can be freely changed. That is, each of the light receiving elements 11Y, 11R, 11G, 11B, 21IR may be configured by one photodiode or may be configured by a plurality of photodiodes, where in the case of a plurality of photodiodes, the bias voltage is applied to at least one of the photodiodes connected to the input terminal.

Figure 22:
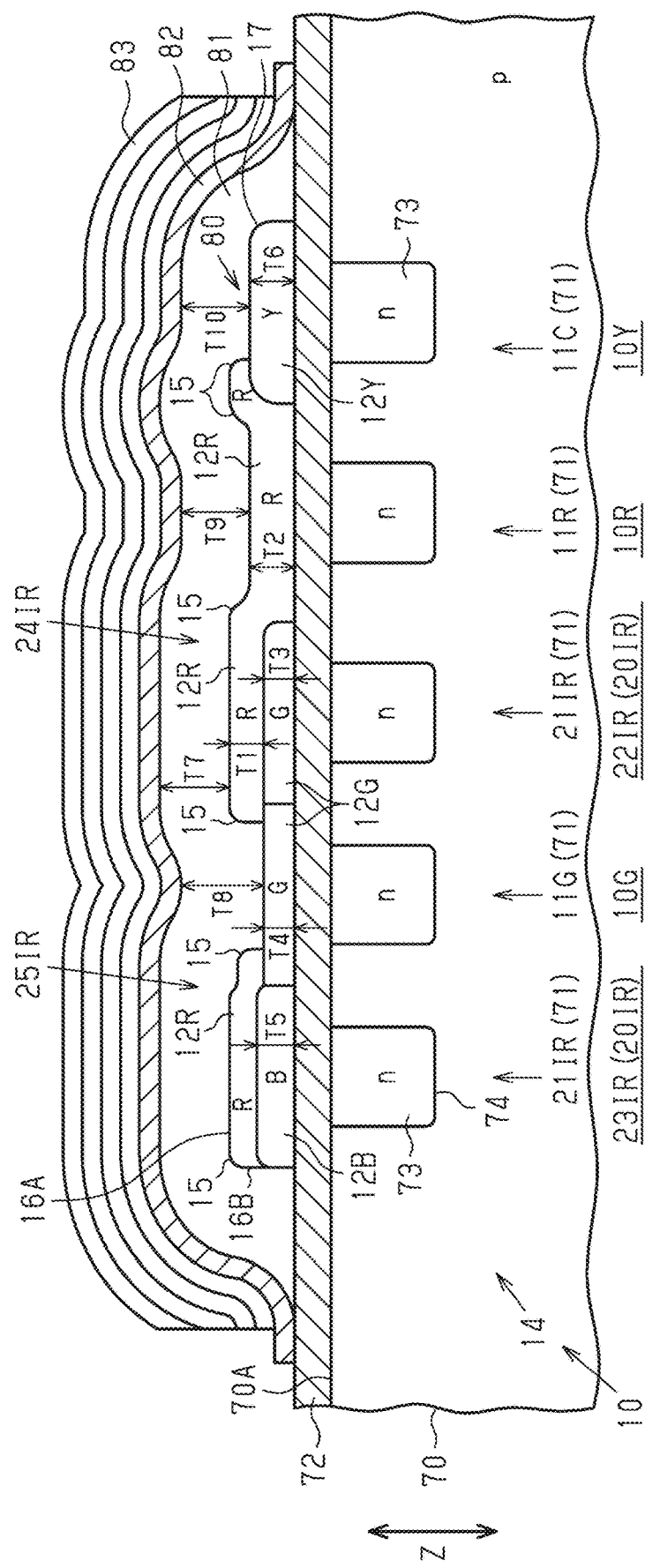
FIG. 22 is a cross-sectional view of a light receiving unit of the optical sensor of the modified example.

In each embodiment, the thickness of each filter 12Y, 12R, 12G, 12B can be freely changed. In one example, the respective thickness of the two overlapped filters of when any two of the filters 12Y, 12R, 12G, and 12B are overlapped in the thickness direction (orthogonal direction Z) and the thickness of the filter of when the filters are not overlapped in the thickness direction (orthogonal direction Z) are different. The respective thickness of the two overlapped filters of when any two filters of the filters 12Y, 12R, 12G, and 12B are overlapped in the thickness direction (orthogonal direction Z) is thinner than the thickness of the filter of when the filters are not overlapped in the thickness direction (orthogonal direction Z). FIG. 22 shows an example of a configuration in which the thicknesses of the filters 12Y, 12R, 12G, 12B are different. Further, FIG. 22 is a cross-sectional view taken along line 4-4 of FIG. 2.

FIG. 22 shows a case in which the thickness of the red filter 12R overlapping the blue filter 12B and the red filter 12R overlapping the green filter 12G is "thickness T1" and the thickness of the red filter 12R not overlapping the filter of another color, that is, the red filter 12R on the interlayer insulating film 72 is "thickness T2" in the orthogonal direction Z. Furthermore, assume that the thickness of the green filter 12G overlapping with the red filter 12R is "thickness T3," and the thickness of the green filter 12G not overlapping the red filter 12R is "thickness T4." Moreover, the thickness of the blue filter 12B is assumed as "thickness T5," and the thickness of the yellow filter 12Y is assumed as "thickness T6."

An example of the relationship between the thicknesses of the filters 12Y, 12R, 12G, 12B is as follows. The thickness T1 of the red filter 12R is thinner than the thickness T2 of the red filter 12R. The thickness T3 of the green filter 12G is approximately equal to the thickness T4 of the green filter 12G. The thickness T3 of the green filter 12G may be thinner than, for example, the thickness T4 of the green filter 12G. The thickness T1 of the red filter 12R is larger than the thickness T3 of the green filter 12G. The thickness T1 of the red filter 12R is larger than the thickness T4 of the green filter 12G. The thickness T1 of the red filter 12R is thinner than the thickness T5 of the blue filter 12B. The thickness T2 of the red filter 12R is larger than the thickness T5 of the blue filter 12B. The thickness T4 of the green filter 12G is thinner than the thickness T5 of the blue filter 12B. The thickness T6 of the yellow filter 12Y is larger than the thicknesses T3 and T4 of the green filter 12G and the thickness T5 of the blue filter 12B.

Although not shown, in the case where any two of the green filter 12G, the blue filter 12B, and the yellow filter 12Y other than the red filter 12R are overlapped in the orthogonal direction Z as well, the thicknesses of any two of the green filter 12G, the blue filter 12B, and the yellow filter 12Y overlapped in the orthogonal direction Z may respectively be thinner than the thickness of the filter of when the filters are not overlapped in the orthogonal direction Z.

In each embodiment, the thickness of the resist film 81 can be freely changed according to the position covering each filter 12Y, 12R, 12G, 12B.

FIG. 22 shows a case in which the thickness of a portion where the filter is overlapped in the orthogonal direction Z in the resist film 81 is "thickness T7," and the thickness of a portion where the filters are not overlapped in the orthogonal direction Z is "thickness T8 to T10." The thickness T8 is the thickness of the resist film 81 corresponding to the green filter 12G on which the red filter 12R is not overlapped in the orthogonal direction Z; the thickness T9 is the thickness of the resist film 81 corresponding to the red filter 12R of the second light receiving element 11R, and the thickness T10 is the thickness of the resist film 81 corresponding to the yellow filter 12Y on which the red filter 12R is not overlapped in the orthogonal direction Z.

The thickness T7 of the resist film 81 is thinner than the thicknesses T8, T9, and T10 of the resist film 81.

The thickness T8 of the resist film 81 may be thinner than the thickness T2 of the red filter 12R and the thickness T5 of the blue filter 12B. Furthermore, the thickness T8 of the resist film 81 may be thicker than the thickness T4 of the green filter 12G. The thickness T7 of the resist film 81 may be thinner than the thickness T1 of the red filter 12R.

In each embodiment, the shape of the filter located at the end of at least one of the first direction X and the second direction Y of each filter 12Y, 12R, 12G, and 12B may be differing from the shape of the other filters. That is, the shape of the filter having a portion where the filter is not adjacent thereto in at least one of the first direction X and the second direction Y may be different from a shape of a filter arranged so that the filters are adjacent thereto in the first direction X and the second direction Y.

In one example, as shown in FIG. 22, the three red filters 12R overlapping in the orthogonal direction Z have portions that are not adjacent to at least one of the first direction X and the second direction Y. A curved surface 15 is formed at the end in the second direction Y of the three red filters 12R overlapping in the orthogonal direction Z. The curved surface 15 is formed between the surface 16A and the side surface 16B of the red filter 12R overlapping in the orthogonal direction Z. The surface 16A is a surface on a side opposite to the interlayer insulating film 72 with respect to the red filter 12R in the orthogonal direction Z. The side surface 16B is a surface extending along the orthogonal direction Z. Furthermore, the curved surface 15 is formed at the end in the first direction X of the red filter 12R overlapping the blue filter 12B in the orthogonal direction Z.

As shown in FIG. 22, a curved surface 17 is formed at an end in the second direction Y of the yellow filter 12Y. The curved surface 17 of the yellow filter 12Y is formed in a similar manner as the curved surface 15 of the red filter 12R. Although not shown, a curved surface may be formed at the end of the filter located at the end of at least one of the first direction X and the second direction Y, other than the red filter 12R and the yellow filter 12Y

APPENDIX

Technical ideas that can be understood from each of the above embodiments and each of the above modified example will now be described.

Appendix A1

An optical sensor including an amplifier having a first input terminal, a second input terminal, and an output terminal; a light receiving element connected to the first input terminal and including a photodiode; a reference voltage applying unit that applies a reference voltage to the second input terminal; and a bias voltage applying unit that applies a bias voltage differing from the reference voltage to the light receiving element.

According to such a configuration, the magnitude of the leakage current after the leakage currents of the plurality of light receiving elements are merged may be smaller than when the bias voltages to apply to the plurality of light receiving elements are all equal. Thus, since the offset of the amplifier becomes small, the detection accuracy of the optical sensor can be enhanced.

Appendix A2

The optical sensor according to appendix A1, wherein the bias voltage applying unit applies a bias voltage higher than the reference voltage to the light receiving element.

The inventors of the present application have ascertained through tests and the like that when the bias voltage and the reference voltage are equal, the offset of the amplifier increases due to the leakage current of the light receiving element when the temperature of the light receiving element is high. As the offset of the amplifier increases, the accuracy of the output signal of the amplifier decreases.

The inventors of the present application have also found out that when the bias voltage is higher than the reference voltage, the leakage current of the light receiving element decreases and the offset of the amplifier decreases. The present optical sensor thus applies a voltage higher than the reference voltage as the bias voltage of the light receiving element. The offset of the amplifier is thus reduced, and the accuracy of the output signal of the amplifier is maintained. Therefore, the detection accuracy of the optical sensor can be enhanced.

Appendix A3

The optical sensor according to appendix A1 or A2, wherein the bias voltage applying unit adjusts the bias voltage so as not to generate a leakage current of the light receiving element.

According to such a configuration, the offset of the amplifier decreases by adjusting the bias voltage applied to the light receiving element so as not to generate leakage current. Therefore, the detection accuracy of the optical sensor can be enhanced.

Appendix A4

The optical sensor according to appendix A1 or A2, wherein the light receiving element connected to the first input terminal is one of a plurality of light receiving elements, the bias voltage applying unit applies a first bias voltage to generate a leakage current in a first direction as the bias voltage to some of the plurality of light receiving elements, and the bias voltage applying unit applies a second bias voltage to generate a leakage current in a second direction, which is a direction opposite to the first direction, as the bias voltage to the other light receiving elements.

According to such a configuration, the leakage current in the first direction and the leakage current in the second direction are canceled out when the leakage currents of the plurality of light receiving elements are merged. The leakage current after the leakage currents of the plurality of light receiving elements are merged is thus reduced. Therefore, since the offset of the amplifier becomes small, the detection accuracy of the optical sensor can be enhanced.

Appendix A5

The optical sensor according to any one of appendices A1 to A3, where the light receiving element connected to the first input terminal is one of a plurality of light receiving elements, and the bias voltage applying unit adjusts at least one of the bias voltages applied to the plurality of light receiving elements so that a combined value of the leakage current generated in the plurality of light receiving elements becomes zero or approaches zero.

According to such a configuration, the offset of the amplifier decreases as the leakage current after the leakage currents of the plurality of light receiving elements are merged becomes zero or approaches zero. Therefore, the detection accuracy of the optical sensor can be enhanced.

Appendix A6

The optical sensor according to appendix A1 or A2, wherein the light receiving element includes a first band light receiving element configured to detect light in a first wavelength band and a second band light receiving element configured to detect light in a second wavelength band, the amplifier includes a first amplifier and a second amplifier, the optical sensor includes a calculating unit that performs a calculation based on an output signal of the first amplifier and an output signal of the second amplifier, an anode of the first band light receiving element is connected to a first input terminal of the first amplifier, an anode of the second band light receiving element is connected to a first input terminal of the second amplifier, and the bias voltage applying unit adjusts a bias voltage applied to the first band light receiving element so that a leakage current of the first band light receiving element flows to the first input terminal of the first amplifier and adjusts a bias voltage applied to the second band light receiving element so that a leakage current of the second band light receiving element flows to the first input terminal of the second amplifier.

According to such a configuration, the leakage current of the first band light receiving element flows to the first input terminal of the first amplifier and the leakage current of the second band light receiving element flows to the first input terminal of the second amplifier. Thus, the positive and negative signs of the offset voltage caused by the leakage current of the first band light receiving element with respect to the first amplifier and the offset voltage caused by the leakage current of the second band light receiving element with respect to the second amplifier become the same. Thus, when the calculating unit performs the calculation based on the output signal of the first amplifier and the output signal of the second amplifier, the offset voltage of the first amplifier and the offset voltage of the second amplifier are canceled out. Therefore, the influence of the leakage current of each light receiving element is reduced from the output signal of the amplifier. This enhances the detection accuracy of the optical sensor.

Appendix A7

The optical sensor according to appendix A6, wherein the first band light receiving element connected to the first input terminal of the first amplifier is one of a plurality of first band light receiving elements, the second band light receiving elements connected to the first input terminal of the second amplifier is one of a plurality of the second band light receiving elements, and the bias voltage applying unit adjusts the bias voltage applied to at least one of the plurality of first band light receiving elements so that a leakage current after the leakage currents generated in the plurality of first band light receiving elements are merged flows to the first input terminal of the first amplifier and adjusts the bias voltage applied to at least one of the plurality of second band light receiving elements so that a leakage current after the leakage currents generated in the plurality of second band light receiving elements are merged flows to the first input terminal of the second amplifier.

According to such a configuration, the leakage current after the plurality of first band light receiving elements are merged flows to the first input terminal of the first amplifier and the leakage current after the plurality of second band light receiving elements are merged flows to the first input terminal of the second amplifier. Thus, the positive and negative signs of the offset voltage caused by the leakage current of the first band light receiving element with respect to the first amplifier and the offset voltage caused by the leakage current of the second band light receiving element with respect to the second amplifier become the same. As a result, when the calculating unit performs the calculation based on the output signal of the first amplifier and the output signal of the second amplifier, the offset voltage of the first amplifier and the offset voltage of the second amplifier are canceled out. Therefore, the influence of the leakage current of each light receiving element is reduced from the output signal of the amplifier. This enhances the detection accuracy of the optical sensor.

Appendix A8

The optical sensor according to any one of appendices A1 to A7, further including a conversion unit, including the amplifier and the reference voltage applying unit and configured to convert a photocurrent of the light receiving element to an output signal, and a calculating unit, configured to calculate an intensity of visible light based on the output signal of the conversion unit.

Appendix B1

An output circuit of an optical sensor, wherein the output circuit outputs a combined value of photocurrents generated by a plurality of parallel-connected light receiving elements connected, the output circuit including a bias voltage applying unit configured to apply a bias voltage to the plurality of light receiving elements so that the bias voltage applied to one of the plurality of light receiving elements differs from the other bias voltages.

According to such a configuration, the magnitude of the leakage current after the leakage currents of the plurality of light receiving elements are merged may be smaller than when the bias voltages to apply to the plurality of light receiving elements are all equal. Thus, since the offset of the amplifier is small, the detection accuracy of the optical sensor can be enhanced.

Appendix B2

The output circuit according to appendix B1, further including an amplifier having an input terminal and an output terminal, wherein each of the plurality of light receiving elements is connected to the input terminal, and the bias voltage applying unit applies a first bias voltage to generate a leakage current in a first direction as the bias voltage to some of the plurality of light receiving elements and applies a second bias voltage to generate a leakage current in a second direction, which is a direction opposite to the first direction, as the bias voltage to the other light receiving elements.

According to such a configuration, the leakage current in the first direction and the leakage current in the second direction are canceled out when the leakage currents of the plurality of light receiving elements are merged. The leakage current after the leakage currents of the plurality of light receiving elements are merged is thus reduced. Therefore, since the offset of the amplifier becomes small, the detection accuracy of the optical sensor can be enhanced.

Appendix B3

The output circuit according to appendix B2, wherein the bias voltage applying unit adjusts at least one of the bias voltages applied to the plurality of light receiving elements so that a combined value of the leakage currents generated in the plurality of light receiving elements becomes zero or approaches zero.

According to such a configuration, the offset of the amplifier becomes small as the leakage current after the leakage currents of the plurality of light receiving elements are merged becomes zero or approaches zero. Therefore, the detection accuracy of the optical sensor can be enhanced.

Appendix C1

A method for adjusting a bias voltage of a light receiving element of an optical sensor including an amplifier having a first input terminal, a second input terminal, and an output terminal; a light receiving element connected to the first input terminal and having a photodiode; a reference voltage applying unit configured to apply a reference voltage to the second input terminal, and a bias voltage applying unit that applies a bias voltage to the light receiving element, the method including a current measuring step of measuring a leakage current generated in the light receiving element by applying the reference voltage to the light receiving element, and an adjusting step of adjusting the bias voltage so that the leakage current of the light receiving element becomes small or becomes zero or approaches zero.

According to such a configuration, since the leakage current of the light receiving element is small, the offset of the amplifier is small, and the accuracy of the output signal of the amplifier is maintained. Therefore, the detection accuracy of the optical sensor can be enhanced.

Appendix C2

The method for adjusting the bias voltage of the light receiving element according to appendix C1, wherein the light receiving element connected to the first input terminal is one of a plurality of light receiving elements; the current measuring step measures a magnitude and a direction of the leakage currents generated in the plurality of light receiving elements; the adjusting step adjusts the bias voltage to generate a leakage current in a first direction with respect to some of the light receiving elements, and the bias voltage is adjusted to generate a leakage current in a second direction, which is a direction opposite to the first direction.

According to such a configuration, the leakage current in the first direction and the leakage current in the second direction are canceled out when the leakage currents of the plurality of light receiving elements are merged. This reduces the leakage current after the leakage currents of the plurality of light receiving elements are merged. Therefore, since the offset of the amplifier becomes small, the detection accuracy of the optical sensor can be enhanced.

Appendix C3

The method for adjusting the bias voltage of the light receiving element according to appendix C2, wherein the adjusting step adjusts at least one of the bias voltages so that a combined value of the leakage currents generated in the plurality of light receiving elements becomes zero or approaches 0.

According to such a configuration, the offset of the amplifier decreases because the leakage current after the leakage currents of the plurality of light receiving elements are merged becomes zero or approaches zero. Therefore, the detection accuracy of the optical sensor can be enhanced.

Appendix C4

A method for adjusting a bias voltage of a light receiving element of an optical sensor including an amplifier having a first input terminal, a second input terminal, and an output terminal; a light receiving element connected to the first input terminal and including a photodiode; a reference voltage applying unit configured to apply a reference voltage to the second input terminal; and a bias voltage applying unit configured to apply a bias voltage to the light receiving element, wherein the light receiving element includes a first band light receiving element configured to detect light in a first wavelength band and a second band light receiving element configured to detect light in a second wavelength band; the amplifier includes a first amplifier and a second amplifier; the optical sensor includes a calculating unit configured to perform a calculation based on an output signal of the first amplifier and an output signal of the second amplifier; an anode of the first band light receiving element is connected to a first input terminal of the first amplifier; an anode of the second band light receiving element is connected to a first input terminal of the second amplifier; the method including an adjusting step of adjusting a bias voltage applied to the first band light receiving element so that a leakage current of the first band light receiving element flows to the first input terminal of the first amplifier and a bias voltage applied to the second band light receiving element so that a leakage current of the second band light receiving element flows to the first input terminal of the second amplifier.

According to such a configuration, the leakage current of the first band light receiving element flows to the first input terminal of the first amplifier and the leakage current of the second band light receiving element flows to the first input terminal of the second amplifier. Thus, the positive and negative signs of the offset voltage caused by the leakage current of the first band light receiving element to the first amplifier and the offset voltage caused by the leakage current of the second band light receiving element to the second amplifier become the same. Therefore, when the calculation is performed based on the output signal of the first amplifier and the output signal of the second amplifier, the offset voltage of the first amplifier and the offset voltage of the second amplifier are canceled out. Therefore, the influence of the leakage current of each light receiving element is reduced from the output signal of the amplifier so that the detection accuracy of the optical sensor can be enhanced.

Appendix C5

The method for adjusting the bias voltage of the light receiving element according to appendix C4, wherein the first band light receiving element connected to the first input terminal of the first amplifier is one of a plurality of first band light receiving elements, the second band light receiving element connected to the first input terminal of the second amplifier is one of a plurality of second band light receiving elements; the method includes a current measuring step of measuring a magnitude and a direction of a leakage current of each of the plurality of first band light receiving elements in addition to a magnitude and a direction of a leakage current of each of the plurality of second band light receiving elements; the adjusting step adjusts at least one of the bias voltages applied to the plurality of first band light receiving elements is adjusted so that a leakage current after the leakage currents generated in the plurality of first band light receiving elements are merged flows to the first input terminal of the first amplifier, and adjusts at least one of the bias voltages applied to the plurality of second band light receiving elements so that a leakage current after the leakage currents generated in the plurality of second band light receiving elements are merged flows to the first input terminal of the second amplifier.

According to such a configuration, the leakage current after the plurality of first band light receiving elements are merged flows to the first input terminal of the first amplifier and the leakage current after the plurality of second band light receiving elements are merged flows to the first input terminal of the second amplifier. Thus, the positive and negative signs of the offset voltage caused by the leakage current of the first band light receiving element to the first amplifier and the offset voltage caused by the leakage current of the second band light receiving element to the second amplifier become the same. Therefore, when the calculation is performed based on the output signal of the first amplifier and the output signal of the second amplifier, the offset voltage of the first amplifier and the offset voltage of the second amplifier are canceled out. This reduces the influence of the leakage current of each light receiving element is reduced from the output signal of the amplifier and enhances the detection accuracy of the optical sensor.

Appendix C6

The method for adjusting the bias voltage of the light receiving element according to any one of appendices C1 to C5, wherein a relationship between the bias voltage and the leakage current of the light receiving element is obtained in advance, and the adjusting step adjust the bias voltage based on the relationship between the bias voltage and the leakage current generated in the light receiving element.

According to such a configuration, the adjustment of the bias voltage to obtain the magnitude and direction of the predetermined leakage current can be easily carried out. Therefore, the bias voltage applied to the light receiving element can be easily adjusted so that the offset of the amplifier becomes small.

Appendix C7

The method for adjusting the bias voltage of the light receiving element according to any one of appendices C1 to C6, wherein a storage unit that stores the bias voltage applied to the light receiving element is further arranged, and the method further includes a storing step of storing the bias voltage adjusted in the adjusting step in the storage unit.

According to the optical sensor, the output circuit of the optical sensor, and the method for adjusting the bias voltage of the light receiving element, the detection accuracy of the optical sensor can be enhanced.

The objects corresponding to appendices A1 to A8, appendices B1 to B3, and appendices C1 to C7 are as follows.

The optical sensor includes a plurality of photodiodes, a conversion unit that converts photocurrents of the photodiodes into digital signals, and a calculating unit that outputs sensor output signals, which are detection results, based on the digital signals of the conversion unit. Prior art documents describing of such an optical sensor include Japanese Laid-Open Patent Publication No. 2015-65357.

Further improvement in the detection accuracy of the optical sensor is desired.

Therefore, it is an object of the optical sensor, the output circuit of the optical sensor, and the method for adjusting the bias voltage of the light receiving element to enhance the detection accuracy.

The invention claimed is:

1. An optical sensor comprising:
a light receiving unit including a plurality of light receiving elements, including a first light receiving element and a second light receiving element through which a photocurrent flows when receiving light, and a plurality of color filters, including a yellow filter that covers a light receiving surface of the first light receiving element and a red filter that covers a light receiving surface of the second light receiving element; and
a calculating unit that calculates an intensity of a yellow wavelength band based on a difference between a first output signal obtained from the photocurrent of the first light receiving element and a second output signal obtained from the photocurrent of the second light receiving element.

2. The optical sensor according to claim 1, wherein the plurality of light receiving elements are arranged in a lattice-like manner, and
the first light receiving element and the second light receiving element are adjacent to each other.

3. The optical sensor according to claim 1, wherein the first light receiving element is one of a plurality of first light receiving elements,
the second light receiving element is one of a plurality of second light receiving elements,
the yellow filter is one of a plurality of yellow filters,
the red filter is one of a plurality of red filters,
the plurality of first light receiving elements are arranged so as to be point symmetric with a central part of a light receiving region of the light receiving unit serving as a center of symmetry,
the plurality of yellow filters are arranged so as to be point symmetric with the central part of the light receiving region serving as a center of symmetry,
the plurality of second light receiving elements are arranged so as to be point symmetric with the central part of the light receiving region serving as a center of symmetry, and
the plurality of red filters are arranged so as to be point symmetric with the central part of the light receiving region serving as a center of symmetry.

4. The optical sensor according to claim 1, wherein the first light receiving element is one of a plurality of first light receiving elements, and the second light receiving element is one of a plurality of second light receiving elements, the optical sensor further comprising:
a first conversion unit that converts the photocurrent of the first light receiving element into the first output signal; and
a second conversion unit that converts the photocurrent of the second light receiving element into the second output signal, wherein
the plurality of the first light receiving elements are electrically connected to the first conversion unit;
the plurality of the second light receiving elements are electrically connected to the second conversion unit;
the first conversion unit outputs the total photocurrent of the plurality of first light receiving elements to the calculating unit as the first output signal; and
the second conversion unit outputs the total photocurrent of the plurality of second light receiving elements to the calculating unit as the second output signal.

5. The optical sensor according to claim 1, wherein:
the plurality of light receiving elements include a third light receiving element, a fourth light receiving element, and a fifth light receiving element;
the plurality of color filters include a green filter that covers a light receiving surface of the third light receiving element, a blue filter that covers a light receiving surface of the fourth light receiving element, and an infrared transmitting filter that covers a light receiving surface of the fifth light receiving element;
the infrared transmitting filter is obtained by overlapping two or more types of filters; and
the fifth light receiving element is arranged so as to be adjacent to both of the second light receiving element and the third light receiving element.

6. The optical sensor according to claim 1, further comprising:
a nonvolatile memory that stores information for adjusting sensitivities of the plurality of light receiving elements; and
a blocking layer arranged overlapping the nonvolatile memory as viewed in a direction orthogonal to the light receiving surface of the light receiving element and configured to block ultraviolet light.

7. The optical sensor according to claim 6, further comprising a memory color filter arranged overlapping the nonvolatile memory as viewed in a direction orthogonal to the light receiving surface of the light receiving element.

8. The optical sensor according to claim 7, wherein the blocking layer is formed from an inorganic material, and the memory color filter is formed from an organic material and provided in the blocking layer.

9. An electronic device comprising:
the optical sensor according to claim 1; and
a housing that houses the optical sensor.

10. An optical sensor comprising:
a light receiving unit including a plurality of light receiving pixels arranged in a lattice-like manner, wherein the plurality of light receiving pixels include
a yellow light receiving pixel including a first light receiving element and a yellow filter that covers the first light receiving element,
a red light receiving pixel including a second light receiving element and a red filter that covers the second light receiving element,
a green light receiving pixel including a third light receiving element and a green filter that covers the third light receiving element, and
a blue light receiving pixel including a fourth light receiving element and a blue filter that covers the fourth light receiving element,
wherein
the yellow light receiving pixel is one of a plurality of yellow light receiving pixels,
the red light receiving pixel is one of a plurality of red light receiving pixels,
the plurality of yellow light receiving pixels are arranged so as to be point symmetric with a central part of a light receiving region of the light receiving unit serving as a center of symmetry, and
the plurality of red light receiving pixels are arranged so as to be point symmetric with the central part of the light receiving region serving as a center of symmetry.

11. The optical sensor according to claim 10, wherein the yellow light receiving pixel and the red light receiving pixel are arranged adjacent to each other.

12. The optical sensor according to claim 11, wherein the red light receiving pixel and the green light receiving pixel are arranged adjacent to each other.

13. The optical sensor according to claim 12, wherein
the red light receiving pixel and the yellow light receiving pixel are arranged adjacent to each other in a direction Y, and
the red light receiving pixel and the green light receiving pixel are arranged adjacent to each other in a direction X, which is orthogonal to the direction Y.

14. The optical sensor according to claim 10, further comprising an infrared light receiving pixel having a fifth light receiving element and an infrared transmitting filter that covers the fifth light receiving element, wherein
the yellow light receiving pixel is one of a plurality of yellow light receiving pixels,
the red light receiving pixel is one of a plurality of red light receiving pixels,
the green light receiving pixel is one of a plurality of green light receiving pixels,
the blue light receiving pixel is one of a plurality of red light receiving pixels,
the infrared light receiving pixel is one of a plurality of infrared light receiving pixels,
the plurality of yellow light receiving pixels are arranged so as to be point symmetric with a central part of a light receiving region of the light receiving unit serving as a center of symmetry,
the plurality of red light receiving pixels are arranged so as to be point symmetric with the central part of the light receiving region serving as a center of symmetry,
the plurality of green light receiving pixels are arranged so as to be point symmetric with the central part of the light receiving region serving as a center of symmetry,
the plurality of blue light receiving pixels are arranged so as to be point symmetric with the central part of the light receiving region serving as a center of symmetry, and
the plurality of infrared light receiving pixels are arranged so as to be point symmetric with the central part of the light receiving region serving as a center of symmetry.

15. The optical sensor according to claim 14, wherein
the infrared transmitting filter is obtained by overlapping two or more types of filters, and
the infrared light receiving pixel is arranged so as to be adjacent to both of the red light receiving pixel and the green light receiving pixel.

16. The optical sensor according to claim 10, further comprising a nonvolatile memory that stores information for adjusting sensitivity of at least one of the first light receiving element, the second light receiving element, the third light receiving element, and the fourth light receiving element; and
a blocking layer arranged overlapping the nonvolatile memory as viewed in a direction orthogonal to light receiving surfaces of the first light receiving element, the second light receiving element, the third light receiving element, and the fourth light receiving element and configured to block ultraviolet light.

17. The optical sensor according to claim 16, further comprising a memory color filter arranged overlapping the nonvolatile memory as viewed in a direction orthogonal to the light receiving surfaces of the first light receiving element, the second light receiving element, the third light receiving element, and the fourth light receiving element.

18. The optical sensor according to claim 17, wherein
the blocking layer is formed from an inorganic material, and
the memory color filter is formed from an organic material and provided in the blocking layer.

19. An optical sensor including a light receiving element through which a photocurrent flows when receiving light and configured to detect visible light based on the photocurrent of the light receiving element, the optical sensor comprising:
a nonvolatile memory that stores information for adjusting a sensitivity of the light receiving element; and
a blocking layer arranged overlapping the nonvolatile memory as viewed in a direction orthogonal to a light receiving surface of the light receiving element and configured to block ultraviolet light.

20. The optical sensor according to claim 19, further comprising a memory color filter arranged overlapping the nonvolatile memory as viewed in a direction orthogonal to the light receiving surface of the light receiving element.

21. The optical sensor according to claim 20, wherein
the blocking layer is formed from an inorganic material, and
the memory color filter is formed from an organic material and provided in the blocking layer.

22. An optical sensor comprising:
a light receiving unit including a plurality of light receiving pixels arranged in a lattice-like manner, wherein the plurality of light receiving pixels include
a yellow light receiving pixel including a first light receiving element and a yellow filter that covers the first light receiving element, a red light receiving pixel including a second light receiving element and a red filter that covers the second light receiving element, a green light receiving pixel including a third light receiving element and a green filter that covers the third light receiving element, and a blue light receiving pixel including a fourth light receiving element and a blue filter that covers the fourth light receiving element, wherein the yellow light receiving pixel is one of a plurality of yellow light receiving pixels, and the plurality of yellow light receiving pixels are arranged so as to be point symmetric with a central part of a light receiving region of the light receiving unit serving as a center of symmetry.

* * * * *